United States Patent
Kim et al.

(10) Patent No.: US 10,446,207 B2
(45) Date of Patent: *Oct. 15, 2019

(54) SPIN TRANSFER TORQUE MAGNETIC RANDOM ACCESS MEMORY FOR SUPPORTING OPERATIONAL MODES WITH MODE REGISTER

(71) Applicant: Samsung Electronics Co., Ltd., Suwon-si OT (KR)

(72) Inventors: Chan-kyung Kim, Hwaseong-si (KR); Dong-seok Kang, Seoul (KR); Hye-jin Kim, Seoul (KR); Chul-woo Park, Yongin-si (KR); Dong-hyun Sohn, Hwaseong-si (KR); Yun-sang Lee, Yongin-si (KR); Sang-beom Kang, Hwaseong-si (KR); Hyung-rock Oh, Yongin-si (KR); Soo-ho Cha, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/253,956

(22) Filed: Jan. 22, 2019

(65) Prior Publication Data
US 2019/0156877 A1    May 23, 2019

Related U.S. Application Data

(63) Continuation of application No. 13/768,858, filed on Feb. 15, 2013, now Pat. No. 10,204,670.

(30) Foreign Application Priority Data

May 17, 2012 (KR) .................. 10-2012-0052594

(51) Int. Cl.
*G11C 11/00*    (2006.01)
*G11C 11/16*    (2006.01)
*G06F 12/02*    (2006.01)

(52) U.S. Cl.
CPC ........ *G11C 11/165* (2013.01); *G06F 12/0246* (2013.01); *G11C 11/161* (2013.01);
(Continued)

(58) Field of Classification Search
CPC ... G11C 11/16; G11C 11/1653; G11C 11/165; G11C 11/1673; G11C 11/1659; G11C 11/5607; G11C 13/004
See application file for complete search history.

(56) References Cited

U.S. PATENT DOCUMENTS 6,188,615 B1    2/2001    Perner et al.
6,262,938 B1    7/2001    Lee et al.
(Continued)

FOREIGN PATENT DOCUMENTS

CN    1295332 A    5/2001
CN    1423279 A    6/2003
(Continued)

OTHER PUBLICATIONS

Rajagopalan Desikan, Charles R. Lefurgy, Stephen W. Keckler, Doug Burger, "On-chip MRAM as a High-Bandwidth, Low-Latency Replacement for DRAM Physical Memories," Dept. of Computer Sciences, The University of Texas at Austin, Sep. 27, 2002.
(Continued)

*Primary Examiner* — Hien N Nguyen
(74) *Attorney, Agent, or Firm* — Muir Patent Law, PLLC

(57) ABSTRACT

A magnetic random access memory (MRAM), and a memory module, memory system including the same, and method for controlling the same are disclosed. The MRAM
(Continued)

includes magnetic memory cells configured to change between at least two states according to a magnetization direction, and a mode register supporting a plurality of operational modes.

19 Claims, 60 Drawing Sheets

(52) U.S. Cl.
CPC ...... *G11C 11/1653* (2013.01); *G11C 11/1659* (2013.01); *G11C 11/1673* (2013.01); *G11C 11/1675* (2013.01); *G11C 11/1693* (2013.01)

(56) References Cited

U.S. PATENT DOCUMENTS

| | | | |
|---|---|---|---|
| 6,356,489 B2 | 3/2002 | Lee | |
| 6,791,890 B2 | 9/2004 | Ooishi | |
| 6,914,845 B2 | 7/2005 | Ooishi | |
| 6,957,308 B1 | 10/2005 | Patel | |
| 7,012,841 B1 | 3/2006 | Nahas | |
| 7,356,909 B1 | 4/2008 | Min et al. | |
| 7,376,003 B2 | 5/2008 | Iwata et al. | |
| 7,383,376 B2 | 6/2008 | Swanson | |
| 7,457,189 B2 | 11/2008 | Lee et al. | |
| 7,573,758 B2 | 8/2009 | Park et al. | |
| 7,593,288 B2 | 9/2009 | Kim et al. | |
| 7,633,833 B2 | 12/2009 | Takemura et al. | |
| 7,925,844 B2 | 4/2011 | Pax | |
| 8,169,233 B2 | 5/2012 | Ferolito et al. | |
| 8,238,175 B2 | 8/2012 | Fujisawa | |
| 8,384,432 B2 | 2/2013 | Kondo | |
| 8,422,263 B2 | 4/2013 | Saito et al. | |
| 10,204,670 B2 * | 2/2019 | Kim | G06F 12/0246 |
| 2002/0141279 A1 | 10/2002 | Dietrich et al. | |
| 2005/0204091 A1 | 9/2005 | Kilbuck et al. | |
| 2006/0238191 A1 | 10/2006 | Saito | |
| 2008/0080229 A1 | 4/2008 | Choi et al. | |
| 2008/0291727 A1 | 11/2008 | Seo et al. | |
| 2009/0063916 A1 | 3/2009 | Vogelsang | |
| 2009/0244949 A1 | 10/2009 | Ravasio et al. | |
| 2010/0058018 A1 | 3/2010 | Kund et al. | |
| 2011/0119519 A1 | 5/2011 | Li et al. | |
| 2011/0153900 A1 | 6/2011 | Zitlaw | |
| 2011/0153915 A1 | 6/2011 | Zitlaw | |
| 2011/0179215 A1 | 7/2011 | Zitlaw et al. | |
| 2011/0299330 A1 | 12/2011 | Ong | |
| 2012/0064640 A1 | 3/2012 | Guo et al. | |
| 2014/0153332 A1 | 6/2014 | Parthasarathy et al. | |

FOREIGN PATENT DOCUMENTS

| | | |
|---|---|---|
| CN | 1469387 A | 1/2004 |
| JP | 2004-133969 A | 4/2004 |
| JP | 2004-164753 A | 6/2004 |
| JP | 2004-199817 A | 7/2004 |
| JP | 2005-128817 A | 5/2005 |
| JP | 2010-192030 A | 9/2010 |
| JP | 2010-282511 A | 12/2010 |
| JP | 2011-081883 A | 4/2011 |
| KR | 100559737 B1 | 3/2006 |
| KR | 102008006302 A | 7/2008 |
| KR | 1020090035508 A | 4/2009 |
| KR | 1020090057781 A | 6/2009 |
| KR | 1020100041199 A | 4/2010 |
| KR | 1020100050847 A | 5/2010 |
| KR | 1020110058028 A | 6/2011 |
| WO | WO 99-00734 | 1/1999 |

OTHER PUBLICATIONS

Chung-Hyun Cho, Ju Hyun Ko, and Daejeong Kim, "A CMOS macro-model for MTJ resistor of MRAM cell," School of Electrical Engineering, Kookmin University, Jun. 8, 2004.

D.J. Kim, J.H. Ko, C.H. Cho, Y.I. Park, D.W. Kang, K.S. Min, S.M. Kim, S.J. Lee and H.S. Shin, "High cell-efficiency synchronous MRAM adopting unified bit-line cache," Electronic Letters, vol. 39, No. 16, Aug. 7, 2003, pp. 1166-1167.

JEDEC Standard-DDR3 SDRAM Specification, JESD79-3E (Revision of JESD79-3D, Aug. 2009), Jul. 2010.

JEDEC Standard-DDR3 SDRAM Specification, JESD79-3F (Revision of JESD79-3E, Jul. 2010), Jul. 2012.

Qing Guo et al, "A Resistive TCAM Accelerator for Data-Intensive Computing," MICRO' 11 Dec. 3-7, 2011, Porto Alegre, Brazil.

* cited by examiner

FIG. 12A

| BG1 | BG0 | BA1 | BA0 | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|
| RFU | | | | RFU | DLL | \multicolumn{2}{c}{WR and RTP} | | DLL | TM | | CL | | | RBT | \multicolumn{2}{c}{BL} |

RFU: 0 0 0

MR0

| A11 | A10 | A9 | WR | RTP | WR_CRC_DM |
|---|---|---|---|---|---|
| 0 | 0 | 0 | | 5 | TBD |
| 0 | 0 | 1 | 10 | 6 | TBD |
| 0 | 1 | 0 | 12 | 7 | TBD |
| 0 | 1 | 1 | 14 | 8 | TBD |
| 1 | 0 | 0 | 16 | 9 | TBD |
| 1 | 0 | 1 | 18 | 10 | TBD |
| 1 | 1 | 0 | 20 | 12 | TBD |
| 1 | 1 | 1 | 24 | Reserved | Reserved |

| A6 | A5 | A4 | A2 | CAS Latency |
|---|---|---|---|---|
| 0 | 0 | 0 | 0 | 9 |
| 0 | 0 | 0 | 1 | 10 |
| 0 | 0 | 1 | 0 | 11 |
| 0 | 0 | 1 | 1 | 12 |
| 0 | 1 | 0 | 0 | 13 |
| 0 | 1 | 0 | 1 | 14 |
| 0 | 1 | 1 | 0 | 15 |
| 0 | 1 | 1 | 1 | 16 |
| 1 | 0 | 0 | 0 | 18 |
| 1 | 0 | 0 | 1 | 20 |
| 1 | 0 | 1 | 0 | 22 |
| 1 | 0 | 1 | 1 | 24 |
| 1 | 1 | 0 | 0 | Reserved |
| 1 | 1 | 1 | 1 | Reserved |

| A1 | A0 | BURST LENGTH |
|---|---|---|
| 0 | 0 | 8 (Fixed) |
| 0 | 1 | BC4 or 8 (on the fly) |
| 1 | 0 | BC4 (Fixed) |
| 1 | 1 | Reserved |

| A3 | Read Burst Type |
|---|---|
| 0 | Nibble Sequential |
| 1 | Interleave |

| A7 | Mode |
|---|---|
| 0 | Normal |
| 1 | Test |

| A8 | DLL Reset |
|---|---|
| 0 | No |
| 1 | Yes |

| A12 | DLL Control for Precharge PD |
|---|---|
| 0 | Slow exit (DLL off) |
| 1 | Fast exit (DLL on) |

| BG0 | BA1 | BA0 | MR Select |
|---|---|---|---|
| 0 | 0 | 0 | MR0 |
| 0 | 0 | 1 | MR1 |
| 0 | 1 | 0 | MR2 |
| 0 | 1 | 1 | MR3 |
| 1 | 0 | 0 | MR4 |
| 1 | 0 | 1 | MR5 |
| 1 | 1 | 0 | MR6 |
| 1 | 1 | 1 | RCW |

FIG. 12B

| Burst Length | Read/Write | Starting Column Address (A2,A1,A0) | burst type = Sequential (decimal) A3=0 | burst type = Interleaved (decimal) A3=1 |
|---|---|---|---|---|
| 4 Chop | READ | 0 0 0 | 0,1,2,3,T,T,T,T | 0,1,2,3,T,T,T,T |
| | | 0 0 1 | 1,2,3,0,T,T,T,T | 1,0,3,2,T,T,T,T |
| | | 0 1 0 | 2,3,0,1,T,T,T,T | 2,3,0,1,T,T,T,T |
| | | 0 1 1 | 3,0,1,2,T,T,T,T | 3,2,1,0,T,T,T,T |
| | | 1 0 0 | 4,5,6,7,T,T,T,T | 4,5,6,7,T,T,T,T |
| | | 1 0 1 | 5,6,7,4,T,T,T,T | 5,4,7,6,T,T,T,T |
| | | 1 1 0 | 6,7,4,5,T,T,T,T | 6,7,4,5,T,T,T,T |
| | | 1 1 1 | 7,4,5,6,T,T,T,T | 7,6,5,4,T,T,T,T |
| | WRITE | 0,V,V | 0,1,2,3,X,X,X,X | 0,1,2,3,X,X,X,X |
| | | 1,V,V | 4,5,6,7,X,X,X,X | 4,5,6,7,X,X,X,X |
| 8 | READ | 0 0 0 | 0,1,2,3,4,5,6,7 | 0,1,2,3,4,5,6,7 |
| | | 0 0 1 | 1,2,3,0,5,6,7,4 | 1,0,3,2,5,4,7,6 |
| | | 0 1 0 | 2,3,0,1,6,7,4,5 | 2,3,0,1,6,7,4,5 |
| | | 0 1 1 | 3,0,1,2,7,4,5,6 | 3,2,1,0,7,6,5,4 |
| | | 1 0 0 | 4,5,6,7,0,1,2,3 | 4,5,6,7,0,1,2,3 |
| | | 1 0 1 | 5,6,7,4,1,2,3,0 | 5,4,7,6,1,0,3,2 |
| | | 1 1 0 | 6,7,4,5,2,3,0,1 | 6,7,4,5,2,3,0,1 |
| | | 1 1 1 | 7,4,5,6,3,0,1,2 | 7,6,5,4,3,2,1,0 |
| | WRITE | V,V,V | 0,1,2,3,4,5,6,7 | 0,1,2,3,4,5,6,7 |

FIG. 12C

| BA3 | BA2 | BA1 | BA0 | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|
| RFU | 0 | 0 | 0 | RFU | DLL | WR and RTP | | | DLL | TM | | CL | | RBT | | | BL |

MR0

| A11 | A10 | A9 | WR | RTP | | WR_CRC_DM |
|---|---|---|---|---|---|---|
| 0 | 0 | 0 | 10 | 5 | | TBD |
| 0 | 0 | 1 | 12 | 6 | | TBD |
| 0 | 1 | 0 | 14 | 7 | | TBD |
| 0 | 1 | 1 | 16 | 8 | | TBD |
| 1 | 0 | 0 | 18 | 9 | | TBD |
| 1 | 0 | 1 | 20 | 10 | | TBD |
| 1 | 1 | 0 | 24 | 12 | | Reserved |
| 1 | 1 | 1 | Reserved | Reserved | | |

| A7 | Mode |
|---|---|
| 0 | Normal |
| 1 | Test |

| A8 | DLL Reset |
|---|---|
| 0 | No |
| 1 | Yes |

| A6 | A5 | A4 | A2 | CAS Latency |
|---|---|---|---|---|
| 0 | 0 | 0 | 0 | 9 |
| 0 | 0 | 0 | 1 | 10 |
| 0 | 0 | 1 | 0 | 11 |
| 0 | 0 | 1 | 1 | 12 |
| 0 | 1 | 0 | 0 | 13 |
| 0 | 1 | 0 | 1 | 14 |
| 0 | 1 | 1 | 0 | 15 |
| 0 | 1 | 1 | 1 | 16 |
| 1 | 0 | 0 | 0 | 18 |
| 1 | 0 | 0 | 1 | 20 |
| 1 | 0 | 1 | 0 | 22 |
| 1 | 0 | 1 | 1 | 24 |
| 1 | 1 | 0 | 0 | Reserved |
| 1 | 1 | 1 | 1 | Reserved |

| A1 | A0 | BURST LENGTH |
|---|---|---|
| 0 | 0 | 8 (Fixed) |
| 0 | 1 | BC4 or 8 (on the fly) |
| 1 | 0 | BC4 (Fixed) |
| 1 | 1 | Reserved |

| A3 | Read Burst Type |
|---|---|
| 0 | Nibble Sequential |
| 1 | Interleave |

| A12 | DLL Control for Precharge PD |
|---|---|
| 0 | Slow exit (DLL off) |
| 1 | Fast exit (DLL on) |

| BA2 | BA1 | BA0 | MR Select |
|---|---|---|---|
| 0 | 0 | 0 | MR0 |
| 0 | 0 | 1 | MR1 |
| 0 | 1 | 0 | MR2 |
| 0 | 1 | 1 | MR3 |
| 1 | 0 | 0 | MR4 |
| 1 | 0 | 1 | MR5 |
| 1 | 1 | 0 | MR6 |
| 1 | 1 | 1 | RCW |

FIG. 13A

| BA3 | BA2 | BA1 | BA0 | A13 | A12 | A11 | A10 | A9 | A8 | A7 | A6 | A5 | A4 | A3 | A2 | A1 | A0 |
|-----|-----|-----|-----|-----|-----|-----|-----|----|----|----|----|----|----|----|----|----|----|
| RFU | 0 | 0 | 1 | RFU | Qoff | TDQS | \multicolumn{3}{c}{RTT_NOM} | Level | RFU | | AL | | | ODIC | DLL |

| A0 | DLL Enable |
|----|-----------|
| 0  | Enable    |
| 1  | Disable   |

| A4 | A3 | Additive Latency |
|----|----|------------------|
| 0  | 0  | 0 (AL disabled)  |
| 0  | 1  | CL-1             |
| 1  | 0  | CL-2             |
| 1  | 1  | Reserved         |

| A2 | A1 | Output Driver Impedance control |
|----|----|----------------------------------|
| 0  | 0  | RZQ/7                            |
| 0  | 1  | RZQ/5                            |
| 1  | 0  | Reserved                         |
| 1  | 1  | Reserved                         |

| A10 | A9 | A8 | RTT_NOM          |
|-----|----|----|------------------|
| 0   | 0  | 0  | RTT_NOM Disable  |
| 0   | 0  | 1  | RZQ/4            |
| 0   | 1  | 0  | RZQ/2            |
| 0   | 1  | 1  | RZQ/6            |
| 1   | 0  | 0  | RZQ/1            |
| 1   | 0  | 1  | RZQ/5            |
| 1   | 1  | 0  | RZQ/3            |
| 1   | 1  | 1  | RZQ/7            |

| A7 | Write leveling enable |
|----|-----------------------|
| 0  | Disabled              |
| 1  | Enabled               |

| A11 | TDQS enable |
|-----|-------------|
| 0   | Disabled    |
| 1   | Enabled     |

| A12 | Qoff                     |
|-----|--------------------------|
| 0   | Output buffer enabled    |
| 1   | Output buffer disabled   |

MR1

| BG0 | BA1 | BA0 | MR Select |
|-----|-----|-----|-----------|
| 0   | 0   | 0   | MR0       |
| 0   | 0   | 1   | MR1       |
| 0   | 1   | 0   | MR2       |
| 0   | 1   | 1   | MR3       |
| 1   | 0   | 0   | MR4       |
| 1   | 0   | 1   | MR5       |
| 1   | 1   | 0   | MR6       |
| 1   | 1   | 1   | RCW       |

- ODT -

| A12 | Write CRC |
|---|---|
| 0 | Disabled |
| 1 | Enabled |

| A10 | A9 | RTT_WR |
|---|---|---|
| 0 | 0 | Dynamic ODT Off |
| 0 | 1 | RZQ/2 |
| 1 | 0 | RZQ/1 |
| 1 | 1 | Hi-Z |

| A5 | A4 | A3 | CWL | Speed bin in MT/s |
|---|---|---|---|---|
| 0 | 0 | 0 | 9 | 1600 |
| 0 | 0 | 1 | 10 | 1867 |
| 0 | 1 | 0 | 11 | 2133, 1600 |
| 0 | 1 | 1 | 12 | 2400, 1867 |
| 1 | 0 | 0 | 14 | 2133 |
| 1 | 0 | 1 | 16 | 2400 |
| 1 | 1 | 0 | 18 | |
| 1 | 1 | 1 | Reserved | |

MR2

| BG0 | BA1 | BA0 | MR Select |
|---|---|---|---|
| 0 | 0 | 0 | MR0 |
| 0 | 0 | 1 | MR1 |
| 0 | 1 | 0 | MR2 |
| 0 | 1 | 1 | MR3 |
| 1 | 0 | 0 | MR4 |
| 1 | 0 | 1 | MR5 |
| 1 | 1 | 0 | MR6 |
| 1 | 1 | 1 | RCW |

FIG. 14B

| PIN\BURST | 0 | 1 | 2 | 3 | 4 | 5 | 6 | 7 | 8 | 9 |
|---|---|---|---|---|---|---|---|---|---|---|
| DQ0 | d0 | d1 | d2 | d3 | d4 | d5 | d6 | d7 | CRC0 | 1 |
| DQ1 | d8 | d9 | d10 | d11 | d12 | d8 | d14 | d15 | CRC1 | 1 |
| DQ2 | d16 | d17 | d18 | d19 | d20 | d16 | d22 | d23 | CRC2 | 1 |
| DQ3 | d24 | d25 | d26 | d27 | d28 | d24 | d30 | d31 | CRC3 | 1 |
| DQ4 | d32 | d23 | d34 | d35 | d36 | d32 | d38 | d39 | CRC4 | 1 |
| DQ5 | d40 | d41 | d42 | d43 | d44 | d40 | d46 | d47 | CRC5 | 1 |
| DQ6 | d48 | d49 | d50 | d51 | d52 | d48 | d54 | d55 | CRC6 | 1 |
| DQ7 | d56 | d57 | d58 | d59 | d60 | d56 | d62 | d63 | CRC7 | 1 |
| DBI | d64 | d65 | d66 | d67 | d68 | d64 | d70 | d71 | 1 | 1 |

FIG. 14C

| PIN\BURST | 0 | 1 | 2 | 3 | 4 | 5 | 6 | 7 | 8 | 9 |
|---|---|---|---|---|---|---|---|---|---|---|
| DQ0 | d0 | d1 | d2 | d3 | d4 | d5 | d6 | d7 | CRC0 | CRC4 |
| DQ1 | d8 | d9 | d10 | d11 | d12 | d13 | d14 | d15 | CRC1 | CRC5 |
| DQ2 | d16 | d17 | d18 | d19 | d20 | d21 | d22 | d23 | CRC2 | CRC6 |
| DQ3 | d24 | d24 | d26 | d27 | d28 | d29 | d30 | d31 | CRC3 | CRC7 |

FIG. 14D

| PIN\BURST | 0 | 1 | 2 | 3 | 4 | 5 | 6 | 7 | 8 | 9 |
|---|---|---|---|---|---|---|---|---|---|---|
| DQ0 | d0 | d1 | d2 | d3 | d4 | d5 | d6 | d7 | CRC0 | 1 |
| DQ1 | d8 | d9 | d10 | d11 | d12 | d8 | d14 | d15 | CRC1 | 1 |
| DQ2 | d16 | d17 | d18 | d19 | d20 | d16 | d22 | d23 | CRC2 | 1 |
| DQ3 | d24 | d25 | d26 | d27 | d28 | d24 | d30 | d31 | CRC3 | 1 |
| DQ4 | d32 | d23 | d34 | d35 | d36 | d32 | d38 | d39 | CRC4 | 1 |
| DQ5 | d40 | d41 | d42 | d43 | d44 | d40 | d46 | d47 | CRC5 | 1 |
| DQ6 | d48 | d49 | d50 | d51 | d52 | d48 | d54 | d55 | CRC6 | 1 |
| DQ7 | d56 | d57 | d58 | d59 | d60 | d56 | d62 | d63 | CRC7 | 1 |
| LDBI | d64 | d65 | d66 | d67 | d68 | d64 | d70 | d71 | 1 | 1 |
| DQ8 | d72 | d73 | d74 | d75 | d76 | d77 | d78 | d79 | CRC8 | 1 |
| DQ9 | d80 | d81 | d82 | d83 | d84 | d85 | d86 | d87 | CRC9 | 1 |
| DQ10 | d88 | d89 | d90 | d91 | d92 | d93 | d94 | d95 | CRC10 | 1 |
| DQ11 | d96 | d97 | d98 | d99 | d100 | d101 | d102 | d103 | CRC11 | 1 |
| DQ12 | d104 | d105 | d106 | d107 | d108 | d109 | d110 | d111 | CRC12 | 1 |
| DQ13 | d112 | d113 | d114 | d115 | d116 | d117 | d118 | d119 | CRC13 | 1 |
| DQ14 | d120 | d121 | d122 | d123 | d124 | d125 | d126 | d127 | CRC14 | 1 |
| DQ15 | d128 | d129 | d130 | d131 | d132 | d133 | d134 | d135 | CRC15 | 1 |
| UDBI | d136 | d137 | d138 | d139 | d140 | d141 | d142 | d143 | 1 | 1 |

FIG. 14E

| BURST<br>PIN | 0 | 1 | 2 | 3 | 4 | 5 | 6 | 7 |
|---|---|---|---|---|---|---|---|---|
| DQ0 | d0 | d1 | d2 | d3 | d4 | d5 | d6 | d7 |
| DQ1 | d8 | d9 | d10 | d11 | d12 | d8 | d14 | d15 |
| DQ2 | d16 | d17 | d18 | d19 | d20 | d16 | d22 | d23 |
| DQ3 | d24 | d25 | d26 | d27 | d28 | d24 | d30 | d31 |
| DQ4 | d32 | d23 | d34 | d35 | d36 | d32 | d38 | d39 |
| DQ5 | d40 | d41 | d42 | d43 | d44 | d40 | d46 | d47 |
| DQ6 | d48 | d49 | d50 | d51 | d52 | d48 | d54 | d55 |
| DQ7 | d56 | d57 | d58 | d59 | d60 | d56 | d62 | d63 |
| DBI | d64 | d65 | d66 | d67 | d68 | d64 | d70 | d71 |
| EDC | CRC0 | CRC1 | CRC2 | CRC3 | CRC4 | CRC5 | CRC6 | CRC7 |

FIG. 15A

| BG1 | BG0 | BA1 | BA0 | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|
| RFU | 0 | 1 | 1 | RFU | MPR RF | WCL | | | RFU | | | | PDA | GD | MPR O | | MPRL |

MR3

| A12 | A11 | MPR Read Format |
|---|---|---|
| 0 | 0 | Serial |
| 0 | 1 | Parallel |
| 1 | 0 | Staggered |
| 1 | 1 | Reserved |

| A10 | A11 | CRC+DM Write Command Latency | Speed Bin |
|---|---|---|---|
| 0 | 0 | 4nCK | 1600 |
| 0 | 1 | 5nCK | 1866, 2133, 2400 |
| 1 | 0 | 6nCK | TBD |

| A1 | A0 | MPR Location |
|---|---|---|
| 0 | 0 | Page 0 |
| 0 | 1 | Page 1 |
| 1 | 0 | Page 2 |
| 1 | 1 | Page 3 |

| A2 | MPR Operation |
|---|---|
| 0 | Normal |
| 1 | Data flow from/to MPR |

| A3 | Geardwon Mode |
|---|---|
| 0 | 1/2 Rate |
| 1 | 1/4 Rate |

| A4 | Per MRAM Addressability |
|---|---|
| 0 | Disable |
| 1 | Enable |

| RG0 | BA1 | BA0 | MR Select |
|---|---|---|---|
| 0 | 0 | 0 | MR0 |
| 0 | 0 | 1 | MR1 |
| 0 | 1 | 0 | MR2 |
| 0 | 1 | 1 | MR3 |
| 1 | 0 | 0 | MR4 |
| 1 | 0 | 1 | MR5 |
| 1 | 1 | 0 | MR6 |
| 1 | 1 | 1 | RCW |

- MPR -

| MR3 A[2] | MR3 A[1:0] | Function |
|---|---|---|
| MPRO | MPRL | |
| 0b | | Normal operation, no MPR transaction. All subsequent Reads will come from MRAM array. All subsequent Write will go to MRAM array. |
| 1b | See Fig. 15d | Enable MPR mode, subsequent RD/RDA commands defined by MR3 A[1:0]. |

FIG. 15D

MPR page0 (Training Pattern)

| Address | MPR Location | [7] | [6] | [5] | [4] | [3] | [2] | [1] | [0] | note |
|---|---|---|---|---|---|---|---|---|---|---|
| BA1:BA0 | 00=MPR0 | 0 | 1 | 0 | 1 | 0 | 1 | 0 | 1 | Read/Write (default value) |
| | 01=MPR1 | 0 | 0 | 1 | 1 | 0 | 0 | 1 | 1 | |
| | 10=MPR2 | 0 | 0 | 0 | 0 | 1 | 1 | 1 | 1 | |
| | 11=MPR3 | 0 | 0 | 0 | 0 | 0 | 0 | 0 | 0 | |

MPR page1 (CA Parity Error Log)

| Address | MPR Location | [7] | [6] | [5] | [4] | [3] | [2] | [1] | [0] | note |
|---|---|---|---|---|---|---|---|---|---|---|
| BA1:BA0 | 00=MPR0 | A[7] | A[6] | A[5] | A[4] | A[3] | A[2] | A[1] | A[0] | Read-only |
| | 01=MPR1 | [A15]/CAS_n | [A14]/WE_n | A[13] | A[12] | A[11] | A[10] | A[9] | A[8] | |
| | 10=MPR2 | PAR_IN | ACT_n | BG[1] | BG[0] | BA[1] | BG[0] | A[17] | A[16]/RAS_n | |
| | 11=MPR3 | CRC Error Status | CA Parity Error Status | CA Pariy Latency | | | C[2] | C[1] | C[0] | |

MPR page2 (MRS Readout)

| Address | MPR Location | [7] | [6] | [5] | [4] | [3] | [2] | [1] | [0] | note |
|---|---|---|---|---|---|---|---|---|---|---|
| BA1:BA0 | 00=MPR0 | RFU | RFU | RFU | | CRC Write Enable | Rtt_WR | | | Read-only |
| | 01=MPR1 | VreDQ Training Range | VreDQ Training Value | | | | | Geardown Enable | | |
| | 10=MPR2 | CAS Latency | | | | | CAS Write Latency | | | |
| | 11=MPR3 | Rtt_Nom | | | Rtt_Park | | | Driver Impedance | | |

MPR page3 (RFU)

| Address | MPR Location | [7] | [6] | [5] | [4] | [3] | [2] | [1] | [0] | note |
|---|---|---|---|---|---|---|---|---|---|---|
| BA1:BA0 | 00=MPR0 | don't care | don't care | don't care | don't care | don't care | don't care | don't care | don't care | Read-only |
| | 01=MPR1 | don't care | don't care | don't care | don't care | don't care | don't care | don't care | don't care | |
| | 10=MPR2 | don't care | don't care | don't care | don't care | don't care | don't care | don't care | don't care | |
| | 11=MPR3 | don't care | don't care | don't care | don't care | don't care | don't care | don't care | don't care | |

FIG. 15E x4 Device

| Serial | UI7 | UI6 | UI5 | UI4 | UI3 | UI2 | UI1 | UI0 |
|---|---|---|---|---|---|---|---|---|
| DQ0 | 0 | 1 | 1 | 1 | 1 | 1 | 1 | 1 |
| DQ1 | 0 | 1 | 1 | 1 | 1 | 1 | 1 | 1 |
| DQ2 | 0 | 1 | 1 | 1 | 1 | 1 | 1 | 1 |
| DQ3 | 0 | 1 | 1 | 1 | 1 | 1 | 1 | 1 | x8 Device

| Serial | UI7 | UI6 | UI5 | UI4 | UI3 | UI2 | UI1 | UI0 |
|---|---|---|---|---|---|---|---|---|
| DQ0 | 0 | 1 | 1 | 1 | 1 | 1 | 1 | 1 |
| DQ1 | 0 | 1 | 1 | 1 | 1 | 1 | 1 | 1 |
| DQ2 | 0 | 1 | 1 | 1 | 1 | 1 | 1 | 1 |
| DQ3 | 0 | 1 | 1 | 1 | 1 | 1 | 1 | 1 |
| DQ4 | 0 | 1 | 1 | 1 | 1 | 1 | 1 | 1 |
| DQ5 | 0 | 1 | 1 | 1 | 1 | 1 | 1 | 1 |
| DQ6 | 0 | 1 | 1 | 1 | 1 | 1 | 1 | 1 |
| DQ7 | 0 | 1 | 1 | 1 | 1 | 1 | 1 | 1 | x16 Device

| Serial | UI7 | UI6 | UI5 | UI4 | UI3 | UI2 | UI1 | UI0 |
|---|---|---|---|---|---|---|---|---|
| DQ0 | 0 | 1 | 1 | 1 | 1 | 1 | 1 | 1 |
| DQ1 | 0 | 1 | 1 | 1 | 1 | 1 | 1 | 1 |
| DQ2 | 0 | 1 | 1 | 1 | 1 | 1 | 1 | 1 |
| DQ3 | 0 | 1 | 1 | 1 | 1 | 1 | 1 | 1 |
| DQ4 | 0 | 1 | 1 | 1 | 1 | 1 | 1 | 1 |
| DQ5 | 0 | 1 | 1 | 1 | 1 | 1 | 1 | 1 |
| DQ6 | 0 | 1 | 1 | 1 | 1 | 1 | 1 | 1 |
| DQ7 | 0 | 1 | 1 | 1 | 1 | 1 | 1 | 1 |
| DQ8 | 0 | 1 | 1 | 1 | 1 | 1 | 1 | 1 |
| DQ9 | 0 | 1 | 1 | 1 | 1 | 1 | 1 | 1 |
| DQ10 | 0 | 1 | 1 | 1 | 1 | 1 | 1 | 1 |
| DQ11 | 0 | 1 | 1 | 1 | 1 | 1 | 1 | 1 |
| DQ12 | 0 | 1 | 1 | 1 | 1 | 1 | 1 | 1 |
| DQ13 | 0 | 1 | 1 | 1 | 1 | 1 | 1 | 1 |
| DQ14 | 0 | 1 | 1 | 1 | 1 | 1 | 1 | 1 |
| DQ15 | 0 | 1 | 1 | 1 | 1 | 1 | 1 | 1 |

FIG. 15F x4 Device

| Parallel | UI7 | UI6 | UI5 | UI4 | UI3 | UI2 | UI1 | UI0 |
|---|---|---|---|---|---|---|---|---|
| DQ0 | 0 | 0 | 0 | 0 | 0 | 0 | 0 | 0 |
| DQ1 | 1 | 1 | 1 | 1 | 1 | 1 | 1 | 1 |
| DQ2 | 1 | 1 | 1 | 1 | 1 | 1 | 1 | 1 |
| DQ3 | 1 | 1 | 1 | 1 | 1 | 1 | 1 | 1 | x8 Device

| Parallel | UI7 | UI6 | UI5 | UI4 | UI3 | UI2 | UI1 | UI0 |
|---|---|---|---|---|---|---|---|---|
| DQ0 | 0 | 0 | 0 | 0 | 0 | 0 | 0 | 0 |
| DQ1 | 1 | 1 | 1 | 1 | 1 | 1 | 1 | 1 |
| DQ2 | 1 | 1 | 1 | 1 | 1 | 1 | 1 | 1 |
| DQ3 | 1 | 1 | 1 | 1 | 1 | 1 | 1 | 1 |
| DQ4 | 1 | 1 | 1 | 1 | 1 | 1 | 1 | 1 |
| DQ5 | 1 | 1 | 1 | 1 | 1 | 1 | 1 | 1 |
| DQ6 | 1 | 1 | 1 | 1 | 1 | 1 | 1 | 1 |
| DQ7 | 1 | 1 | 1 | 1 | 1 | 1 | 1 | 1 | x16 Device

| Parallel | UI7 | UI6 | UI5 | UI4 | UI3 | UI2 | UI1 | UI0 |
|---|---|---|---|---|---|---|---|---|
| DQ0 | 0 | 0 | 0 | 0 | 0 | 0 | 0 | 0 |
| DQ1 | 1 | 1 | 1 | 1 | 1 | 1 | 1 | 1 |
| DQ2 | 1 | 1 | 1 | 1 | 1 | 1 | 1 | 1 |
| DQ3 | 1 | 1 | 1 | 1 | 1 | 1 | 1 | 1 |
| DQ4 | 1 | 1 | 1 | 1 | 1 | 1 | 1 | 1 |
| DQ5 | 1 | 1 | 1 | 1 | 1 | 1 | 1 | 1 |
| DQ6 | 1 | 1 | 1 | 1 | 1 | 1 | 1 | 1 |
| DQ7 | 1 | 1 | 1 | 1 | 1 | 1 | 1 | 1 |
| DQ8 | 0 | 0 | 0 | 0 | 0 | 0 | 0 | 0 |
| DQ9 | 1 | 1 | 1 | 1 | 1 | 1 | 1 | 1 |
| DQ10 | 1 | 1 | 1 | 1 | 1 | 1 | 1 | 1 |
| DQ11 | 1 | 1 | 1 | 1 | 1 | 1 | 1 | 1 |
| DQ12 | 1 | 1 | 1 | 1 | 1 | 1 | 1 | 1 |
| DQ13 | 1 | 1 | 1 | 1 | 1 | 1 | 1 | 1 |
| DQ14 | 1 | 1 | 1 | 1 | 1 | 1 | 1 | 1 |
| DQ15 | 1 | 1 | 1 | 1 | 1 | 1 | 1 | 1 |

FIG. 15G x4 (Read MPR0 command)

| Stagger | UI7-0 |
|---|---|
| DQ0 | MPR0 |
| DQ1 | MPR1 |
| DQ2 | MPR2 |
| DQ3 | MPR3 | x8 (Read MPR0 command)

| Stagger | UI7-0 |
|---|---|
| DQ0 | MPR0 |
| DQ1 | MPR1 |
| DQ2 | MPR2 |
| DQ3 | MPR3 |
| DQ4 | MPR0 |
| DQ5 | MPR1 |
| DQ6 | MPR2 |
| DQ7 | MPR3 | x16 (Read MPR0 command)

| Stagger | UI7-0 |
|---|---|
| DQ0 | MPR0 |
| DQ1 | MPR1 |
| DQ2 | MPR2 |
| DQ3 | MPR3 |
| DQ4 | MPR0 |
| DQ5 | MPR1 |
| DQ6 | MPR2 |
| DQ7 | MPR3 |
| DQ8 | MPR0 |
| DQ9 | MPR1 |
| DQ10 | MPR2 |
| DQ11 | MPR3 |
| DQ12 | MPR0 |
| DQ13 | MPR1 |
| DQ14 | MPR2 |
| DQ15 | MPR3 |

FIG. 16A

| BA3 | BA2 | BA1 | BA0 | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|
| RFU | | 1 | 0 | 0 | WP | RP | RTP | RFU | CAL | | | RFU | Vref | RFU | | PD | RFU |

| A1 | Maximum Power Down Mode |
|---|---|
| 0 | Disable |
| 1 | Enable |

| A4 | Internal Vref Monitor |
|---|---|
| 0 | Disable |
| 1 | Enable |

| A8 | A7 | A6 | CS to CMD/ADDR Latency Mode (Cycle) |
|---|---|---|---|
| 0 | 0 | 0 | Disable |
| 0 | 0 | 1 | 3 |
| 0 | 1 | 0 | 4 |
| 0 | 1 | 1 | 5 |
| 1 | 0 | 0 | 6 |
| 1 | 0 | 1 | 8 |
| 1 | 1 | 0 | Reserved |
| 1 | 1 | 1 | Reserved |

| A10 | Read Preamble Training Mode |
|---|---|
| 0 | Disable |
| 1 | Enable |

| A11 | Read Preamble Training Mode |
|---|---|
| 0 | 1tck |
| 1 | 2tck |

| A12 | Write Preamble Training Mode |
|---|---|
| 0 | 1tck |
| 1 | 2tck |

MR4

| BG0 | BA1 | BA0 | MR Select |
|---|---|---|---|
| 0 | 0 | 0 | MR0 |
| 0 | 0 | 1 | MR1 |
| 0 | 1 | 0 | MR2 |
| 0 | 1 | 1 | MR3 |
| 1 | 0 | 0 | MR4 |
| 1 | 0 | 1 | MR5 |
| 1 | 1 | 0 | MR6 |
| 1 | 1 | 1 | RCW |

– VrefDQ –

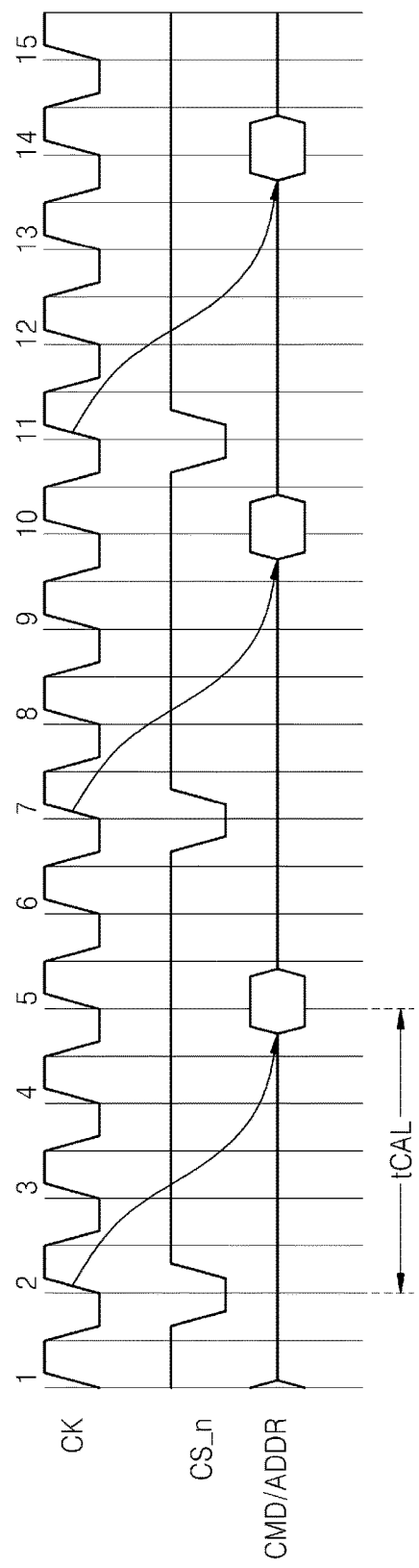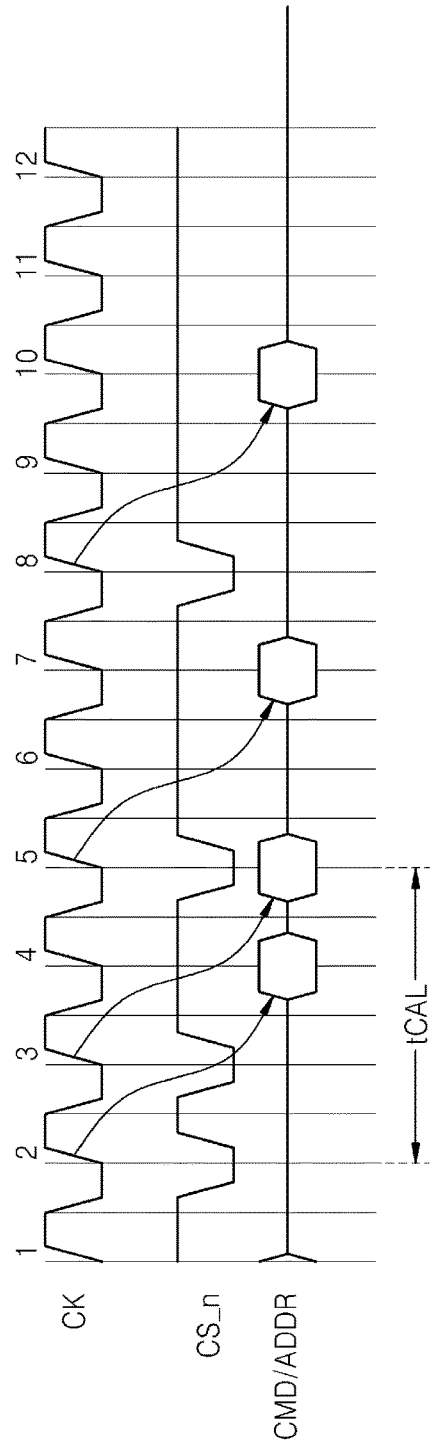

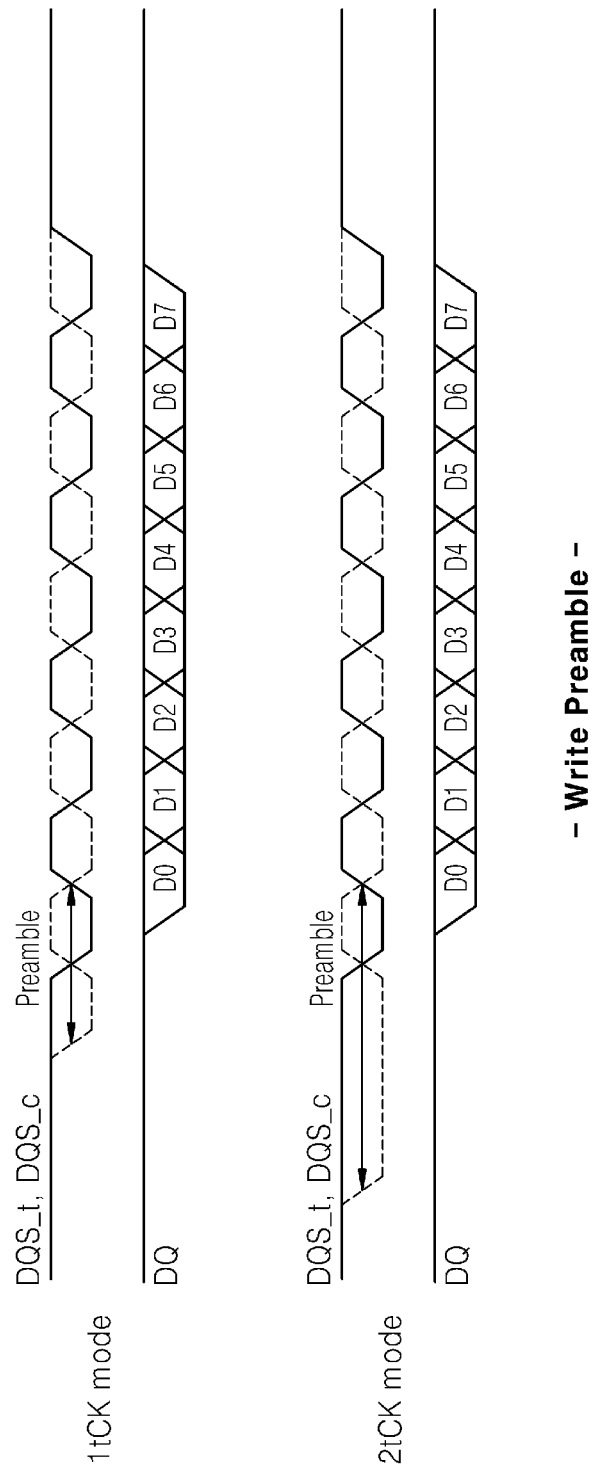

| A2 | A1 | A0 | C/A Parity Latency |
|----|----|----|--------------------|
| 0  | 0  | 0  | Disable            |
| 0  | 0  | 1  | 4                  |
| 0  | 1  | 0  | 5                  |
| 0  | 1  | 1  | 6                  |
| 1  | 0  | 0  | 8                  |
| 1  | 0  | 1  | Reserved           |
| 1  | 1  | 0  | Reserved           |
| 1  | 1  | 1  | Reserved           |

| A3 | CRC Error Clear |
|----|-----------------|
| 0  | Clear           |
| 1  | Error           |

| A4 | C/A Parity Error Status |
|----|-------------------------|
| 0  | Clear                   |
| 1  | Error                   |

| A5 | ODT Input Buffer for Power Down |
|----|---------------------------------|
| 0  | Disable                         |
| 1  | Enable                          |

| A8 | A7 | A6 | RTT_PARK         |
|----|----|----|------------------|
| 0  | 0  | 0  | RTT_PARK Disable |
| 0  | 0  | 1  | RZQ/4            |
| 0  | 1  | 0  | RZQ/2            |
| 0  | 1  | 1  | RZQ/6            |
| 1  | 0  | 0  | RZQ/1            |
| 1  | 0  | 1  | RZQ/5            |
| 1  | 1  | 0  | RZQ/3            |
| 1  | 1  | 1  | RZQ/7            |

| A10 | Data Mask |
|-----|-----------|
| 0   | Disable   |
| 1   | Enable    |

| A11 | Write DBI |
|-----|-----------|
| 0   | Disable   |
| 1   | Enable    |

| A12 | Read DBI |
|-----|----------|
| 0   | Disable  |
| 1   | Enable   |

| BG0 | BA1 | BA0 | MR Select |
|-----|-----|-----|-----------|
| 0   | 0   | 0   | MR0       |
| 0   | 0   | 1   | MR1       |
| 0   | 1   | 0   | MR2       |
| 0   | 1   | 1   | MR3       |
| 1   | 0   | 0   | MR4       |
| 1   | 0   | 1   | MR5       |
| 1   | 1   | 0   | MR6       |
| 1   | 1   | 1   | RCW       |

FIG. 17B

| MR1 bit A11 | DM (MR5 bit A10) | Write DBI (MR5 bit A11) | Read DBI (MR5 bit A12) |
|---|---|---|---|
| 0 (TDQS Disabled) | Enabled | Disabled | Enabled or Disabled |
| | Disabled | Enabled | Enabled or Disabled |
| | Disabled | Disabled | Enabled or Disabled |
| 1 (TDQS Enabled) | Disabled | Disabled | Disabled |

FIG. 18A

| BA3 | BA2 | BA1 | BA0 | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|
| RFU | 1 | 1 | 0 | RFU | tCCD_L | | | RFU | | TE | TR | VrefDQ Training Value | | | | | |

MR6

| A12 | A11 | A10 | tCCD_L.min(nCK) |
|---|---|---|---|
| 0 | 0 | 0 | 4 |
| 0 | 0 | 1 | 5 |
| 0 | 1 | 0 | 6 |
| 0 | 1 | 1 | 7 |
| 1 | 0 | 0 | 8 |
| 1 | 0 | 1 | Reserved |
| 1 | 1 | 0 | Reserved |
| 1 | 1 | 1 | Reserved |

| A6 | VrefDQ Training Range |
|---|---|
| 0 | Range 1 |
| 1 | Range 2 |

| A7 | VrefDQ Training Enable |
|---|---|
| 0 | Disable |
| 1 | Enable |

| BG0 | BA1 | BA0 | MR Select |
|---|---|---|---|
| 0 | 0 | 0 | MR0 |
| 0 | 0 | 1 | MR1 |
| 0 | 1 | 0 | MR2 |
| 0 | 1 | 1 | MR3 |
| 1 | 0 | 0 | MR4 |
| 1 | 0 | 1 | MR5 |
| 1 | 1 | 0 | MR6 |
| 1 | 1 | 1 | RCW |

FIG. 18B

| A5:A0 | Range1 | Range2 | A5:A0 | Range1 | Range2 |
|---|---|---|---|---|---|
| 00 0000 | 60.00% | 45.00% | 01 1010 | 76.90% | 61.90% |
| 00 0001 | 60.65% | 45.65% | 01 1011 | 77.55% | 62.55% |
| 00 0010 | 61.30% | 46.30% | 01 1100 | 78.20% | 63.20% |
| 00 0011 | 61.95% | 45.00% | 01 1101 | 78.85% | 63.85% |
| 00 0100 | 62.60% | 45.00% | 01 1101 | 79.50% | 64.50% |
| 00 0101 | 63.25% | 45.00% | 01 1111 | 80.15% | 66.16% |
| 00 0110 | 63.90% | 45.00% | 10 0000 | 80.80% | 65.80% |
| 00 0111 | 64.55% | 45.00% | 10 0001 | 81.45% | 66.45% |
| 00 1000 | 65.20% | 50.20% | 10 0010 | 82.10% | 67.10% |
| 00 1001 | 65.85% | 50.85% | 10 0011 | 82.75% | 67.75% |
| 00 1010 | 66.60% | 61.60% | 10 0100 | 83.40% | 68.40% |
| 00 1011 | 67.15% | 52.15% | 10 0101 | 84.05% | 69.05% |
| 00 1100 | 67.80% | 52.80% | 10 0110 | 84.70% | 69.70% |
| 00 1101 | 66.45% | 53.45% | 10 0111 | 85.35% | 70.35% |
| 00 1110 | 69.10% | 54.10% | 10 1000 | 86.00% | 71.00% |
| 00 1111 | 69.75% | 54.75% | 10 1001 | 86.65% | 71.65% |
| 01 0000 | 70.40% | 55.40% | 10 1010 | 87.30% | 72.30% |
| 01 0001 | 71.05% | 66.06% | 10 1011 | 87.95% | 72.95% |
| 01 0010 | 71.70% | 56.70% | 10 1100 | 88.60% | 73.60% |
| 01 0011 | 72.35% | 57.35% | 10 1101 | 89.25% | 74.25% |
| 01 0100 | 73.00% | 58.00% | 10 1110 | 89.90% | 74.90% |
| 01 0101 | 73.65% | 58.65% | 10 1111 | 90.55% | 75.55% |
| 01 0110 | 74.30% | 59.30% | 11 0000 | 91.20% | 76.20% |
| 01 0111 | 74.95% | 59.95% | 11 0001 | 91.85% | 45.00% |
| 01 1000 | 76.60% | 60.60% | 11 0010 | 92.50% | 77.50% |
| 01 1001 | 76.25% | 61.25% | 11 0011 to 11 1111 | Reserved | Reserved |

FIG. 26

| BA3 | BA2 | BA1 | BA0 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|
| 0 | 1 | 0 | 0 | 0 | EDC 13Inv | WR CRC | RD CRC | CRCRL | | | CRCWL | | | EDC Hold Pattern | | |

| A11 | EDC Hold Pattern Invert for EDC1 + EDC3 |
|---|---|
| 0 | EDC hold pattern not inverted |
| 1 | EDC hold pattern inverted |

| A8 | A7 | CRC Read Latency |
|---|---|---|
| 0 | 0 | 0 / optional |
| 0 | 1 | 1 / optional |
| 1 | 0 | 2 / optional |
| 1 | 1 | 3 / optional |

| A9 | RD CRC |
|---|---|
| 0 | On |
| 1 | Off |

| A10 | WR CRC |
|---|---|
| 0 | On |
| 1 | Off |

| A6 | A5 | A4 | CRC Write Latency |
|---|---|---|---|
| 0 | 0 | 0 | 7 / optional |
| 0 | 0 | 1 | 8 / optional |
| 0 | 1 | 0 | 9 / optional |
| 0 | 1 | 1 | 10 / optional |
| 1 | 0 | 0 | 11 / optional |
| 1 | 0 | 1 | 12 / optional |
| 1 | 1 | 0 | 13 / optional |
| 1 | 1 | 1 | 14 / optional |

| A3 | A2 | A1 | A0 | EDC Hold Pattern |
|---|---|---|---|---|
| 0 | 0 | 0 | 0 | Pattern |
| ... | ... | ... | ... | ... |
| 1 | 1 | 1 | 1 | Pattern |

Burst Pos 3  Burst Pos 2  Burst Pos 1  Burst Pos 0

FIG. 30B
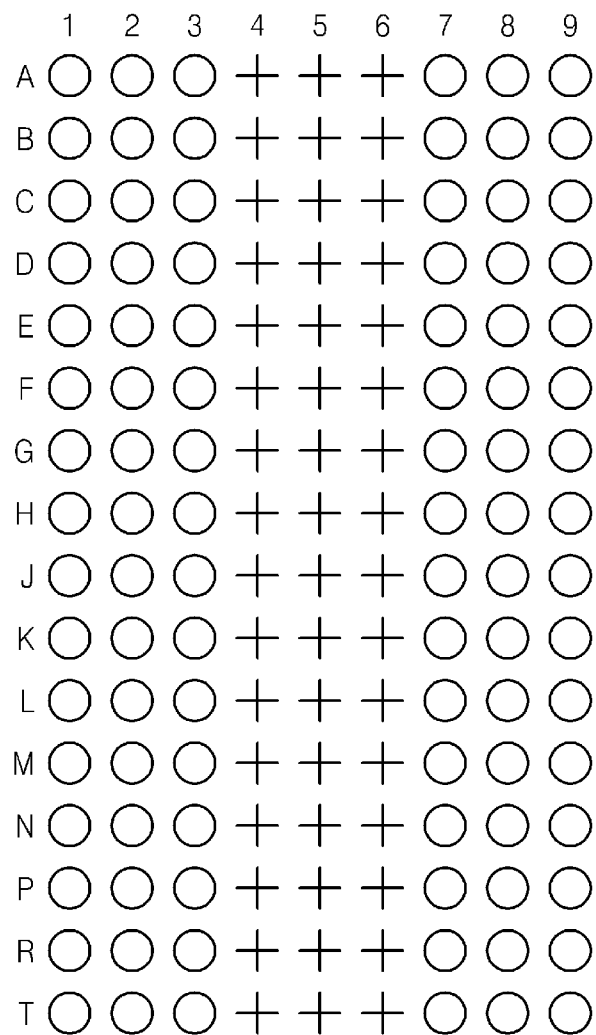
 Populated ball
 Ball not populated

FIG. 31

| | 1 | 2 | 3 | | 7 | 8 | 1 |
|---|---|---|---|---|---|---|---|
| A | VSS | VDD | NC | | NU/DQS# | VSS | VDD |
| B | VSS | VSSQ | DQ0 | | DM/TDQS | VSSQ | VDDQ |
| C | VDDQ | DQ2 | DQS | | DQ1 | DQ3 | VSSQ |
| D | VSSQ | DQ6 | DQS# | | VDD | VSS | VSSQ |
| E | VREFDQ | VDDQ | DQ4 | | DQ7 | DQS | VDDQ |
| F | NC | VSS | RAS# | | CK | VSS | NC |
| G | ODT | VDD | CAS# | | CK# | VDD | CKE |
| H | NC | CS# | WE# | | A10/AP | ZQ | NC |
| J | VSS | BA0 | BA2 | | A15 | VREFCA | VSS |
| K | VDD | A3 | A0 | | A12/BC# | BA1 | VDD |
| L | VSS | A5 | A2 | | A1 | A4 | VSS |
| M | VDD | A7 | A9 | | A11 | A6 | VDD |
| N | VSS | RESET# | A13 | | A14 | A8 | VSS |

FIG. 32

| | 1 | 2 | 3 | 4 | 5 | 6 | 7 | 8 | 1 | |
|---|---|---|---|---|---|---|---|---|---|---|
| A | VDD | VSSQ | NC | | | | DM_n, DB_n TDDQS_t[2] | VSSQ | VSS | A |
| B | VPP | VSSQ | DQS_c | | | | DQ1 | VDDQ | ZQ | B |
| C | VDDQ | DQ0 | DQS_t | | | | VSS | VSS | VDDQ | C |
| D | VSSQ | DQ4 | DQ2 | | | | DQ3 | DQ5/NC[2] | VSSQ | D |
| E | VSS | VDDQ/NC[2] | DQ6/NC[1] | | | | DQ7/NC[1] | VDDQ | VSS | E |
| F | VDD | VDDQ | ODT | | | | CK_t | CK_c | VDD | F |
| G | VSS | C2/ODT1 | CKE | | | | CS_n | C1/CS1_n | RFU | G |
| H | VDD | C0/CKE1 | ACT_n | | | | CAS_n/A15 | RAS_n/A16 | VSS | H |
| J | VREFCA | BG0 | A10/AP | | | | A12/BC_n | BG1 | VDD | J |
| K | VSS | BA0 | A4 | | | | A12/BC# | BA1 | VSS | K |
| L | RESET_n | A6 | A0 | | | | A3 | A5 | ALEFT_n | L |
| M | VDD | A8 | A2 | | | | A9 | A7 | VPP | M |
| N | VSS | A11 | PAR | | | | A17/NC[4] | A13 | VDD | N |

# SPIN TRANSFER TORQUE MAGNETIC RANDOM ACCESS MEMORY FOR SUPPORTING OPERATIONAL MODES WITH MODE REGISTER

CROSS-REFERENCE TO RELATED APPLICATIONS

This application is a Continuation of U.S. patent application Ser. No. 13/768,858, filed on Feb. 15, 2013, which claims the benefit of Korean Patent Application No. 10-2012-0052594, filed on May 17, 2012, in the Korean Intellectual Property Office, the disclosure of each of which is incorporated herein in its entirety by reference.

BACKGROUND

The disclosed embodiments relate to a semiconductor memory device, and more particularly, to an operational mode of a magnetic random access memory (MRAM) including a non-volatile magnetic layer.

The volumes of semiconductor products are gradually decreasing, but the semiconductor products still use high capacity data processes. Thus, it is helpful to increase an operation speed and integration of a memory device used in the semiconductor products. In order to satisfy such characteristics, an MRAM realizing a memory function by using a resistance variation according to a polarity change of a magnetic material has been suggested.

SUMMARY

The disclosed embodiments provide a magnetic random access memory (MRAM) providing various operational modes, and a memory module and memory system including the same. The various operational modes may be used for performing high speed, high capacity, and low power consumption functions.

According to one embodiment, there is provided a magnetic random access memory (MRAM) comprising magnetic memory cells configured to change between at least two states according to a magnetization direction, the MRAM including a mode register supporting a plurality of operational modes of the MRAM, wherein each operational mode is associated with a group of operational characteristics for the MRAM.

The mode register may be used to set a burst length indicating the maximum number of column locations accessible with respect to a read or write command of the MRAM.

The mode register may be used to set a read burst type defining an order of data output from the MRAM on a data terminal.

The mode register may be used to set a column address strobe (CAS) latency defining a clock cycle delay between a read command of the MRAM and a first bit of effective output data.

The mode register may be used to set a test mode of the MRAM.

The mode register may be used to provide a delay-locked loop (DLL) reset characteristic of the MRAM.

The mode register may be used to provide a write recovery and a read command-to-precharge characteristic for automatic precharge of the MRAM.

The mode register may be used to select a delay-locked loop (DLL) use during a precharge power down mode of the MRAM.

The mode register may be used to select a delay-locked loop (DLL) enable or disable of the MRAM.

The mode register may be used for output driver impedance control of the MRAM.

The mode register may be used to select an additive latency of the MRAM.

The mode register may be used to provide a write leveling characteristic to compensate for a skew between a clock and a strobe of the MRAM.

The mode register may be used to provide an on-die termination characteristic of the MRAM.

The mode register may be used to provide dynamic termination selected when nominal termination or park termination, and a write command, which are selected during an operation without a command of the MRAM, are registered.

The mode register may be used to provide a termination data strobe function that enables additional termination resistance outputs of the MRAM.

The mode register may be used to provide an output buffer enable or disable function of the MRAM.

The mode register may be used to provide a column address strobe (CAS) write latency function defined by a clock cycle delay between an internal write command of the MRAM and a first bit of effective input data.

The mode register may be used to provide a write cyclic redundancy check (CRC) function that enables CRC calculation of data transmitted between the MRAM and a memory controller.

The mode register may be used to provide a multi purpose register (MPR) function for reading a predetermined system timing a calibration bit sequence of the MRAM.

The mode register may provide a training pattern, command and address (CA) parity error log, or mode register readout function during multi read/write of the MRAM.

The mode register may be used to provide a gear down mode selecting a 1/2 rate clock mode or 1/4 rate clock mode of the MRAM.

The mode register may be used to provide the 1/2 rate clock mode during a low frequency mode register set (MRS mode register signal) command of the MRAM, and provide the 1/4 rate clock mode during a normal operation.

The mode register may be used to provide a per MRAM addressing mode for programming different on-die termination (ODT) or reference voltage values to MRAMs in one rank.

The mode register may be used to control write command latency of the MRAM.

The mode register may delay a command transmitted to a command buffer according to the write command latency by a predetermined clock cycle when CRC and data mask (DM) of the MRAM are both enabled.

The mode register may be used to control a mode register read mode for reading data stored in a mode register of the MRAM.

The mode register may read data according to a serial data return method wherein same patterns are returned to all data signal (DQ) lanes, a parallel data return method wherein data is read in parallel to the DQ lanes, or a stagger data return method wherein different MPRs are returned to the DQ lanes after a read command on one MPR has been issued.

The mode register may be used to control a maximum power down mode for providing a lowest power consumption mode of the MRAM.

The mode register may be used to provide a function of monitoring an operation voltage range of an internal DQ reference voltage of the MRAM, a step size, a reference voltage step time, a reference voltage full step time, or parameters of a reference voltage effective level.

The mode register may be used to control a command address latency function defined by a clock cycle time when command/address receivers are enabled after a command of the MRAM has been issued.

The mode register may be used to provide a read preamble training function of a data strobe (DQS) for read leveling that compensates for a skew of the MRAM.

The mode register may be used to provide a read preamble function such that a data strobe (DQS) of the MRAM has a predetermined preamble time before output of DQ data.

The mode register may be used to provide a read preamble function such that a data strobe (DQS) of the MRAM has a predetermined preamble time before input of DQ data.

The mode register may be used to provide a CA parity latency function for delaying a CA parity, wherein parities of a command signal and address signal of the MRAM may be calculated, by a predetermined clock cycle.

The mode register may be used to notify a CRC error state of the MRAM so that it is determined whether an error generated by the MRAM is a CRC error or an address/parity error.

The mode register may be used to notify a CA parity error state of the MRAM so that it is determined whether an error generated by the MRAM is a CRC error or an address/parity error.

The mode register may be used to control an ODT input buffer power down function of the MRAM.

The mode register may be used to provide a DM function of the MRAM.

The mode register may be used to provide a write data bus inversion (DBI) function for inverting write data to reduce power consumption of the MRAM.

The mode register may be used to provide a read DBI function for inverting read data to reduce power consumption of the MRAM.

The mode register may be used to provide an internal DQ reference voltage training function based on a VDDQ voltage of the MRAM.

The mode register may be used to control a tCCD timing defining a CAS-to-CAS command delay time of the MRAM.

The mode register may be used to provide latency set when a CRC value of write data of the MRAM is transmitted.

The mode register may be used to provide latency set when a CRC value of a read data of the MRAM is transmitted.

According to another embodiment, there is provided a semiconductor device including: at least one through electrode; and semiconductor layers electrically connected to each other through the at least one through electrode, and including magnetic random access memory (MRAM) including magnetic memory cells that are configured to change between at least two states according to a magnetization direction, wherein the semiconductor layers each include a mode register supporting a plurality of operational modes of the MRAM, wherein each operational mode is associated with a group of operational characteristics for the MRAM.

According to another embodiment, there is provided a memory module including: a module board; and at least one magnetic random access memory (MRAM) chip mounted on the module board and comprising magnetic memory cells configured to change between at least two states according to a magnetization direction, wherein the at least one MRAM chip includes a mode register supporting a plurality of operational modes, wherein each operational mode is associated with a group of operational characteristics for the MRAM.

The memory module may further include a buffer chip mounted on the module board and managing an operation of the at least one MRAM chip.

According to another embodiment, there is provided a memory system including: a magnetic random access memory (MRAM) including magnetic memory cells configured to change between at least two states according to a magnetization direction; and a memory controller communicating with the MRAM, wherein the MRAM includes a mode register supporting a plurality of operational modes, wherein each operational mode is associated with a group of operational characteristics for the MRAM. The memory controller may be configured to be used for the following: to select a first mode register set code, the first mode register set code including a set of predetermined bits that are used to select between different mode register states, each mode register state corresponding to one of the plurality of operational modes and for setting a group of operational characteristics; and to output a first command that includes the first mode register set code, wherein each bit of the set of predetermined bits has a particular value, in order to select a first operational mode associated with a first group of operational characteristics, wherein the first mode register set code is for controlling the operation of the MRAM according to the first group of operational characteristics.

The memory system may further include an optical link connected between the MRAM and the memory controller, wherein an electric to optical conversion signal or an optical to electric conversion signal is communicated through the optical link.

In another embodiment, a method of controlling the operation of a magnetic random access memory (MRAM) that includes magnetic memory cells configured to change between at least two states according to a magnetization direction is disclosed. The method includes: selecting a first mode register set code, the first mode register set code including a set of predetermined bits that are used to select between different mode register states, each mode register state for setting a group of operational characteristics; and outputting a first command that includes the first mode register set code, wherein each bit of the set of predetermined bits has a particular value in order to select a first mode register state for setting a first group of operational characteristics, wherein the first mode register set code is for controlling the operation of the MRAM according to the first group of operational characteristics.

The method may further include: selecting a second mode register set code, the second mode register set code including the set of predetermined bits; and outputting a second command that includes the second mode register set code, wherein each bit of the set of predetermined bits has a particular value in order to select a second mode register state including a second group of operational characteristics, wherein the second mode register set code is for controlling the operation of the MRAM according to the second group of operational characteristics.

The set of predetermined bits may be a set of bits having the same location within the mode register set code for both the first mode register set code and the second mode register set code.

The first group of operational characteristics may include one or more of: a burst length indicating the maximum number of column locations accessible with respect to a read or write command of the MRAM; a read burst type defining an order of data output from the MRAM on a data terminal; a column address strobe (CAS) latency defining a clock cycle delay between a read command of the MRAM and a first bit of effective output data; a test mode of the MRAM; a delay-locked loop (DLL) reset characteristic of the MRAM; a write recovery and a read command-to-precharge characteristic for automatic precharge of the MRAM; and a delay-locked loop (DLL) use during a precharge power down mode of the MRAM.

The second group of operational characteristics may include one or more of: a delay-locked loop (DLL) enable or disable of the MRAM; output driver impedance control of the MRAM; an additive latency of the MRAM; a write leveling characteristic to compensate for a skew between a clock and a strobe of the MRAM; an on-die termination characteristic of the MRAM; a termination data strobe function that enables additional termination resistance outputs of the MRAM; and an output buffer enable or disable function of the MRAM.

BRIEF DESCRIPTION OF THE DRAWINGS

Exemplary embodiments will be more clearly understood from the following detailed description taken in conjunction with the accompanying drawings in which:

FIGS. 12A through 18B are diagrams for describing exemplary mode register states according to various embodiments;

FIG. 26 is a diagram for describing an error detection code (EDC) mode register according to an exemplary embodiment;

FIGS. 29 through 35 are diagrams for describing an MRAM package, an MRAM pin, and an MRAM module, according to exemplary embodiments;

DETAILED DESCRIPTION

Figure 1:
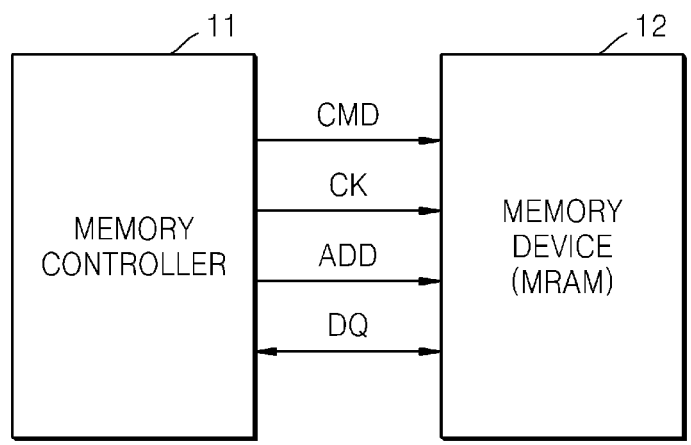
FIG. 1 is a diagram of a semiconductor memory system including a magnetic random access memory (MRAM), according to one embodiment.

Hereinafter, various embodiments will be described more fully with reference to the accompanying drawings. This invention may, however, be embodied in many different forms and should not be construed as limited to the exemplary embodiments set forth herein. In the drawings, like reference numerals denote like elements, and sizes of structures may be exaggerated or reduced for clarity.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "comprising," "including," or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

As used herein, the term "and/or" includes any and all combinations of one or more of the associated listed items.

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/". Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A magnetic random access memory (MRAM) is a non-volatile computer memory technology based on magnetoresistance. The MRAM is different from volatile RAM in many ways. Since the MRAM is non-volatile, the MRAM may maintain memory details even when power is turned off.

Generally, a non-volatile RAM is slower than volatile RAM, but the MRAM has read and write response times that are comparable to read and write response times of the volatile RAM. Unlike a general RAM technology storing a charge as data, the MRAM stores data by using magnetoresistance elements. Generally, a magnetoresistance element is formed of two magnetic layers each having magnetization.

The MRAM is a non-volatile memory device that reads and writes data by using a magnetic tunnel junction pattern including two magnetic layers and an insulation film disposed between the magnetic layers. A resistance value of a magnetic tunnel junction pattern may be changed according to the magnetization direction of a magnetic layer, and data may be programmed or removed by using a difference of such resistance values.

An MRAM using a spin transfer torque (STT) phenomenon uses a method where a magnetization direction of a magnetic layer is changed according to a spin transfer of electrons when a current having polarized spin flows in one direction. A magnetization direction of one magnetic layer (pinned layer) may be fixed, and a magnetization direction of another magnetic layer (free layer) may be changed according to a magnetic field generated according to a program current.

The magnetic field of the program current may arrange magnetization directions of two magnetic layers in parallel or anti-parallel. When the magnetization directions are parallel, a resistance between the two magnetic layers is in a low ("0") state. When the magnetization directions are anti-parallel, a resistance between the two magnetic layers is in a high ("1") state. Magnetization direction switching of the free layer and the high or low state of the resistance between the two magnetic layers provide write and read operations of the MRAM.

Although the MRAM is non-volatile and provides a quick response time, an MRAM cell has a limited scale and is sensitive to write disturbances. The program current applied to switch the high and low states of the resistance between the magnetic layers is typically high. Accordingly, when a plurality of cells are arranged in an MRAM array, a program current applied to one memory cell causes a field change of a free layer of an adjacent cell. Such a write disturbance may be prevented by using the STT phenomenon.

A typical STT-MRAM ("spin transfer torque" MRAM) may include a magnetic tunnel junction (MTJ), which is a magnetoresistive data storage device including two magnetic layers (pinned layer and free layer) and an insulation layer between the magnetic layers.

The program current typically flows through the MTJ. The pinned layer polarizes an electron spin of the program current, and a torque is generated as the spin-polarized electron current passes through the MTJ. The spin-polarized electron current applies torque to the free layer while interacting with the free layer.

When the torque of the spin-polarized electron current passing through the MTJ is higher than threshold switching current density, the torque applied by the spin-polarized electron current is sufficient to switch the magnetization direction of the free layer. Accordingly, the magnetization direction of the free layer may be parallel or anti-parallel to the pinned layer, and a resistance state between MTJs is changed.

The STT-MRAM removes a requirement of an external magnetic field for the spin-polarized electron current to switch the free layer in the magnetoresistive device. Furthermore, the STT-MRAM has improved scaling according to reduction of a cell size and reduction of the program current, and prevents the write disturbance. In addition, the STT-MRAM is capable of a high tunnel magnetoresistive ratio, and improves a read operation in a magnetic domain by allowing a high ratio between the high and low states.

The MRAM is an all-round memory device having a low price and high capacity features of a dynamic random access memory (DRAM), high speed operation characteristics of a static random access memory (SRAM), and non-volatile characteristics of a flash memory.

FIG. 1 is a diagram of a semiconductor memory system 10 including an MRAM, according to one exemplary embodiment.

Referring to FIG. 1, the semiconductor memory system 10 includes a memory controller 11 and a memory device 12. The memory controller 11 provides various signals for controlling the memory device 12, for example, a command signal CMD, a clock signal CLK, and an address signal ADD. Also, the memory controller 11 communicates with the memory device 12 to provide a data signal DQ to the memory device 12 or receive the data signal DQ from the memory device 12.

The memory device 12 may include a plurality of memory cells, for example, a cell array in which MRAM cells are arranged. For convenience of description, the memory device 12 will now be referred to as an MRAM 12. A DRAM interface following a DRAM protocol may exist between the memory controller 11 and the MRAM 12.

Figure 2:
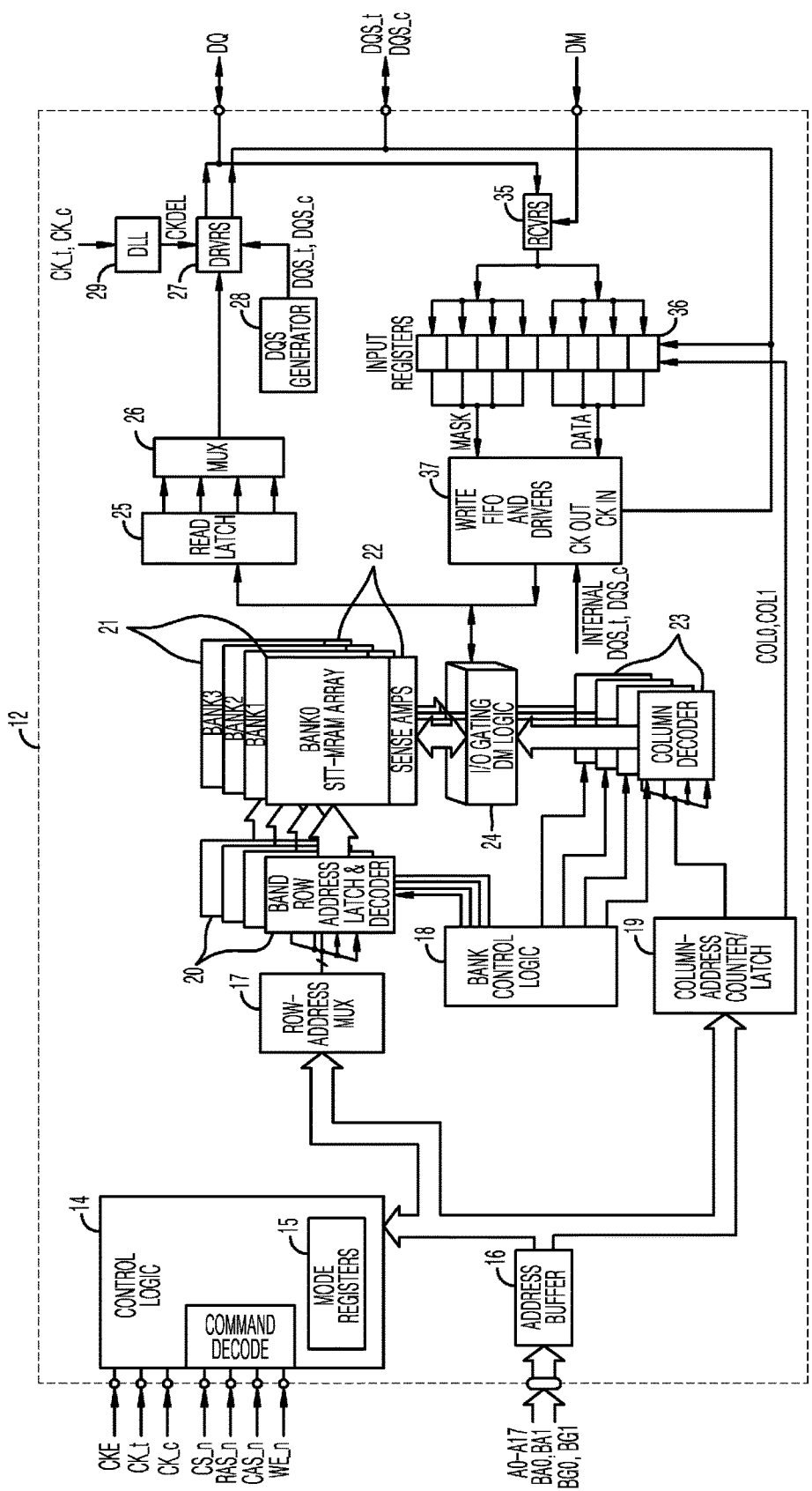
FIG. 2 is a diagram of an MRAM according to one embodiment.

FIG. 2 is an exemplary diagram of the MRAM 12 according to one embodiment.

Referring to FIG. 2, the MRAM 12 is a double data rate device that operates by being synchronized to a rising edge/falling edge of a clock signal CK. The MRAM 12 supports various data rates according to an operation frequency of the clock signal CK. For example, when the operation frequency of the clock signal CK is 800 MHz, the MRAM 12 supports a 1600 MT/s data rate. The MRAM 12 may support, for example, 1600, 1867, 2133, and 2400 MT/s data rates.

The MRAM 12 includes a control logic and command decoder 14 that receives a plurality of command signals and clock signals from an external device, such as the memory controller 11, via a control bus. The command signals include, for example, a chip select signal CS_n, a write enable signal WE_n, a column address strobe (CAS) signal CAS_N, and a row address strobe signal RAS_n. The clock signals include a clock enable signal CKE and complementary clock signals CK_t and CK_c. Here, _n denotes an active low signal. _t and _c denote a signal pair. The command signals CS_n, WE_n, RAS_n, and CAS_n may be driven by a logic value corresponding to a predetermined command, such as a read command or a write command.

The control logic and command decoder 14 includes a mode register 15 providing a plurality of operational modes of the MRAM 12. Each operational mode may control a particular group of operational characteristics of the MRAM 12. Each operational mode may be implemented based on the mode register 15 being in a particular mode register state. In certain embodiments, as described further below, a particular mode register state may be determined and selected based on a mode register set code (MRS code) received, for example, from a controller. The mode register 15 may program various functions, features, and modes of the MRAM 12. The mode register 15 will be described in detail below with reference to FIGS. 12 through 18. In one embodiment, the mode register 15 includes mode register states MR0 through MR6. However, additional, or different mode register states may also be included. Certain exemplary embodiments are described below for the different operational modes.

For example, in one embodiment, the mode register state MR0 controls a group of operational characteristics that include a burst length, a read burst type, column address strobe (CAS) latency, a test mode, delay-locked loop (DLL) reset, write recovery and read command-to-precharge command features, and DLL use during precharge power down. The mode register state MR1 controls DLL enable/disable, output drive intensity, additive latency (AL), write leveling enable/disable, termination data strobe (TDQS) enable/disable, and output buffer enable/disable.

The mode register state MR2 controls CAS write latency (CWL), dynamic termination, and write cyclic redundancy check (CRC). The mode register state MR3 controls a multi purpose register (MPR) location function of the MRAM 12, an MPR operation function, a gear down mode, a per MRAM addressing (PDA) mode, and an MPR read format. The mode register state MR4 controls a power down mode of the MRAM 12, reference voltage (Vref) monitoring, a CS-to-command/address latency mode, a read preamble training (RPT) mode, a read preamble function, and a write preamble function.

The mode register state MR5 controls a command and address (CA) parity function of the MRAM 12, a CRC error state, a CA parity error state, an on-die termination (ODT) input buffer power down function, a data mask (DM) function, a write data bus inversion (DBI) function, and a read DBI function. The mode register state MR6 controls a VrefDQ training value of the MRAM 12, a VrefDQ training range, VrefDQ training enable, and tCCD timing.

The control logic and command decoder 14 latches and decodes a command applied in response to the complementary clock signals CK_t and CK_c. The control logic and command decoder 14 generates a sequence of the clocking and control signals by using internal blocks for performing a function of an applied command. The clocking and control signals may be generated based on the mode register state.

The MRAM 12 further includes an address buffer 16 for receiving row, column, and bank addresses A0 through A17, BA0, and BA1, and bank group addresses BG0 and BG1 from the memory controller 11 of FIG. 1 through an address bus. The address buffer 16 receives a row address, a bank address, and a bank group address applied to a row address multiplexer 17 and a bank control logic 18.

The row address multiplexer 17 applies the row address received from the address buffer 16 to a plurality of address latch and decoders 20. The bank control logic 18 activates the address latch and decoders 20 corresponding to the bank address BA1:BA0 and the bank group signal BG1:BG0 received from the address buffer 16.

The activated address latch and decoders 20A through 20D apply various signals to corresponding memory banks 21 so as to activate rows of memory cells corresponding to decoded row addresses. Each of the memory banks 21 includes a memory cell array including a plurality of memory cells. Data stored in the memory cells of the activated rows is detected and amplified by sense amplifiers 22.

A column address is applied to an address bus after row and bank addresses are applied. The address buffer 16 applies the column address to a column address counter and latch 19. The column address counter and latch 19 latches the column address, and applies the latched column address to a plurality of column decoders 23. The bank control logic 18 activates the column decoders corresponding to the received bank address and bank group address, and the activated column decoders 23 decode the column address.

According to an operational mode of the MRAM 12, the column address counter and latch 19 directly applies the latched column address to the column decoders 23, or applies a column address sequence starting with a column address provided by the address buffer 16 to the column decoders 23. The column decoders 23A through 23D activated in response to the column address from the column address counter and latch 19 apply decode and control signals to input/output (I/O) gating and DM logic 24. The I/O gating and DM logic 24 accesses memory cells corresponding to the column addresses decoded from the rows of memory cells activated in the accessed memory banks 21A through 21D.

According to a read command of the MRAM 12, data is read from the addressed memory cells, and is connected to a read latch 25 through the I/O gating and DM logic 24. The I/O gating and DM logic 24 provides N bit data to the read latch 25, and the read latch 25, for example, applies 4 N/4 bits to a multiplexer 26.

The MRAM 12 may have an N prepatch architecture corresponding to a burst length N in each memory access. For example, the MRAM 12 may have a 4n prepatch architecture retrieving 4 pieces of n bit data. The MRAM 12 may be an x4 memory device that provides and receives 4-bit data per edge. Also, the MRAM 12 may have an 8n prepatch. When the MRAM 12 has a 4n prepatch and an x4 data width, the I/O gating and DM logic 24 provides 16 bits to the read latch 25 and 4 pieces of 4-bit data to the multiplexer 26.

A data driver 27 sequentially receives N/4-bit data from the multiplexer 26. Also, the data driver 27 receives data strobe signals DQS_t and DQS_c from a strobe signal generator 28, and receives a delayed clock signal CKDEL from a DLL 29. A data strobe (DQS) signal is used by an external device, such as the memory controller 11 of FIG. 1, for synchronized reception of read data during a read operation.

In response to the delayed clock signal CKDEL, the data driver 27 sequentially outputs received data to a data terminal DQ according to a corresponding data word. Each data word is output on one data bus by being synchronized to rising and falling edges of the applied clock signals CK_t and CK_c. A first data word is output after a read command, at a time according to a programmed CL. Also, the data driver 27 outputs the data strobe signals DQS_t and DQS_c having rising and falling edges synchronized to the rising and falling edges of the clock signals CK_t and CK_c.

During a write operation of the MRAM 12, the external device, such as the memory controller 11 of FIG. 1, applies, for example, N/4-bit data words to the data terminal DQ, and applies a DQS signal and a corresponding DM signal on a data bus. A data receiver 35 receives each data word and related DM signals, and applies the related DM signals to input registers 36 clocked to the DQS signal.

The input registers 36 latch a first N/4-bit data word and a related DM signal in response to the rising edge of the DQS signal, and latches a second N/4-bit data word and a related DM signal in response to the falling edge of the DQS signal. The input registers 36 provide 4 patched N/4-bit data words and related DM signals to a write first in first out (FIFO) and driver 37 in response to the DQS signal. The write FIFO and driver 37 receives an N-bit data word.

A data word is clocked out in the write FIFO and driver 37, and is applied to the I/O gating and DM logic 24. The I/O gating and DM logic 24 transmits a data word to memory cells addressed in the accessed memory banks 21A through 21D upon receiving a DM signal. The DM signal selectively masks predetermined bits or a predetermined bit group from among data words to be written on addressed memory cells.

Figure 3:
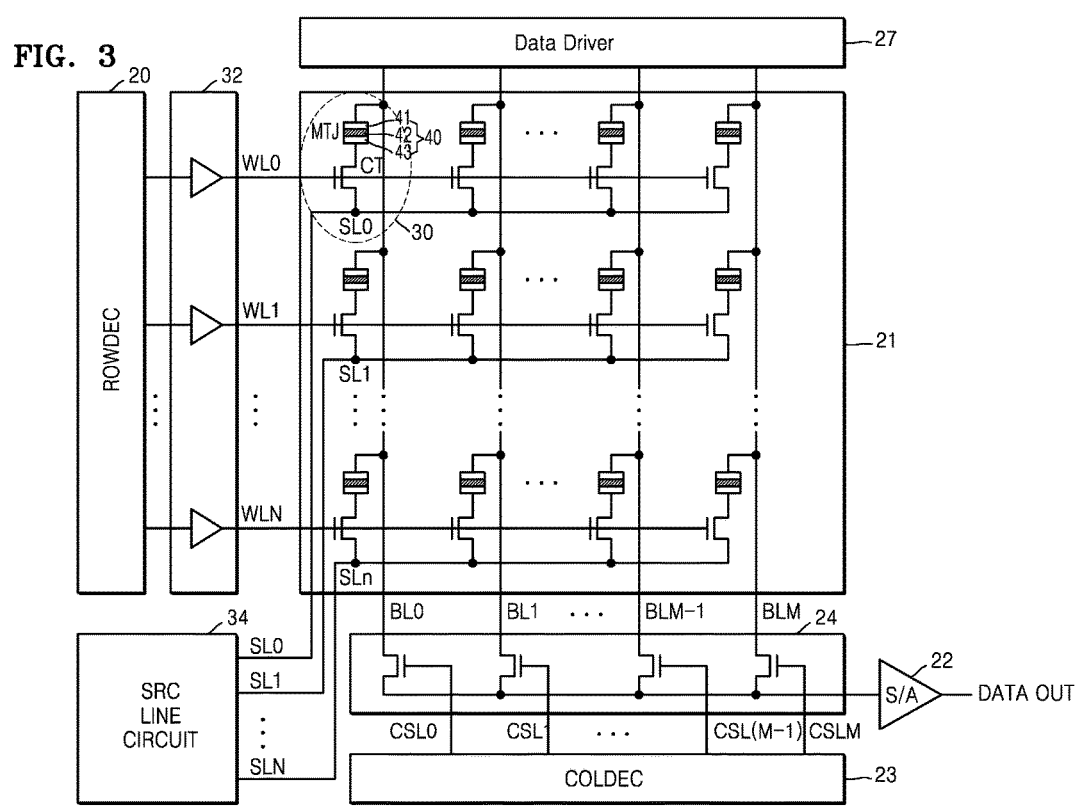
FIG. 3 is a diagram of an exemplary memory cell array in a memory bank of FIG. 2, according to one embodiment.

FIG. 3 is a diagram of an exemplary memory cell array in a memory bank 21 of FIG. 2, according to one embodiment.

Referring to FIG. 3, the memory bank 21 includes a plurality of word lines WL0 through WLN, wherein N is a natural number equal to or higher than 1, a plurality of bit lines BL0 through BLM, wherein M is a natural number equal to or higher than 1, a plurality of source lines SL0 through SLN and a plurality of memory cells 30 disposed at locations where the word lines WL0 through WLN and the bit lines BL0 through BLM cross each other. The memory cells 30 may be, for example an STT-MRAM cells. The memory cell 30 may include an MTJ device 40 having a magnetic material. The "N" used in connection with FIG. 3 is not necessarily the same number as the "N" used above in connection with FIG. 2.

A memory cell 30 may include a cell transistor CT and the MTJ device 40. In one memory cell 30, a drain of the cell transistor CT is connected to a pinned layer 43 of the MTJ device 40. A free layer 41 of the MTJ device 40 is connected to the bit line BL0, and a source of the cell transistor CT is connected to the source line SL0. A gate of the cell transistor CT is connected to the word line WL0.

The MTJ device 40 may be a resistive device, such as a phase change random access memory (PRAM) using a phase change material, a resistive random access memory (RRAM) using a variable resistance material, such as a complex metal oxide, or a magnetic random access memory (MRAM) using a magnetic material. Materials forming the resistive devices change a resistance value according to size and/or direction of a current or voltage, and have non-volatile features of maintaining the resistance value even when the current or voltage is blocked.

The word line WL0 is enabled by a row decoder 20 and is connected to a word line driver 32 driving a word line select voltage. The word line select voltage activates the word line WL0 so as to read or write a logic state of the MTJ device 40.

The source line SL0 is connected to a source line circuit 34. The source line circuit 34 receives an address signal and a read/write signal, and generates a source line select signal in the selected source line SL0 by decoding the address signal and the read/write signal. A ground reference voltage is provided to the unselected source lines SL1 through SLN.

The bit line BL0 is connected to a column select circuit 24 driven by column select signals CSL0 through CSLM. The column select signals CSL0 through CSLM are selected by a column decoder 23. For example, the selected column select signal CSL0 turns on a column select transistor in the column select circuit 24 and selects the bit line BL0. A logic state of the MTJ device 40 is read from the bit line BL0 through a sense amplifier 22. Alternatively, a write current applied through the data driver 27 is transmitted to the bit line BL0 and is written on the MTJ device 40.

Figure 4:
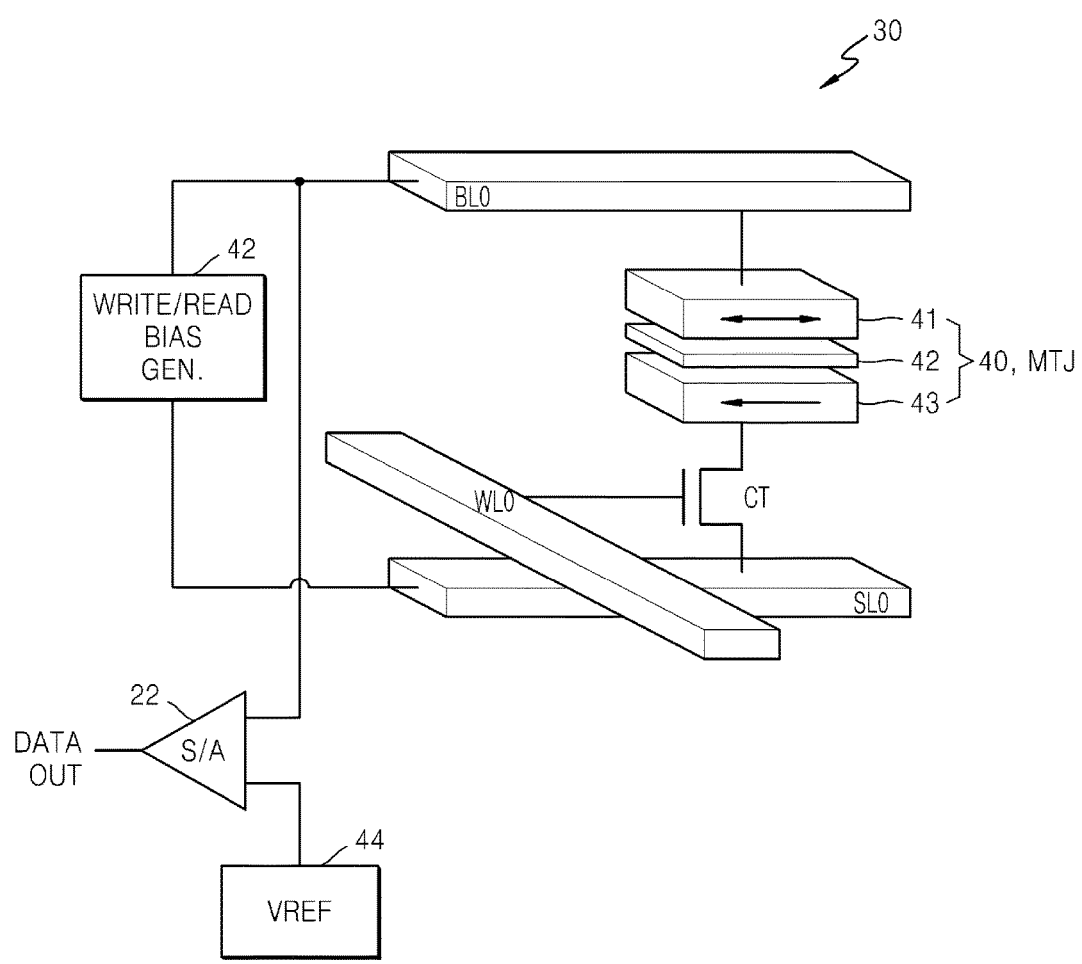
FIG. 4 is an exemplary stereogram of a memory cell of FIG. 3, according to one embodiment.

FIG. 4 is an exemplary stereogram of an STT-MRAM cell 30 of FIG. 3, according to one embodiment.

Referring to FIG. 4, the STT-MRAM cell 30 may include an MTJ device 40 and a cell transistor CT. A gate of the cell transistor CT is connected to a word line, for example, the word line WL0, and one electrode of the cell transistor CT is connected to a bit line, for example the bit line BL0, through the MTJ device 40. Another electrode of the cell transistor CT is connected to a source line, for example, the source line SL0.

The MTJ device 40 may include a free layer 41, a pinned layer 43, and a tunnel layer 42 therebetween. A magnetization direction of the pinned layer 43 is fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer (not shown) may be further included.

In order to perform a write operation of the STT-MRAM cell 30, a logic high voltage is applied to the word line WL0 to turn on the cell transistor CT. A program current, i.e., a write current, is applied to the bit line BL0 and the source line SL0. A direction of the write current is determined by a logic state to be programmed to the MTJ device 40.

In order to perform a read operation of the STT-MRAM cell 30, a logic high voltage is applied to the word line WL0 to turn on the cell transistor CT, and a read current is applied to the bit line BL0 and the source line SL0. Accordingly, a voltage is developed at two ends of the MTJ device 40, sensed by the sense amplifier 22, and compared with a reference voltage from a reference voltage generator 44 to determine a logic state of the MTJ device 40. Accordingly, data stored in the MTJ device 40 may be determined.

Figure 5A:
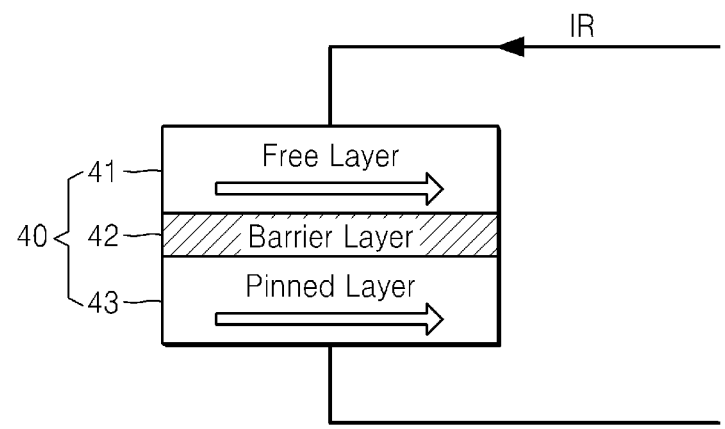
FIGS. 5A and 5B are exemplary diagrams for describing a magnetization direction according to data written on a magnetic tunnel function (MTJ) device of FIG. 4, according to one embodiment.
Figure 5B:
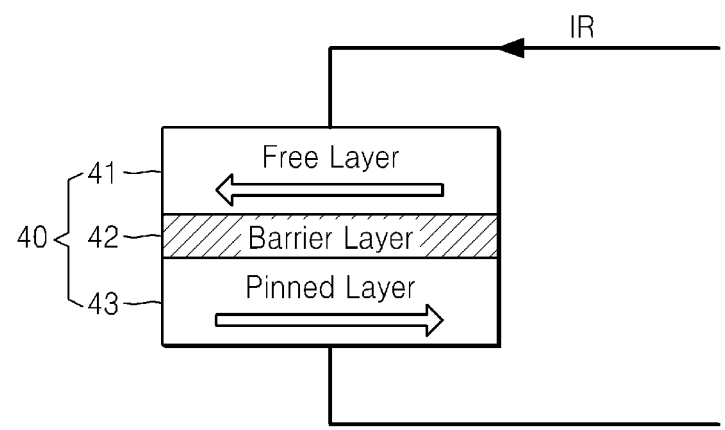

FIGS. 5A and 5B are diagrams for describing a magnetization direction according to data written on the MTJ device 40 of FIG. 4, according to certain exemplary embodiments. A resistance value of the MTJ device 40 varies according to the magnetization direction of the free layer 41. When a read current IR flows through the MTJ device 40, a data voltage according to the resistance value of the MTJ device 40 is output. Since the read current IR is much smaller than a write current, the magnetization direction of the free layer 41 is not changed by the read current IR.

Referring to FIG. 5A, the magnetization direction of the free layer 41 and the magnetization direction of the pinned layer 43 are parallel in the MTJ device 40. Accordingly, the MTJ device 40 has a low resistance value. Here, data "0" may be read.

Referring to FIG. 5B, the magnetization direction of the free layer 41 is anti-parallel to the magnetization direction of the pinned layer 43 in the MTJ device 40. Here, the MJT device 40 has a high resistance value. In this case, data "1" may be read.

In the current embodiment, the free and pinned layers 41 and 43 of the MTJ device 40 are shown as horizontal magnetic devices, but alternatively, the free and pinned layers 41 and 43 may be vertical magnetic devices.

Figure 6:
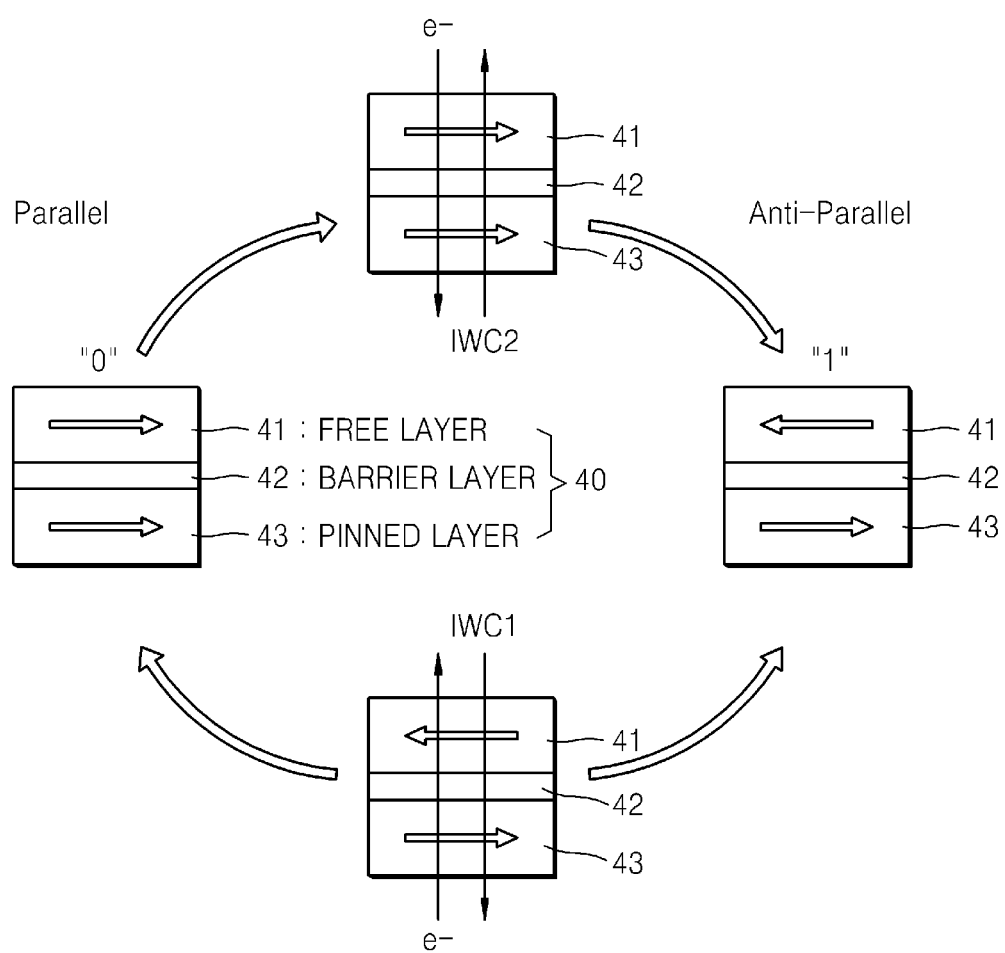
FIG. 6 is a diagram for describing an exemplary write operation of the STT-MRAM cell of FIG. 4, according to one embodiment.

FIG. 6 is a diagram for describing a write operation of the STT-MRAM cell 30 of FIG. 4, according to one exemplary embodiment.

Referring to FIG. 6, the magnetization direction of the free layer 41 may be determined based on a write current IW flowing through the MTJ device 40. For example, when a first write current IWC1 is applied from the free layer 41 to the pinned layer 43, free electrons having the same spin direction as the pinned layer 43 apply a torque on the free layer 41. Accordingly, the free layer 41 is magnetized parallel to the pinned layer 43.

When a second write current IWC2 is applied from the pinned layer 43 to the free layer 41, electrons having a spin opposite to the pinned layer 43 return back to the free layer 41 and apply a torque. Accordingly, the free layer 41 is magnetized anti-parallel to the pinned layer 43. In other words, the magnetization direction of the free layer 41 in the MTJ device 40 may be changed by STT.

Figure 7A:
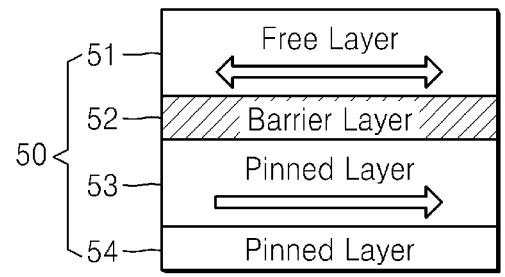
FIGS. 7A and 7B are diagrams for describing exemplary MTJ devices in the STT-MRAM cell of FIG. 4, according to certain embodiments.
Figure 7B:
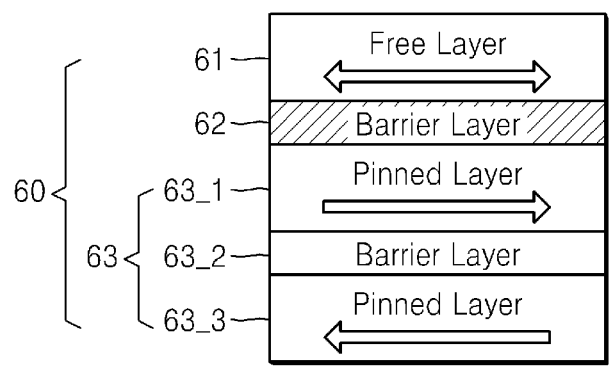

FIGS. 7A and 7B are diagrams for describing MTJ devices 50 and 60 in the STT-MRAM cell 30 of FIG. 4, according to exemplary embodiments.

Referring to FIG. 7A, the MTJ device 50 may include a free layer 51, a tunnel layer 52, a pinned layer 53, and an anti-ferromagnetic layer 54. The free layer 51 may include a material having a variable magnetization direction. The magnetization direction of the free layer 51 may change according to electric/magnetic factors provided outside and/or inside of a memory cell. The free layer 51 may include a ferromagnetic material including, for example, at least one of cobalt (Co), iron (Fe), and nickel (Ni). For example, the free layer 51 may include at least one selected from the group consisting of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The tunnel layer 52 may have a thickness that is smaller than a spin diffusion distance. The tunnel layer 52 may include a non-magnetic material. For example, the tunnel layer 52 may include at least one selected from the group consisting of magnesium (Mg), titanium (Ti), aluminum (Al), magnesium-zinc (MgZn), a magnesium-boron (MgB) oxide, a Ti nitride, and a vanadium (V) nitride.

The pinned layer 53 may have a magnetization direction fixed by the anti-ferromagnetic layer 54. Also, the pinned layer 53 may include a ferromagnetic material. For example, the pinned layer 53 may include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$.

The anti-ferromagnetic layer 54 may include an anti-ferromagnetic material. For example, the anti-ferromagnetic layer 54 may include at least one selected from the group consisting of PtMn, IrMn, MnO, MnS, MnTe, $MnF_2$, $FeCl_2$, FeO, $CoCl_2$, CoO, $NiCl_2$, NiO, and Cr.

Since the free layer 51 and the pinned layer 53 of the MTJ device 50 are each formed of a ferromagnetic material, a stray field may be generated at an edge of the ferromagnetic material. The stray field may decrease magnetoresistance or increase resistance magnetism of the free layer 51. Moreover, the stray field affects a switching characteristic, thereby forming asymmetrical switching. Accordingly, a unit for decreasing or controlling a stray field generated by the ferromagnetic material in the MTJ device 50 may be used.

Referring to FIG. 7B, a pinned layer 63 of the MTJ device 60 may be formed of a synthetic anti-ferromagnetic (SAF) material. The pinned layer 63 may include a first ferromagnetic layer 63_1, a barrier layer 63_2, and a second ferromagnetic layer 63_3. The first and second ferromagnetic layers 63_1 and 63_3 may each include at least one selected from the group consisting of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and $Y_3Fe_5O_{12}$. Here, a magnetization direction of the first ferromagnetic layer 63_1 and a magnetization direction of the second ferromagnetic layer 63_3 are different from each other, and are fixed. The barrier layer 63_2 may include, for example, Ru.

Figure 8:
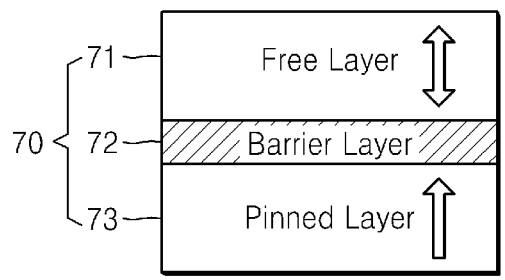
FIG. 8 is a diagram for describing an exemplary MTJ device in the STT-MRAM cell of FIG. 4, according to another embodiment.

FIG. 8 is a diagram for describing a MTJ device 70 in the STT-MRAM cell 30 of FIG. 4, according to another exemplary embodiment.

Referring to FIG. 8, a magnetization direction of the MTJ device 70 is vertical, and a moving direction of a current and a magnetization axis are substantially parallel to each other. The MTJ device 70 includes a free layer 71, a tunnel layer 72, and a pinned layer 73. A resistance value is small when the magnetization directions of the free layer 71 and pinned layer 73 are parallel, and is high when the magnetization directions of the free layer 71 and pinned layer 73 are anti-parallel. Data may be stored in the MTJ device 70 according to such a resistance value.

In order to realize the MTJ device 70 having a vertical magnetization direction, the free layer 71 and the pinned layer 73 may be formed of a material having high magnetic anisotrophy energy. Examples of the material having high magnetic anisotrophy energy include an amorphous rare earth raw material alloy, a thin film such as (Co/Pt)n or (Fe/Pt)n, and a superlattice material having an L10 crystalline structure. For example, the free layer 71 may be an ordered alloy, and may include at least any one of Fe, Co. Ni, palladium (Pa), and platinum (Pt). Alternatively, the free layer 71 may include at least any one of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. The alloys above may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$ in terms of quantitative chemistry.

The pinned layer 73 may be an ordered alloy, and may include at least any one of Fe, Co, Ni, Pa, and Pt. For example, the pinned layer 73 may include at least any one of a Fe—Pt alloy, a Fe—Pd alloy, a Co—Pd alloy, a Co—Pt alloy, a Fe—Ni—Pt alloy, a Co—Fe—Pt alloy, and a Co—Ni—Pt alloy. These alloys may be, for example, $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$, or $Co_{30}Ni_{20}Pt_{50}$ in terms of quantitative chemistry.

Figure 9A:
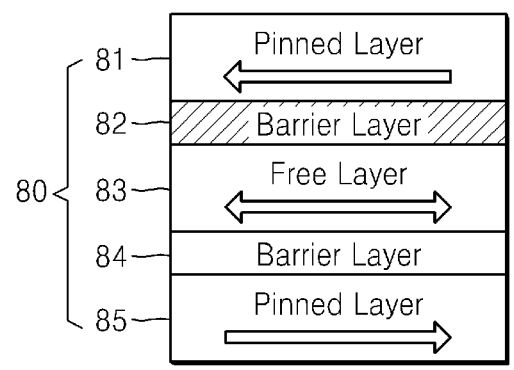
FIGS. 9A and 9B are diagrams for describing exemplary dual MTJ devices in the STT-MRAM cell of FIG. 4, according to other embodiments.
Figure 9B:
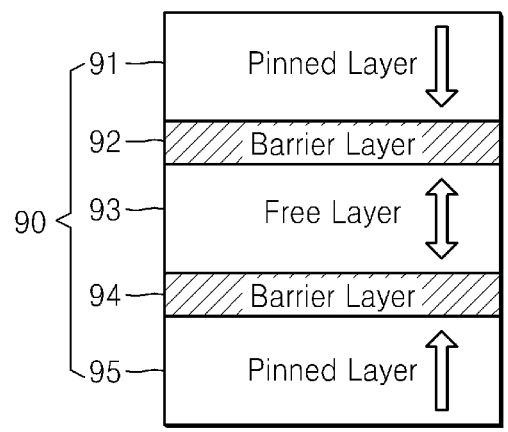

FIGS. 9A and 9B are diagrams for describing dual MTJ devices 80 and 90 in the STT-MRAM cell 30 of FIG. 4, according to other exemplary embodiments. A dual MTJ device has a structure wherein a tunnel layer and a pinned layer are disposed at two ends based on a free layer.

Referring to FIG. 9A, the dual MTJ device 80 forming horizontal magnetism may include a first pinned layer 81, a first tunnel layer 82, a free layer 83, a second tunnel layer 84, and a second pinned layer 85. Materials of the first and second pinned layers 81 and 85 are similar to that of the pinned layer 53 of FIG. 7A, materials of the first and second tunnel layers 82 and 84 are similar to that of the tunnel layer 52 of FIG. 7A, and a material of the free layer 83 is similar to that of the free layer 51 of FIG. 7A.

When magnetization directions of the first and second pinned layers 81 and 85 are fixed to opposite directions, magnetic forces by the first and second pinned layers 81 and 85 substantially counterbalance. Accordingly, the dual MTJ device 80 may perform a write operation by using a smaller current than a general MTJ device.

Since the dual MTJ device 80 provides higher resistance during a read operation by the second tunnel layer 84, an accurate data value may be obtained.

Referring to FIG. 9B, the dual MTJ device 90 forming vertical magnetism includes a first pinned layer 91, a first tunnel layer 92, a free layer 93, a second tunnel layer 94, and a second pinned layer 95. Materials of the first and second pinned layers 91 and 95 are similar to that of the pinned layer 73 of FIG. 8, materials of the first and second tunnel layers 92 and 94 are similar to that of the tunnel layer 72 of FIG. 8 and a material of the free layer 93 is similar to that of the free layer 71 of FIG. 7A.

Here, when magnetization directions of the first and second pinned layers 91 and 95 are fixed in opposite directions, magnetic forces by the first and second pinned layers 91 and 95 substantially counterbalance. Accordingly, the dual MTJ device 90 may perform a write operation by using a smaller current than a general MTJ device.

The MRAM 12 of FIG. 2 includes the mode register 15 capable of programming various functions, features, and modes for application flexibility. The mode register 15 may be programmed by a mode register set (MRS mode register signal) command that includes a mode register set code, or by user-defined variables.

The mode register 15 is divided into various fields in order to control various operational characteristics, according to functions and/or modes. Since not all mode register fields; in the mode register 15 have a defined default value, in one embodiment, contents of the mode register 15 are initialized. For example, data may be written after reset for a power-up and/or accurate operation. Also, contents of the register 15 may change due to a rerun of an MRS command during a normal operation.

In one embodiment, when a user selects to change the settings for a group of operational characteristics of an operational mode while maintaining the operational mode, only an address field in a mode register accessed when an MRS command was issued has to be reset. The MRS command and DLL reset do not affect array contents. The MRS commands and DLL reset are executable at anytime after power-up without affecting the array contents.

Figure 10:
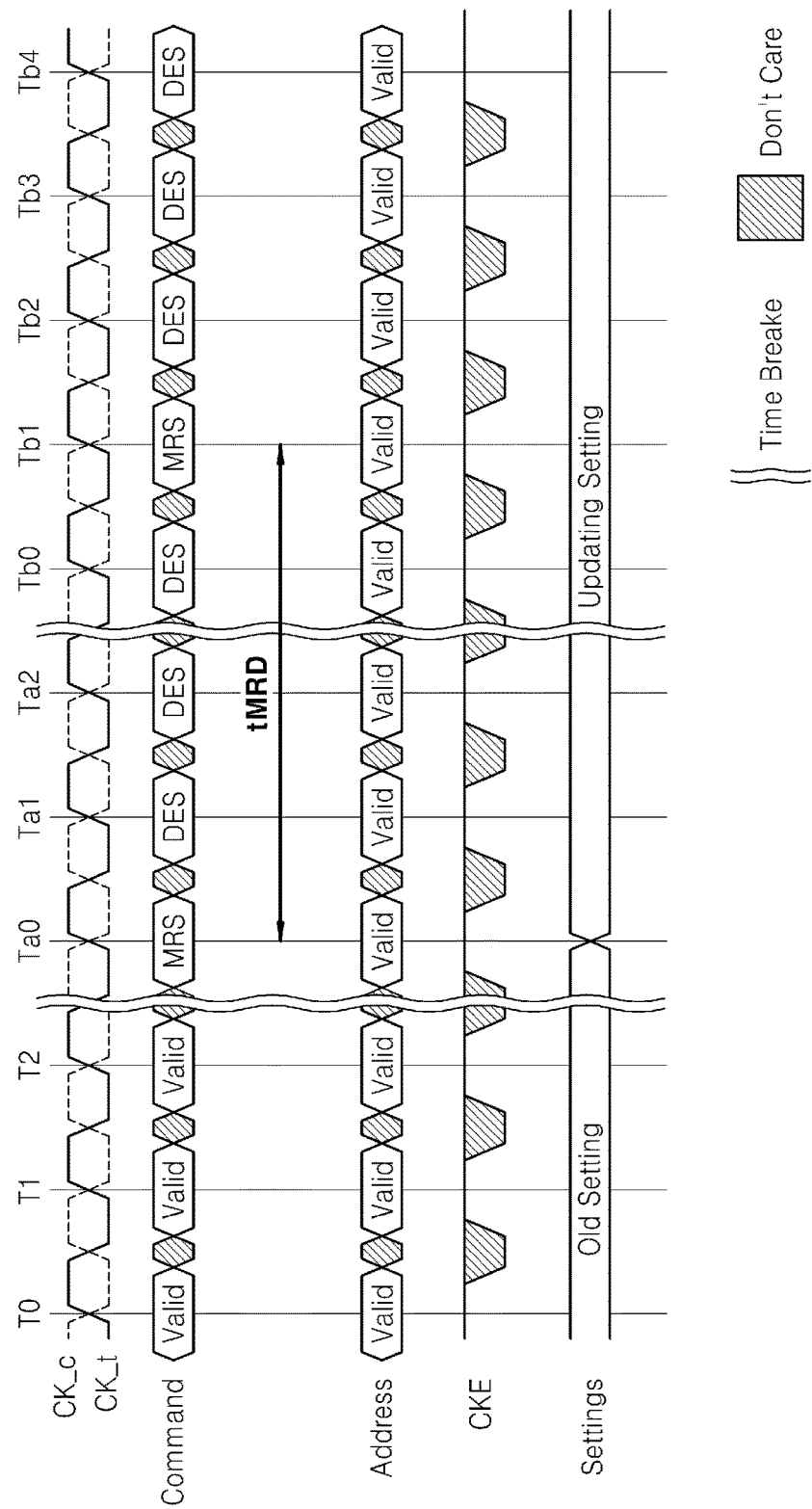
FIGS. 10 and 11 are exemplary mode register timing diagrams according to certain embodiments.

In order to complete a write operation in the mode register 15, an MRS command cycle time and a tMRD timing may be used. As shown in exemplary FIG. 10, the tMRD timing is the minimum time required between two MRS commands.

Some of the mode register settings affect address/command/control input functions. Here, a following MRS command may be allowed when a function updated by a current MRS command has been completed. Such a type of MRS command does not apply tMRD timing to a following MRS command. Examples of the MRS command include a gear down mode, a CA parity latency mode, a CS to command/address latency mode, a per MRAM addressing mode, a VrefDQ training value, a VrefDQ training mode, and a VrefDQ training range. Such command inputs have distinctive MR setting procedures.

Figure 11:
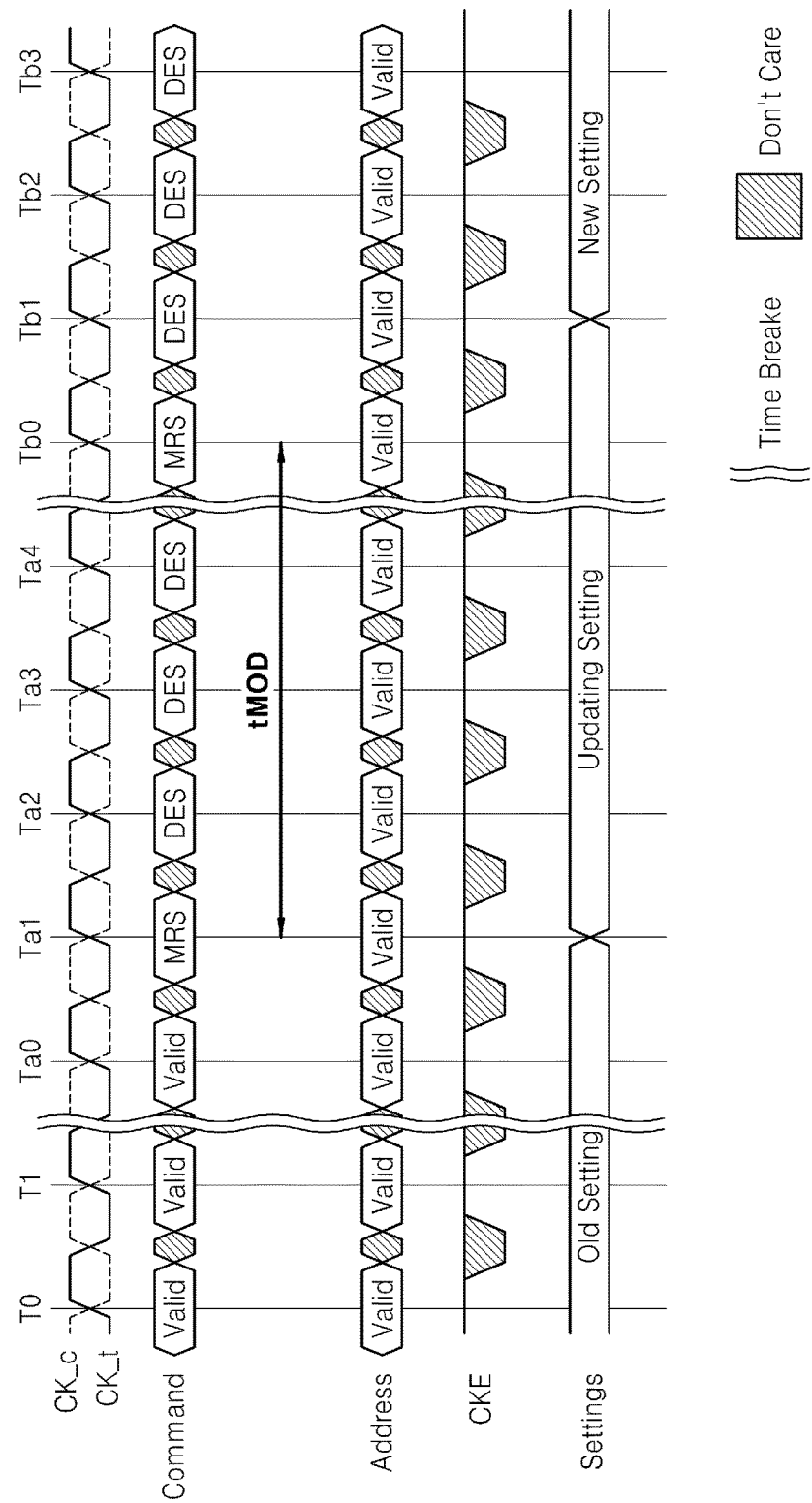

A tMOD timing is used between an MRS command and a non-MRS command so as to update features of an MRAM. As shown in exemplary FIG. 11, the tMOD timing is the minimum time required between the MRS command and the non-MRS command.

Data in a mode register may be changed by using the same command and timing conditions during a normal operation as long as an MRAM is in an idle state, e.g., as long as all banks are in a precharge state while satisfying a tRP timing, all data bursts are completed, and a clock enable signal CKE is high before writing in the mode register.

In the MRS command, when an RTT_NOM function was to be changed (enable-to-disable or vice versa), or is pre-enabled in an MRAM MR, an ODT signal must be "low" so as to guarantee that the RTT_NOM is in an off state before the MRS command affecting a turn-on and off timing of the RTT_NOM. The ODT signal may be stored in "high" after the tMOD timing. A state of the ODT signal does not matter when the RTT_NOM function is disabled in the mode register before and after the MRS command ("Don't Care).

Some of the mode register settings require a longer timing than the tMOD timing for a function update. Such a type of MRS command does not apply tMRD timing until a following effective command excluding DES. Examples of the MRS command include DLL enable, a VrefDQ training value, an internal Vref monitor, a VrefDQ training mode, a VrefDQ training range, a gear down mode, a per MRAM addressing mode, a maximum power saving mode, and a CA parity latency mode. Such command inputs have distinctive MR setting procedures.

FIGS. 12A through 18B are diagrams for describing mode register states MR0 through MR6 according to various exemplary embodiments. The mode register states MR0 through MR6 are implemented in the mode register 15. The mode register states MR0 through MR6 are used to program various functions, features, and modes of the MRAM 12. The mode register state MR0 will now be described with reference to FIGS. 12A through 12C.

Referring to FIG. 12A, the mode register state MR0 describes a first group of different settable operational characteristics, and bit assignments of each settable operational characteristic. The mode register state MR0 includes a 14-bit mode register set programmed to suitable bit values provided to the address bus of the MRAM 12. The 14 bits of the mode register MR0 are marked as A[13:0] corresponding to 14 bits applied to the address bus.

BG0 and BA1:BA0 bits are used to select the mode register state MR0 while programming values to the mode register set. As such, BG0 and BA1:BA0 comprise a set of predetermine bits that are used to select between different mode register states of the mode register 15. In one embodiment, the BG0 bit is a bank group signal and BA1:BA0 bits are a 2-bit bank address in a bank group. A bank group signal BG0, along with a bank group signal BG1, defines a bank group to which an active, read, write, or precharge command is applied. 3-bit BG0 and BA1:BA0 are applied with an A13:A0 address and the MRS command, and together may be referred to herein as a mode register set code (MRS code). The MRS code may be part of a command sent, for example, by a controller to the MRAM 12. The mode register state MR0 corresponds to a "000" bit value with respect to BG0 and BA1:BA0.

In the mode register state MR0, the mode register 15 stores data for controlling various operational characteristics of the MRAM 12. The mode register state MR0 controls a burst length, a read burst type, CL, a test mode, DLL reset, write recovery and read command-to-precharge command features, and DLL use during precharge power down.

A 2-bit A1:A0 is used to set a burst length (BL) regarding read and write operations of the MRAM 12. The BL determines the maximum number of column locations accessible with respect to a corresponding read or write command. "00" is programmed to A1:A0 bits for a fixed burst length of 8. "01" is programmed for BC4 or on the fly. BC4 denotes a burst length of 4 chopped based on the burst length of 8. On the fly means that the burst length may be adjusted to BC4 or BL8 based on a state of an address pin that is not used during an operation of the MRAM 12. "10" is programmed for fixed BC4. "11" is reserved.

1-bit A2 is used to set a read burst type (RBT) of the MRAM 12. A burst type defines an order of data provided by the MRAM 12 on a data terminal. When "0" is programmed to the A2 bit, a nibble sequential burst mode, wherein data is provided in a nibble sequential method, is set. When "1" is programmed in the A2 bit, an interleave burst mode, wherein data is provided in an interleaved method, is set.

A burst length, type, and order may be described as shown in FIG. 12B. In FIG. 12B, accesses in a given burst may be programmed in a sequential or interleaved order. The burst type is selected by a bit A3 of the mode register 15 in mode register state MR0. An access order in a burst is determined by a burst length, a burst type, and a start column address. The burst length is set by A1:A0 bits of the mode register 15 in mode register state MR0. Burst length options may include fixed BC4, fixed BL8, and on the fly.

Referring back to FIG. 12A, 4-bit A6:A4 and A2 are used to set CL of the MRAM 12. The CL is shown as the number of clock cycles (e.g., in the "CAS Latency" column). The CL defines a CAS Latency, for example, a clock cycle delay between a read command of the MRAM 12 and a first bit of effective output data.

In one embodiment, when "0000" is programmed to A6:A4 and A2 bits, CL of 9 is set. When "0001" is programmed, CL of 10 is set, when "0010" is programmed, CL of 11 is set, when "0011" is programmed, CL of 12 is set, when "0100" is programmed, CL of 13 is set, when "0101" is programmed, CL of 14 is set, when "0110" is programmed, CL of 15 is set, when "0111" is programmed, CL of 16 is set, when "1000" is programmed, CL of 18 is set, when "1001" is programmed, CL of 20 is set, when "1010" is programmed, CL of 22 is set, and when "1011" is programmed, CL of 24 is set. "1100" and "1101" are reserved.

1-bit A7 is used to set a test mode of the MRAM 12. When the A7 bit is programmed to "0", the MRAM 12 is set to a normal operating mode, and when the A7 bit is programmed to "1", an operation of a test mode is enabled.

1-bit A8 is used to provide a DLL reset feature of the MRAM 12. The DLL 29 of FIG. 2 is reset in response to "1" programmed in the A8 bit. Generally, after the A8 bit is programmed to "1" and the DLL 29 is reset, the A8 bit is automatically cleared to "0" so that the MRAM 12 returns to a normal operation mode.

3-bit A11:A9 is used to provide write recovery and read command-to-precharge (WR and RTP) features for automatic precharge of the MRAM 12. A write recovery time of the MRAM 12 is a time between when a final bit is recorded during an automatic precharge operation and when a next precharge operation of the MRAM 12 is performable. A memory controller may assign a write recovery time and a read-to-precharge time to predetermined time (ns) cycles so that a precharge operation automatically starts as soon as one operation is completed, e.g., so that an undesired delay is not generated.

When "000" is programmed to the A11:A9 bit, WR is set to 10 ns and RTP is set to 5 ns. When "001" is programmed, WR is set to 12 ns and RTP is set to 6 ns, when "010" is programmed, WR is set to 14 ns and RTP is set to 7 ns, when "011" is programmed, WR is set to 16 ns and RTP is set to 8 ns, when "100" is programmed, WR is set to 18 ns and RTP is set to 9 ns, when "101" is programmed, WR is set to 20 ns and RTP is set to 10 ns, and when "110" is programmed, WR is set to 24 ns and RTP is set to 12 ns. "111" is undetermined.

1-bit A12 is used to select DLL use during a precharge power down mode. When the A12 bit is programmed to "0", the DLL 29 of FIG. 2 is turned off (or frozen) after entering precharge power down for power saving, and DLL 29 requests to satisfy tXPDLL timing before a following effect command while exiting power down. The tXPDLL timing is a time from the precharge power down exit constituting frozen DLL to a command requesting locked DLL, and in one embodiment, is 10 nCK minimum. Accordingly, the tXPDLL timing is also referred to as a slow exit.

When the A12 bit is programmed to "1", the DLL 29 is maintained after entering precharge power down, and requests to satisfy tXP timing before a following effective command while exiting power down. The tXP timing is a time between the precharge power down exit constituting DLL on and another effective command, and in one embodiment, is 3 nCK minimum. Accordingly, the tXP timing is also referred to as a fast exit.

As discussed above, 3-bit BG0 and BA1:BA0 may be used to select mode register states. When "000" is programmed to the BG0 and BA1:BA0 bits, the mode register state MR0 is selected. When "001" is programmed, the mode register state MR1 is selected, when "010" is programmed, the mode register state MR2 is selected, when "011" is programmed, the mode register state MR3 is selected, when "100" is programmed, the mode register state MR4 is selected, when "101" is programmed, the mode register state MR5 is selected, and when "110" is programmed, the mode register state MR6 is selected. In one embodiment, "111" is ignored.

The BG1 and A13 bits of the mode register 15 in mode register state MR0 are reserved future usage (RFU), and are programmed to "0" during mode register setting.

FIG. 12C is a diagram for describing using of 3 bits of bank address BA2:BA0 instead of 3 bits of BG0 and BA1:BA0 of FIG. 12A to select mode register states, according to one exemplary embodiment.

Referring to FIG. 12C, when "000" is programmed to the BA2:BA0 bits, the mode register state MR0 is selected. When "001" is programmed, the mode register state MR1 is selected, when "010" is programmed, the mode register state MR2 is selected, when "011" is programmed, the mode register state MR3 is selected, when "100" is programmed, the mode register state MR4 is selected, when "101" is programmed, the mode register state MR5 is selected, and when "110" is programmed, the mode register state MR6 is selected. In one embodiment, "111" is ignored. In one embodiment, the BA3 bit of the mode register 15 is programmed to "0" during mode register setting.

Figure 13B:
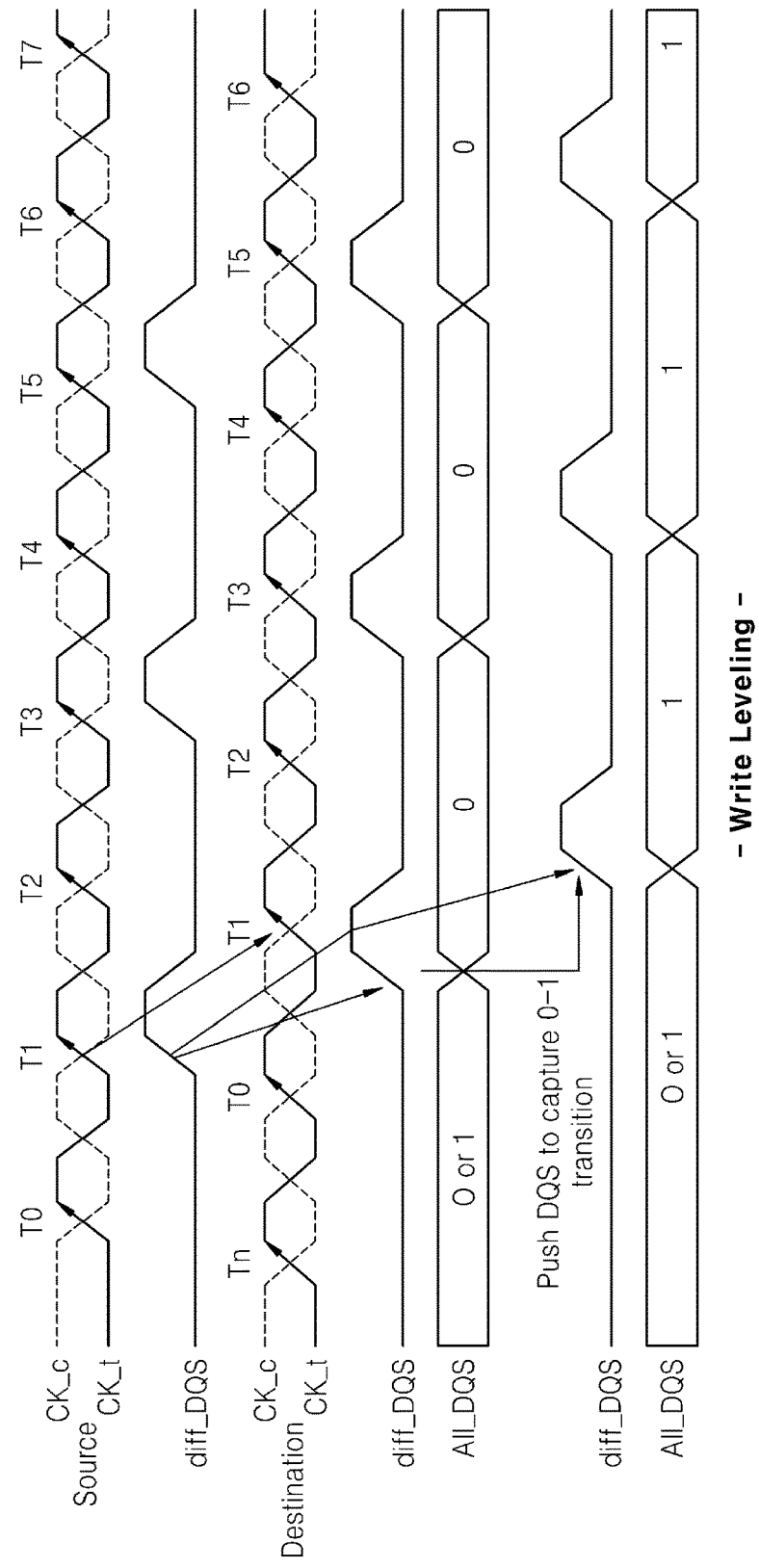
Figure 13C:
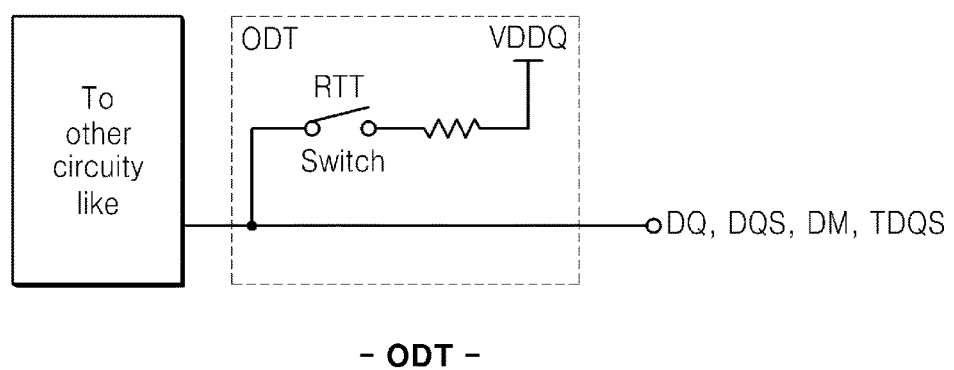

FIGS. 13A and 13C are exemplary diagrams for describing the mode register state MR1.

A second set of operational characteristics and bit assignments for each characteristic may be set for the mode register 15 for mode register state MR1, and are described with reference to FIG. 13A. The second set of operational characteristics and bit assignments may be different from those described above in connection with the first set. The mode register state MR1 is selected by a "001" bit value with respect to BG0 and BA1:BA0. The mode register 15 in the mode register state MR1 stores data for controlling DLL enable/disable of the MRAM 12, output drive strength, AL, write leveling enable/disable, TDQS enable/disable, and output buffer enable/disable.

1-bit A0 is used to select DLL enable or disable of the MRAM 12. The DLL 29 of FIG. 2 needs to be enabled for a normal operation. The DLL 29 needs to be enabled for the MRAM 12 to return to the normal operation during power-up initialization and after DLL disable. During the normal operation, "1" is programmed to the A0 bit.

2-bit A2:A1 is used for output driver impedance control (ODIC) of the MRAM 12. When "00" is programmed to the A2:A1 bits, output driver impedance is controlled to RZQ/7. RZQ may be set, for example, to 240Ω. When "01" is programmed, the output driver impedance is controlled to RZQ/5. "10" and "11" are reserved.

2-bit A4:A3 is used to select an AL of the MRAM 12. An AL operation is supported for effective command and data bus with respect to a sustainable bandwidth. During the AL operation, a read or write command (with or without auto-precharge) may be immediately issued after an active command. Read latency (RL) is controlled based on a sum of AL and CL register settings. WL is controlled based on a sum of AL and CWL register settings.

When "00" is programmed to the A4:A3 bit, AL0, i.e., AL disable is set. When "01" is programmed, CL-1 is set, and when "10" is programmed, CL-2 is set. In one embodiment, "11" is reserved.

1-bit A7 is used to provide a write leveling (level) feature of the MRAM 12. For better signal integrity, an MRAM memory module employs fly-by topology with respect to commands, addresses, control signals, and clocks. The fly-by topology reduces the number and length of stubs.

However, the fly-by topology generates a flight time skew between a clock and a strobe in a memory module, for example, all MRAM on DIMM. Thus, it is difficult for a memory controller to follow tDQSS, tDSS, and tDSH timing regulations. The write leveling feature allows the memory controller to compensate for a skew. The tDQSS timing is a time from a DQS_t-DQS_c rising edge to a CK_t-CK_c rising edge, the tDSS timing is a time from a DQS_t-DQS_c falling edge setup time to a CK_t-CK_c rising edge, and the tDSH timing is a time from a DQS_t-DQS_c falling edge hold time to a CK_t-CK_c rising edge.

The memory controller may use the write leveling feature, and may be fed back from an MRAM to adjust a DQS_t-DQS_c to CK_t-CK_c relationship. The memory controller including leveling has an adjustable delay setting in DQS_t-DQS_c so as to align the DQS_t-DQS_c rising edge and a DQS_t-DQS_c rising edge in an MRAM pin. The MRAM feeds back CK_t-CK_c sampled at the DQS_t-DQS_c rising edge through a DQ bus. The memory controller repeatedly delays DQS_t-DQS_c until transition from "0" to "1" is detected on the DQ bus. Accordingly, the tDQSS, tDSS, and tDSH timing regulations are guaranteed. FIG. 13B shows a conceptual timing of such a write leveling operation.

Referring back to FIG. 13A, 3-bit A10:A8 is used to provide an ODT feature. The ODT feature allows the memory controller to independently change terminal resistance of DQ, DQS_t, DQS_c, and DM_n of the MRAM 12, so as to improve signal integrity of a memory channel. As shown in FIG. 13C, a switch is enabled by an external ODT pin, mode register setting, and other control information.

The MRAM 12 may provide various on-die termination features (RTT_NOM, RTT_WR, and RTT_PARK). A value of nominal termination (RTT_NOM) or park termination (RTT_PARK) is selected during an operation without a command, whereas a value of dynamic termination (RTT_WR) is selected when a write command is registered. A dynamic termination feature is provided by the mode register MR2. RTT_PRAK feature is provided by the mode register MR5. RTT_NOM is turned on when an ODT signal is high.

When the A10:A8 bits are programmed to "000", RTT_NOM is disabled. When "001" is programmed, RTT_NOM is preselected as RZQ/4. RZQ may be set to, for example, 240Ω. When "010" is programmed, RTT_NOM is preselected as RZQ/2, when a value "011" is programmed, RTT_NOM is preselected as RZQ/6, when "100" is programmed, RTT_NOM is preselected as RZQ/1, when "101" is programmed, RTT_NOM is preselected as RZQ/5, when "110" is programmed, RTT_NOM is preselected as RZQ/3, and when "111" is programmed, RTT_NOM is preselected as RZQ/7.

1-bit A11 is used to provide a termination data strobe (TDQS) function of the MRAM 12. TDQS provides additional termination resistance outputs usable in a certain system structure. TDQS corresponds only to X8 MRAM. When the A11 bit is programmed to "0", TDQ is disabled, DM/DBI/TDQS provides a DM function, and TDQS_c is not used. X4/X16 disables the TDQS function by setting the A11 bit of the mode register 15 in mode register state MR1 to "0". When the A11 bit is programmed to "1", TDQ is enabled and the MRAM 12 enables a same termination resistance function applied to the DQS_t/DQS_c in a TDQS_t/TDQS_c terminal.

1-bit A12 is used to provide an output buffer enable or disable (Qoff) function of the MRAM 12. When the A12 bit is programmed to "0", output buffers are enabled. When the A12 bit is programmed to "1", the output buffers are disabled. Accordingly, DQs, DQS_ts, and DQS_c outputs are also disabled.

BG1, A13, A6, and A5 bits of the mode register state MR1 are RFU, and are programmed to "0" during mode register setting.

Figure 14A:
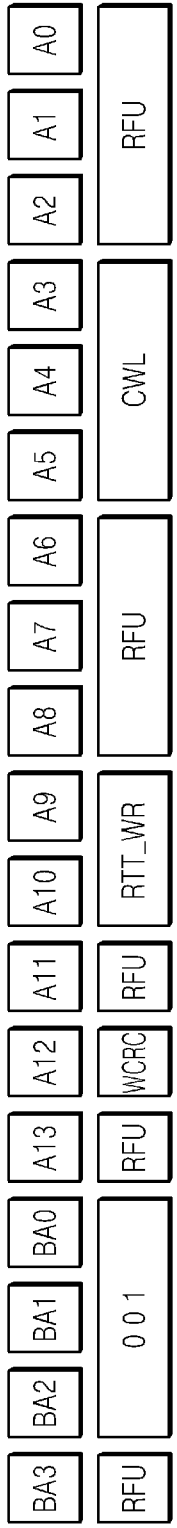

FIGS. 14A and 14E are diagrams for describing the mode register state MR2, according to an exemplary embodiment.

A third set of operational characteristics and bit assignments for each characteristic may be set for the mode register 15 for mode register state MR2, as described with reference to FIG. 14A. The third set of operational characteristics and bit assignments may be different from those described above in connection with the previously described sets. The mode register 15 in mode register state MR2 stores data for controlling CWL, dynamic termination, and write CRC.

3-bit A5:A3 is used to provide a CWL function. CWL defines a CAS write latency, for example, a clock cycle delay between an internal write command and a first bit of effective input data. Whole latency (WL) is a sum of (AL) and CWL, i.e., WL=AL+CWL.

When "000" is programmed to the A5:A3 bits, CWL 9 is set during an operation of a data rate 1600 MT/s. When "001" is programmed, CWL 10 is set during an operation of a data rate 1867 MT/s. When "010" is programmed, CWL 11 is set during an operation of a data rate 1600 or 2133 MT/s. When "011" is programmed, CWL 12 is set during an operation of a data rate 1867 or 2400 MT/s. When "100" is programmed, CWL 14 is set during an operation of a data rate 2133 MT/s. When "101" is programmed, CWL 16 is set during an operation of a data rate 2400 MT/s. When "110" is programmed, CWL 18 is set. "111" is unsettled.

2-bit A10:A9 is used to provide a dynamic termination (RTT_WR) feature of the MRAM 12. A dynamic ODT may be provided to further strengthen signal integrity on a data bus, in a certain application of the MRAM 12. When "00" is programmed to the A10:A9 bits, dynamic ODT off is set. When "01" is programmed, dynamic ODT is set to RZQ/2, when "10" is programmed, dynamic ODT is set to RZQ/1, and when "11" is programmed, dynamic ODT is set to high impedance (Hi-Z). Dynamic termination (RTT_WR) may apply a dynamic ODT value during writing even when nominal termination (RTT_NOM) is disabled.

1-bit A12 is used to provide a write CRC function of the MRAM 12. A CRC function is used to detect an error by also transmitting CRC data obtained via CRC calculation, so as to prevent loss of data transmitted between the MRAM 12 and the memory controller 11. The CRC calculation of the MRAM 12 may use a polynomial expression $x8+x2+x+1$ 9. When the A12 bit is programmed to "0", the write CRC calculation is disabled. When the A12 bit is programmed to "1", the write CRC calculation is enabled. FIGS. 14B through 14D are diagrams for describing various exemplary CRC data bit mappings.

FIG. 14B is an exemplary diagram for describing CRC data bit mapping in X8 MRAM. It is assumed that the MRAM 12 has 8 DQ pins and a burst length of 8. As a result, it is assumed that 64-bit data is input through one write command. In the 64-bit data, 8-bit data of a first burst is input through the 8 DQ pins, 8-bit data of a second burst is input through the 8 DQ pins, and then 8-bit data of a third burst is input through the 8 DQ pins. In other words, 8-bit data is input to each of the first through eighth bursts.

The CRC data bit mapping of FIG. 14B is configured such that bits of data of each burst are respectively input through pins, and CRC data is input through a DQ pin. First through $64^{th}$ data bits d0 through d63 are input through one write command.

A first DQ pin DQ0 may sequentially input the first through eighth data bits d0 through d7 to the first through eighth bursts, input a first CRC bit CRC0 to the ninth burst, and input predetermined logic high 1 to the tenth burst. A second DQ pin DQ1 may sequentially input the $9^{th}$ through $16^{th}$ data bits d9 through d15 to the first through eighth bursts, input a second CRC bit CRC1 to the ninth burst, and the predetermined logic high 1 to the tenth burst. In the same manner, a kth DQ pin DQ(k−1) may sequentially input 8(k−1)+1-th through 8k-th data bits d(k−1) through d8 (8k−1) to the first through $8^{th}$ bursts, and input k-th CRC bit CRC(k−1) to the ninth burst, and input the predetermined logic high 1 to the tenth burst.

A DBI pin may sequentially input first through $8^{th}$ DBI bits d64 through d71 to corresponding first through $8^{th}$ bursts, and input the predetermined logic high 1 to the ninth and tenth bursts.

FIG. 14C is an exemplary diagram for describing CRC data bit mapping in X4 MRAM. In the X4 MRAM, CRC data bit mapping is performed without using a DBI pin. It is assumed that the MRAM 12 has 4 DQ pins and a burst length of 8. In other words, it is assumed that 32-bit data is input through one write command. The 32-bit data is output as 4-bit data of a first burst is input through the 4 DQ pins, 4-bit data of a second burst is input through the 4 DQ pins, and then 4-bit data of a third burst is input through the 4 DQ pins. As a result, 4-bit data is input to the first through eighth bursts.

Referring to FIG. 14C, the first DQ pin DQ0 may sequentially input first through $8^{th}$ data bits d0 through d7 to the first through $8^{th}$ bursts, input the first CRC bit CRC0 to the $9^{th}$ burst, and input a fifth CRC bit CRC4 to the $10^{th}$ burst. The second DQ pin DQ1 may sequentially input $9^{th}$ through $16^{th}$ data bits d8 through d15 to the first through $8^{th}$ bursts, input the second CRC bit CRC1 to the $9^{th}$ burst, and input a sixth CRC bit CRC5 to the $10^{th}$ burst. The third DQ pin DQ2 may sequentially input $17^{th}$ through $24^{th}$ data bits d16 through d23 to the 1st through $8^{th}$ bursts, input a third CRC bit CRC2 to the $9^{th}$ burst, and a seventh CRC bit CRC6 to the $10^{th}$ burst. The fourth DQ pin DQ3 may sequentially input $25^{th}$ through $32^{nd}$ data bits d24 through d31 to the $1^{st}$ through $8^{th}$ bursts, input a $4^{th}$ CRC bit CRC3 to the $9^{th}$ burst, and input $8^{th}$ CRC bit CRC7 to the $10^{th}$ burst.

FIG. 14D is an exemplary diagram for describing CRC data bit mapping in an X16 MRAM.

Referring to FIG. 14D, the CRC data bit mapping is configured such that data bits of each burst are input through each pin, and CRC data is input through a DQ pin. $1^{st}$ through $128^{th}$ data bits d0 through d63 and d72 through d135 are input through one write command.

The 1st through $64^{th}$ data bits d0 through d63, the 1st through $8^{th}$ DBI bits d64 through d71 corresponding thereto, and the 1st through $8^{th}$ CRC bits CRC0 through CRC7 calculated from the $1^{st}$ through $64^{th}$ data bits d0 through d63 are input through the $1^{st}$ through $8^{th}$ DQ pins DQ0 through DQ7 and a first DBI pin LDBI.

Similarly, the $65^{th}$ through $128^{th}$ data bits d72 through d135, the $9^{th}$ through $16^{th}$ DBI bits d136 through d143 corresponding thereto, and the $9^{th}$ through $16^{th}$ CRC bits CRC8 through CRC15 calculated from the $65^{th}$ through $128^{th}$ data bits d72 through d135 are input through the $9^{th}$ through $16^{th}$ DQ pins DQ8 through DQ15 and a second DBI pin UDBI.

A DBI function and a CRC function are independently performed on the 1st through $64^{th}$ data bits d0 through d63, and the DBI function and the CRC function are independently performed on the $65^{th}$ through $128^{th}$ data bits d72 through d135.

FIG. 14E is an exemplary diagram for describing CRC data bit mapping to which CRC data is input through a separate EDC pin in an X8 MRAM.

Referring to FIG. 14E, the first DQ pin DQ0 is configured to sequentially input the 1st through $8^{th}$ data bits d0 through d7 to the $1^{st}$ through $8^{th}$ bursts. The second DQ pin DQ1 is configured to sequentially input the $9^{th}$ through $16^{th}$ data bits d8 through d15 to the $1^{st}$ through $8^{th}$ bursts. Similarly, the k-th DQ pin DQ(k−1) is configured to sequentially input the 8(k−1)+1-th through 8k-th data bits d(k−1) through d8 (8k−1) to the 1st through $8^{th}$ bursts.

The DBI pin is configured to sequentially input the 1st through $8^{th}$ DBI bits d64 through d71 to the first through $8^{th}$ bursts. The EDC pin is configured to sequentially input the 1st through $8^{th}$ CRC bits CRC0 through CRC7 to the first through $8^{th}$ bursts. BG1, A13, A11, A8:A6, and A2:A0 bits of the mode register MR2 are RFU, and are programmed to "0" during mode register setting.

FIGS. 15A through 15G are diagrams for describing the mode register state MR3, in accordance with one exemplary embodiment.

A fourth set of operational characteristics and bit assignments for each characteristic may be set for the mode register 15 for mode register state MR3, as described with reference to FIG. 15A. The fourth set of operational characteristics and bit assignments may be different from those described above in connection with the previously described sets. In one embodiment, the mode register state MR3 is selected by "011" bit value with respect to BG0 and BA1:BA0. The mode register 15 in mode register state MR3 stores data for controlling MPR location function (MPRL), MPR operation function, gear down mode, per MRAM addressing mode, and MPR read format of the MRAM 12.

2-bit A1:A0 is used to provide an MPRL function, and 1-bit A2 is used to provide an MPR operation (MPRO) function. An MPRO function is used to read a predetermined system timing calibration bit sequence.

In order to enable MPR, an MRS command is issued with a bit A2=1 of the mode register 15 as shown in FIG. 15A. Before issuing the MRS command, all banks are precharged and are in an idle state satisfying a tRP timing. The tRP timing shows a precharge command section. When MPR is enabled, a following RD or RDA command is redirected to MPR. The RD command is a read command of pinned BL8 or BC4, and the RDA command is a read command of pinned BL8 or BC4 with auto precharge.

Figures 15B, 15C:
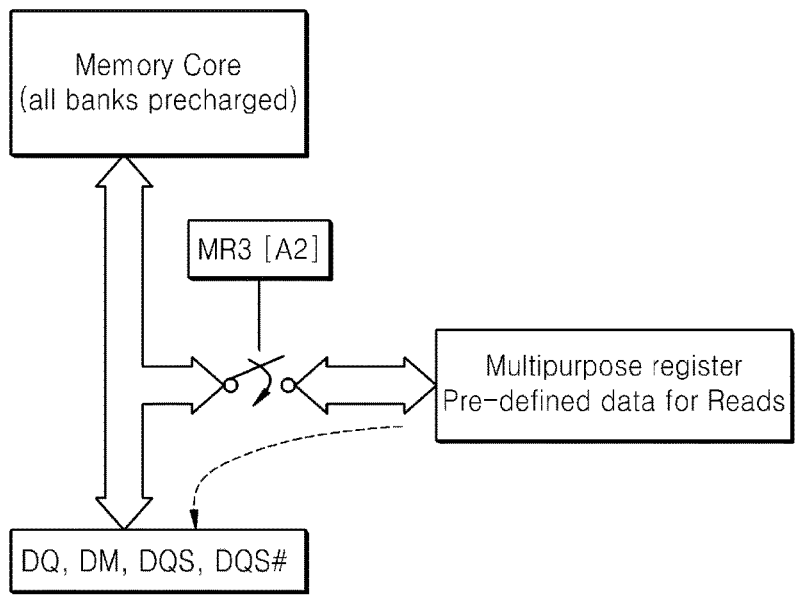

When "0" is programmed to the A2 bit, as shown in FIG. 15C, a normal operation is performed without an MPR mutual operation regardless of the value of A1:A0 bit. In other words, all following read operations are issued from an MRAM array, and all following write operations are performed on the MRAM array. When "1" is programmed to the A2 bit, MPR is enabled, and the RD or DRA command is performed in a data format defined by the value of A1:A0 bit.

When "00" is programmed to the A1:A0 bit, MPR page 0 is selected. MPR page 0 stores a training pattern during read/write. When "01" is programmed, MPR page 1 is selected, when "19" is programmed, MPR page 2 is selected, and when "11" is programmed, MPR page 3 is selected. MPR page 1 stores a CA parity error log, MPR page 2 stores MRS read data, and MPR page 3 is an RFU. MPR page 0 through MPR page 3 may be stored in a data format shown in FIG. 15D.

Referring back to FIG. 15A, 1-bit A3 is used to control the gear down mode (GD) of the MRAM 12. When "0" is programmed to the A3 bit, a gear down 1/2 rate (1N) clock mode is set. When "1" is programmed to the A3 bit, a gear down 1/4 rate (2N) clock mode is set. The MRAM 12 has a 1/2 rate (1N) clock mode as a default. A 1N clock mode is used for an MRS command of low frequency, and a 2N clock mode is used for a normal operation.

1-bit A4 is used to control a PDA mode. The PDA mode may be used to program different ODT or Vref values to MRAMs in one rank. When "0" is programmed to the A4 bit, the PDA mode is disabled. When "1" is programmed to the A4 bit, the PDA mode is enabled.

2-bit A10:A9 is used to control write command latency (WCL) of the MRAM 12. The WCL delays a command transmitted to a command buffer by a predetermined clock cycle nCK when both CRC and DM are enabled.

When "00" is programmed to the A10:A9 bit, WCL is set to 4 nCK in a data rate 1600 MT/s operation. When "01" is programmed to the A10:A9 bit, WCL is set to 5 nCK in a data rate 1866, 2133, or 2400 MT/s operation. When "10" is programmed to the A10:A9 bit, WCL is set to 6 nCK and a data rate is unsettled. "11" of the A10:A9 bit is unsettled.

2-bit A12:A11 is used to control a mode register read (MPRRF) mode of the MRAM 12. The MPRRF mode is enabled with A3=1 of the mode register 15 in the mode register state MR3, and reads data stored in a certain mode register state. The certain mode register state is specified by BG1, BG0, BA1, and BA0 addresses applied with a read command. For example, in one embodiment, mode register states are specified by 0000=MR0, 0001=MR1, etc. A memory controller may repeatedly read a mode register in the same state.

When "00" is programmed to the A12:A11 bit, the certain mode register state is set to serial data return. Serial data return means that same patterns are returned to all DQ lanes. In the serial return, when read data of MPR0 is used for all DQ lanes, MPR1, MPR2, and MPR3 are not read. For example, when a program pattern in MPR0 is MPRL[7:0] =0111 1111, the program pattern is serially read to DQ lanes U17-0 as shown in FIG. 15E.

When "01" is programmed to the A12:A11 bit, parallel data return is set. In parallel data return, MPR0 data is returned to a first UI and then repeated in remaining UI of a burst. When read data of MPR0 is used for all DQ lanes, MPR1, MPR2, and MPR3 are not read. For example, when a program pattern in MPR0 is MPRL[7:0]=0111 1111, the program pattern is read in parallel to DQ lines U17-0 as shown in FIG. 15F.

When "10" is programmed to the A12:A11 bit, stagger data return is set. In stagger data return, different MPR registers are returned to DQ lanes after a read command on a certain MPR is issued. For example, data of MPR1 is returned to DQ0 by a read command on MPR1, data of MPR2 is returned to DQ1, and reading is performed as shown in FIG. 15G.

BG1, A13, and A8:A5 bits of the mode register 15 in mode register state MR3 are RFU, and are programmed to "0" during mode register setting.

FIGS. 16A through 16K are diagrams for describing the mode register state MR4, according to one exemplary embodiment.

A fifth set of operational characteristics and bit assignments for each characteristic may be set for the mode register 15 for mode register state MR4, as described with reference to FIG. 16A. The fifth set of operational characteristics and bit assignments may be different from those described above in connection with the previously described sets. In one embodiment, the mode register state MR4 is selected by a "100" bit value with respect to BG0 and BA1:BA0. The mode register 15 in mode register state MR4 stores data for controlling a power down mode, Vref monitoring, a CS-to-command/address latency mode, an RPT mode, a read preamble function, and a write preamble function of the MRAM 12.

1-bit A1 is used to provide a maximum power down mode of the MRAM 12. The maximum power down mode provides a lowest power consumption mode of the MRAM 12. When "0" is programmed to the A1 bit, the maximum power down mode is disabled. When "1" is programmed to the A1 bit, the maximum power down mode is enabled.

Figure 16B:
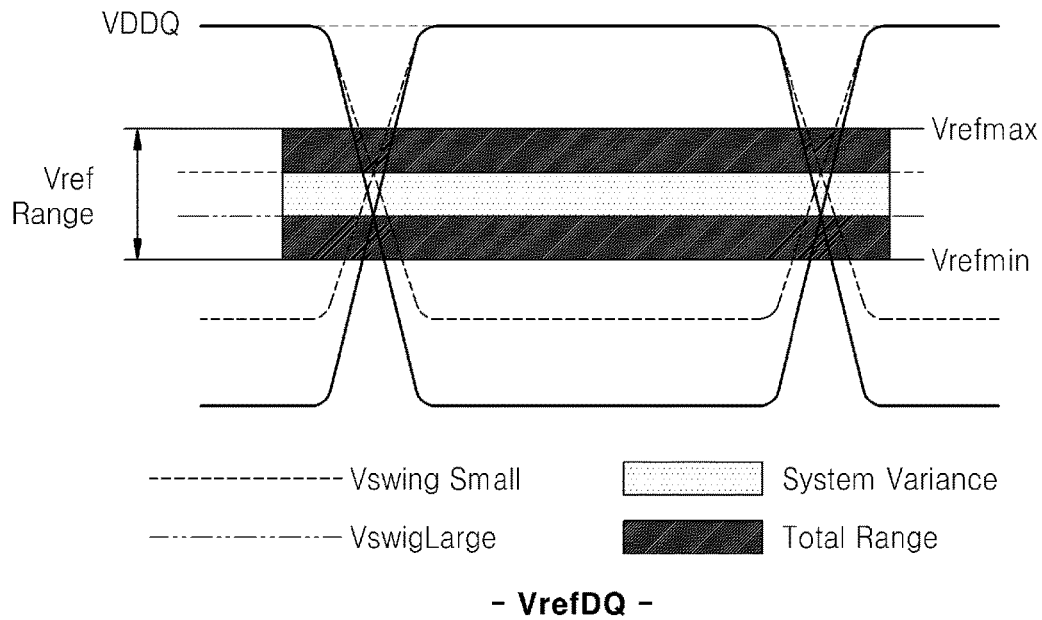

1-bit A4 is used to provide an internal Vref monitoring function of the MRAM 12. Inner DQ Vref parameters of the MRAM 12 include an operation voltage range, a step size, a Vref step time, an Vref full step time, and a Vref effective level. The Vref operation voltage range is the minimum range required in a Vref setting range. The minimum range is defined by Vrefmax and Vrefmin, as shown in FIG. 16B.

Figure 16C:
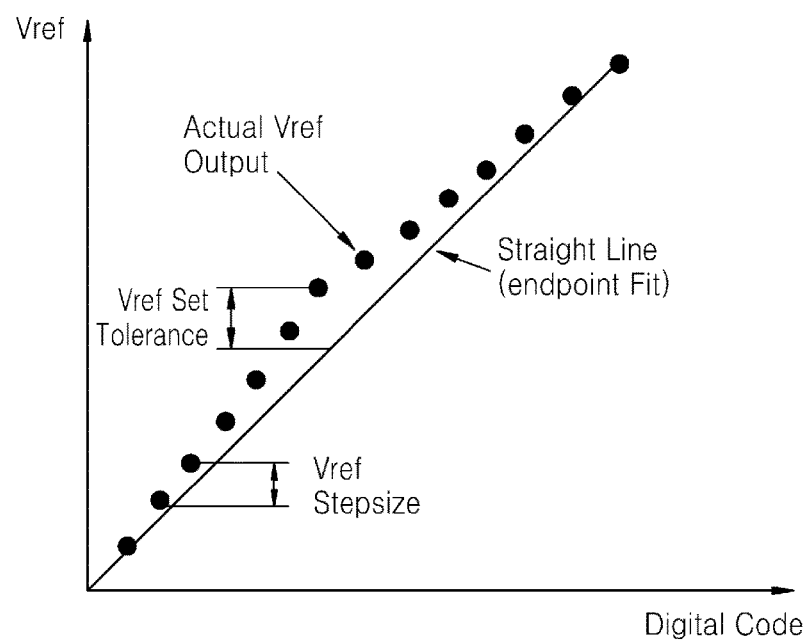

As shown in FIG. 16C, the Vref step size denotes an interval between adjacent steps, and Vref set tolerance denotes fluctuation between Vref and an ideal setting.

When "0" is programmed to the A4 bit, an internal DQ Vref parameter monitoring of the MRAM 12 is disabled. When "1" is programmed to the A4 bit, the internal DQ Vref parameter monitoring is enabled.

3-bit A8:A6 is used to control a command address latency (CAL) function of the MRAM 12. The MRAM 12 has a power saving feature by supporting CAL. As shown in FIG. 16D, CAL is a clock cycle delay (tCAL) between a command and an address in CS_n set by MRS. After issuing a command, the CAL may have a clock cycle time nCK where CMD/ADDR receivers of an MRAM are enabled. Once a command and an address are latched, the CMD/ADDR receivers are disabled. Regarding continuous commands of FIG. 16E, the MRAM 12 may maintain enabled receivers for a command sequence.

When "000" is programmed to the A8:A6 bit, CAL is disabled. When "001" is programmed to the A8:A6 bit, CAL is set to 3 clock cycles, when "010" is programmed, CAL is set to 4 clock cycles, when "011" is programmed CAL is set to 5 clock cycles when "100" is programmed, CAL is set to 6 clock cycles, and when "101" is programmed, CAL is set to 8 clock cycles. "110" and "111" are unsettled.

1-bit a10 is used to provide an RPT function of the MRAM 12. The MRAM 12 supports a programmable read preamble. When "0" is programmed to the A10 bit, the RPT is disabled, and when "1" is programmed, the RPT is enabled.

Figure 16F:
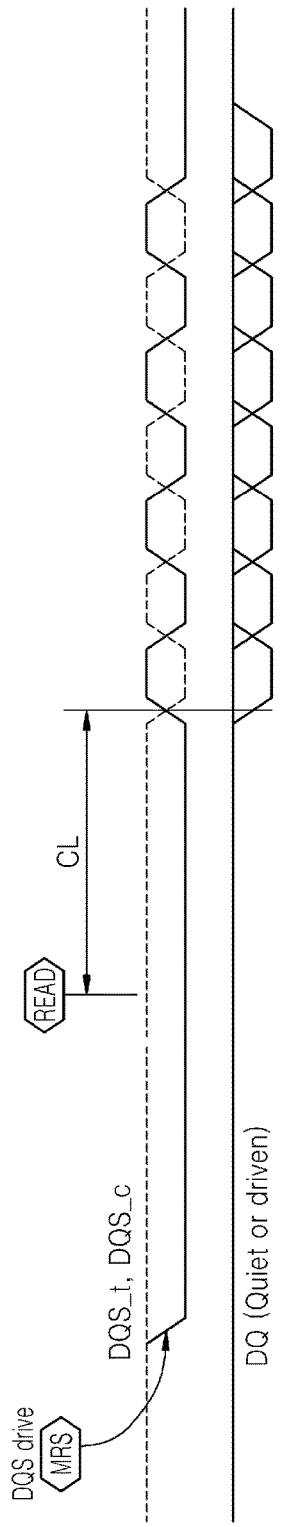

The RPT trains DQS_t/DQS_c read preamble for read leveling where a memory controller compensates for a skew. As shown in FIG. 16F, the DQS_t/DQS_c read preamble is trained after an MRS command for driving suitable DQS, and DQ data is read according to DQS_t/DQS_c toggling after CL from a read command.

Figure 16G:
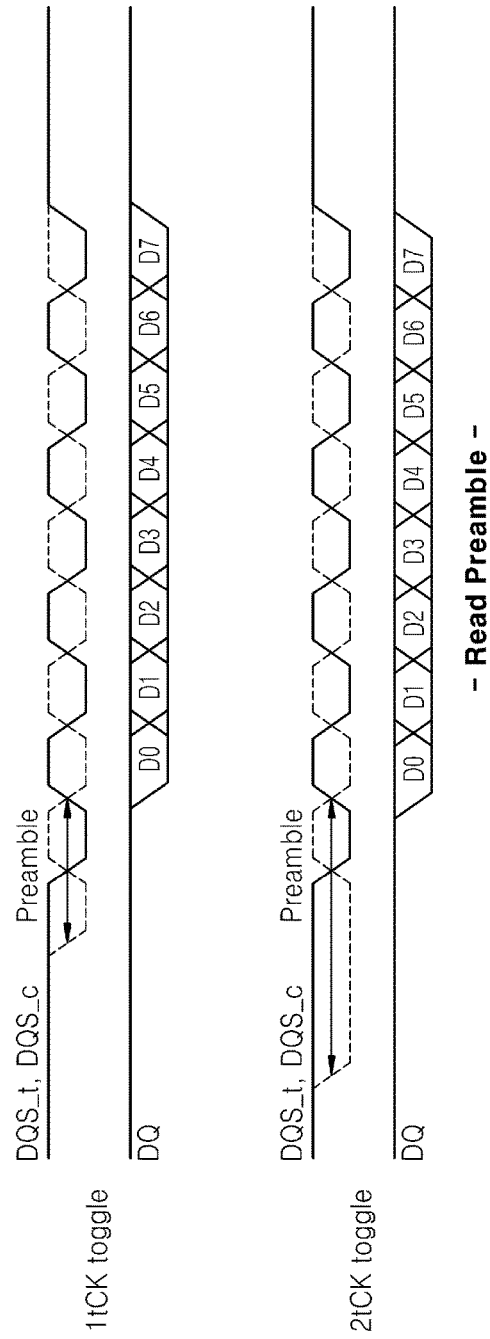

1-bit A11 is used to provide a read preamble function of the MRAM 12. In the MRAM 12, DQS and DQ are in high-Z states, and when read by a memory controller, the MRAM 12 is synchronized to DQS to output DQ data. DQS may have a predetermined preamble time before outputting DQ data. When "0" is programmed to the A11 bit, a read preamble is set to 1 clock cycle (1 tCK). When "1" is programmed, the read preamble is set to 2 clock cycles (2 tCK). Read preamble modes of 1 tCK and 2 tCK are shown in FIG. 16G.

1-bit A12 is used to provide a write preamble function of the MRAM 12. The MRAM 12 supports a programmable write preamble. When "0" is programmed to the A12 bit, a write preamble is set to 1 tCK, and when "1" is programmed, the write preamble is set to 2 tcK. As shown in FIG. 16H, in the write preamble, DQS has a 1 tCK or 2 tCK preamble time before input of DQ data according to a write command.

Figure 16I:
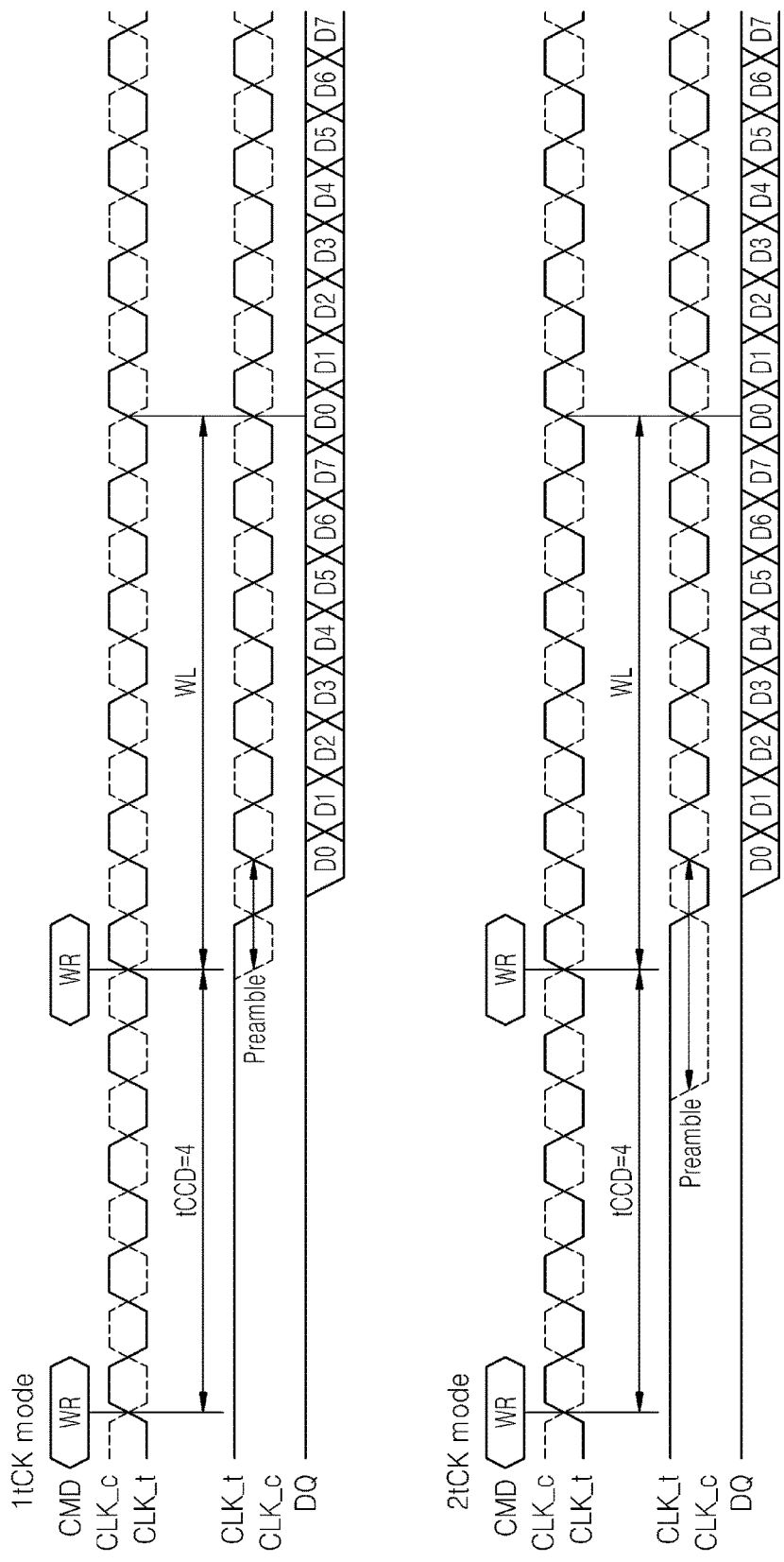
Figure 16J:
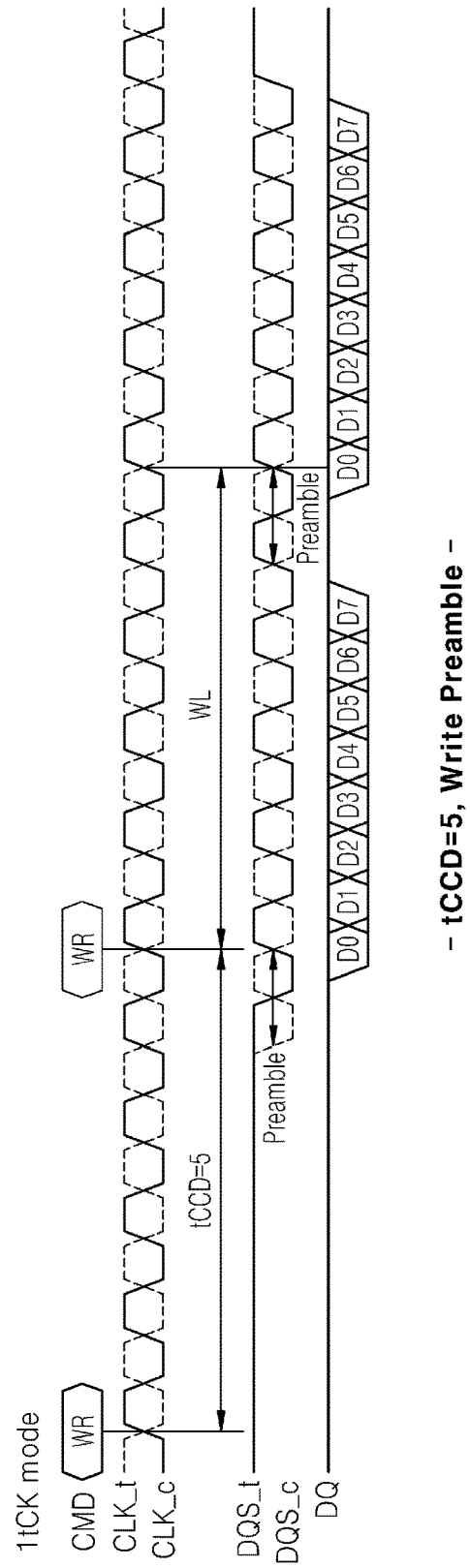
Figure 16K:
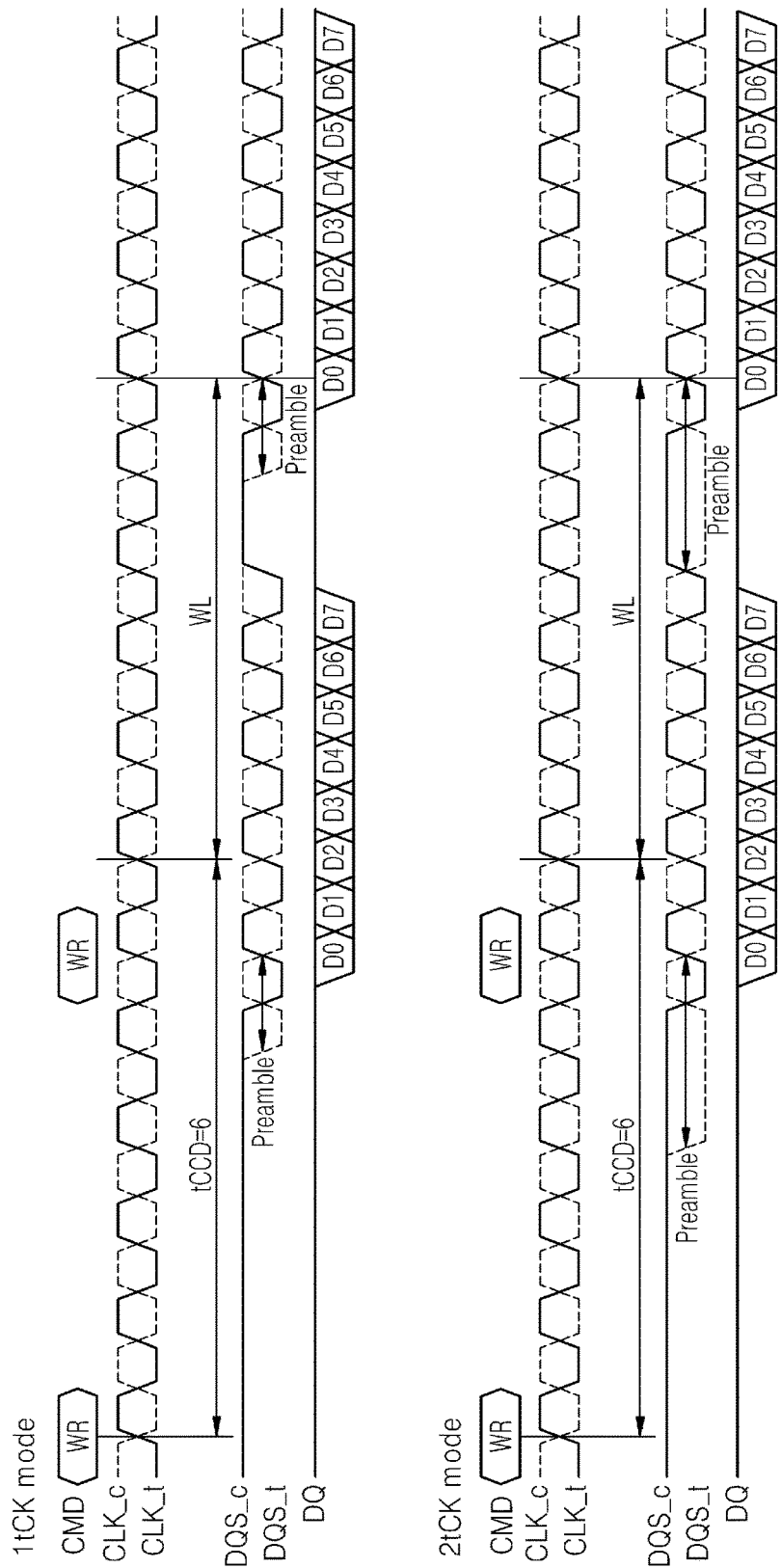

In a 2 tCK write preamble mode, tWTR and tWR timings may be programmed to have 1 clock more than tWRT and tWR setting supported by an applicable speed bin, i.e., a data rate. The tWTR timing denotes a delay from start of internal write transaction to internal read command, and the tWR timing denotes a write recovery time. Write preambles according to various tCCD times are shown in FIGS. 16I through 16K. tCCD denotes a CAS-to-CAS command delay.

BG1, A13, A9, A5, A3:A2, and A0 bits of the mode register 15 in mode register state MR4 are RFU, and are programmed to "0" during mode register setting.

FIGS. 17A through 17B are diagrams for describing the mode register state MR5, according to one exemplary embodiment.

A sixth set of operational characteristics and bit assignments for each characteristic may be set for the mode register 15 for mode register state MR5, as described with reference to FIG. 17A. The sixth set of operational characteristics and bit assignments may be different from those described above in connection with the previously described sets. In one embodiment, the mode register MR5 is selected by a "101" bit value with respect to BG0 and BA1:BA0. The mode register 15 in mode register state MR5 stores data for controlling a CA parity function, a CRC error state, a CA parity error state, an ODT input buffer power down function, a data mask function, a write DBI function, and a read DBI function of the MRAM 12.

3-bit A2:A1 is used to provide a CA parity function of the MRAM 12. The CA parity supports parity calculation on a command signal and an address signal. A default state of CA parity bits is disabled. The CA parity is enabled by programming a non-zero value to CA parity latency, and at this time, it is checked that the MRAM 12 does not have a parity error before performing a command. When the CA parity latency is enabled and applied to all commands, an additional delay for performing the commands is programmed.

When "000: is programmed to the A2:A0 bit, CA parity is in a disabled state. When "001" is programmed to the A2:A0 bit, CA parity latency is set to 4 clock cycles. When "010" is programmed, 5 clock cycles are set, when "011" is programmed, 6 clock cycles are set, and when "100" is programmed, 8 clock cycles are set. "101", "110", and "111" are unsettled.

1-bit A3 is used to notify a CRC error state of the MRAM 12. The CRC error state supports a memory controller to determine whether an error generated by the MRAM 12 is a CRC error or an address/parity error. If the CRC error is detected, "1" is programmed to the A3 bit, and if not, "0" is programmed to the A3 bit.

1-bit A4 is used to notify a CA parity error state of the MRAM 12. The CA parity error state supports the memory controller to determine whether an error generated by the MRAM 12 is a CRC error or an address/parity error. If the parity error is detected, "1" is programmed to the A4 bit, and if not, "0" is programmed to the A4 bit.

1-bit A5 is used to control an ODT input buffer power down function of the MRAM 12. When "0" is programmed to the A5 bit, ODT input buffer power down is disabled, and when "1" is programmed, the ODT input buffer power down is enabled.

3-bit A8:A6 is used to control an ODT park termination (RTT_PARK) feature of the MRAM 12. Park termination may be preselected at a high-Z state without a command. The park termination is turned on when an ODT pin is "low".

When "000" is programmed to the A8:A6 bit, the park termination is disabled. When "001" is programmed to the A8:A6 bit, a value of the park termination is set to RZQ/4. When "010" is programmed, RZQ/2 is set, when "011" is programmed, RZQ/6 is set, when "100" is programmed, RZQ/1 is set, when "101" is programmed, RZQ/5 is set, when "110" is programmed, RZQ/3 is set, and when "111" is programmed, RZQ/7 is set. RZQ may be set to 240Ω.

1-bit A10 is used to provide a DM function of the MRAM 12. The MRAM 12 supports a DM function and a DIB function. During a write operation of the MRAM 12, one of the DM and DBI functions is enabled, but both of them cannot be simultaneously enabled. If the DM and DBI functions are both disabled, the MRAM 12 turns off an input receiver. During a read operation of the MRAM 12, only the DBI function is provided. When a TDQS function is enabled, the DM and DBI functions are not supported. The DM, DBI, and TDQS functions provided by a mode register are summarized as shown in FIG. 17B.

When "0" is programmed to the A10 bit, the DM function is disabled. When "1" is programmed to the A10 bit, the DM function is enabled. During the write operation of the DRAM 12, when the DM function is enabled, the MRAM 12 masks write data received by DQ inputs.

1-bit A11 is used to provide a write DBI function of the MRAM 12. A DBI function is supported to reduce power consumption of the MRAM 12. When a transmission line of the MRAM 12 is terminated to a power supply voltage Vdd, more power is consumed to transmit a low level signal than a high level signal. When the number of low level bits is higher than the number of high level bits in transmission data, the transmission data may be inverted and transmitted such that the number of low level bits is less than or equal to a half of the total number of bits of the transmission data. Here, the transmission data may additionally include a signal about the inversion.

When the write DBI function is enabled, the MRAM 12 inverts the write data transmitted to the DQ inputs. When "0" is programmed to the A11 bit, the write DBI function is disabled. When "1" is programmed to the A11 bit, the write DBI function is enabled.

1-bit A12 is used to provide a read DBI function. When the read DBI function is enabled, the MRAM 12 inverts read data transmitted to DQ outputs. When "0" is programmed to the A12 bit, the read DBI function is disabled. When "1" is programmed to the A12 bit, the read DBI function is enabled.

BG1, A13, and A9 bits of the mode register 15 in mode register state MR5 are RFU, and are programmed to "0" during mode register setting.

FIGS. 18A and 18B are diagrams for describing the mode register state MR6, according to one exemplary embodiment.

A seventh set of operational characteristics and bit assignments for each characteristic may be set for the mode register 15 for mode register state MR6, as described with reference to FIG. 18A. The seventh set of operational characteristics and bit assignments may be different from those described above in connection with the previously described sets. In one embodiment, the mode register state MR6 is selected by a "110" bit value with respect to BG0 and BA1:BA0. The mode register 15 in mode register state MR6 stores data for controlling a VrefDQ training value, a VrefDQ training range, VrefDQ training enable, and a tCCD timing of the MRAM 12.

6-bit A5:A0 is used to control a VrefDQ training value of the MRAM 12. The VrefDQ training value may be set based on a VDDQ voltage. The VrefDQ training value is divided into 2 ranges. As shown in FIG. 18B, in a first range Range1, a VrefDQ minimum operation voltage is set to 60% of the VDDQ voltage, and a VrefDQ maximum operation voltage is set to 92% of the VDDQ voltage. In a second range Range2, the VrefDQ minimum operation voltage is set to 45% of the VDDQ voltage, and the VrefDQ maximum operation voltage is set to 77% of the VDDQ voltage.

1-bit A6 is used to control VrefDQ training range of the MRAM 12. When "0" is programmed to the A6 bit, VrefDQ of the first range Range1 of FIG. 18B is selected, and when "1" is programmed to the A6 bit, VrefDQ of the second range Range2 of FIG. 18B is selected.

1-bit A7 is used to control VrefDQ training enable (TE) of the MRAM 12. When "0" is programmed to the A7 bit, VrefDQ training is disabled, and when "1" is programmed, VrefDQ training is enabled.

3-bit A12:A10 is used to control tCCD timing (tCCD_L) of the MRAM 12. The tCCD timing denotes a CAS-to-CAS command delay. When "000" is programmed to the A12:A10 bit, tCCD is set to 4 clock cycles (nCK). When "001" is programmed, tCCD is set to 5 nCK, when "010" is programmed, tCCD is set to 6 nCK, when "011" is programmed, tCCD is set to 7 nCK, and when "100" is programmed, tCCD is set to 8 nCK. In one embodiment, "101", "110", and "111" of the A12:110 bit are unsettled.

BG1, A13, A9, and A8 bits of the mode register 15 in mode register state MR6 are RFU, and are set to "0" during mode register setting.

Figure 19:
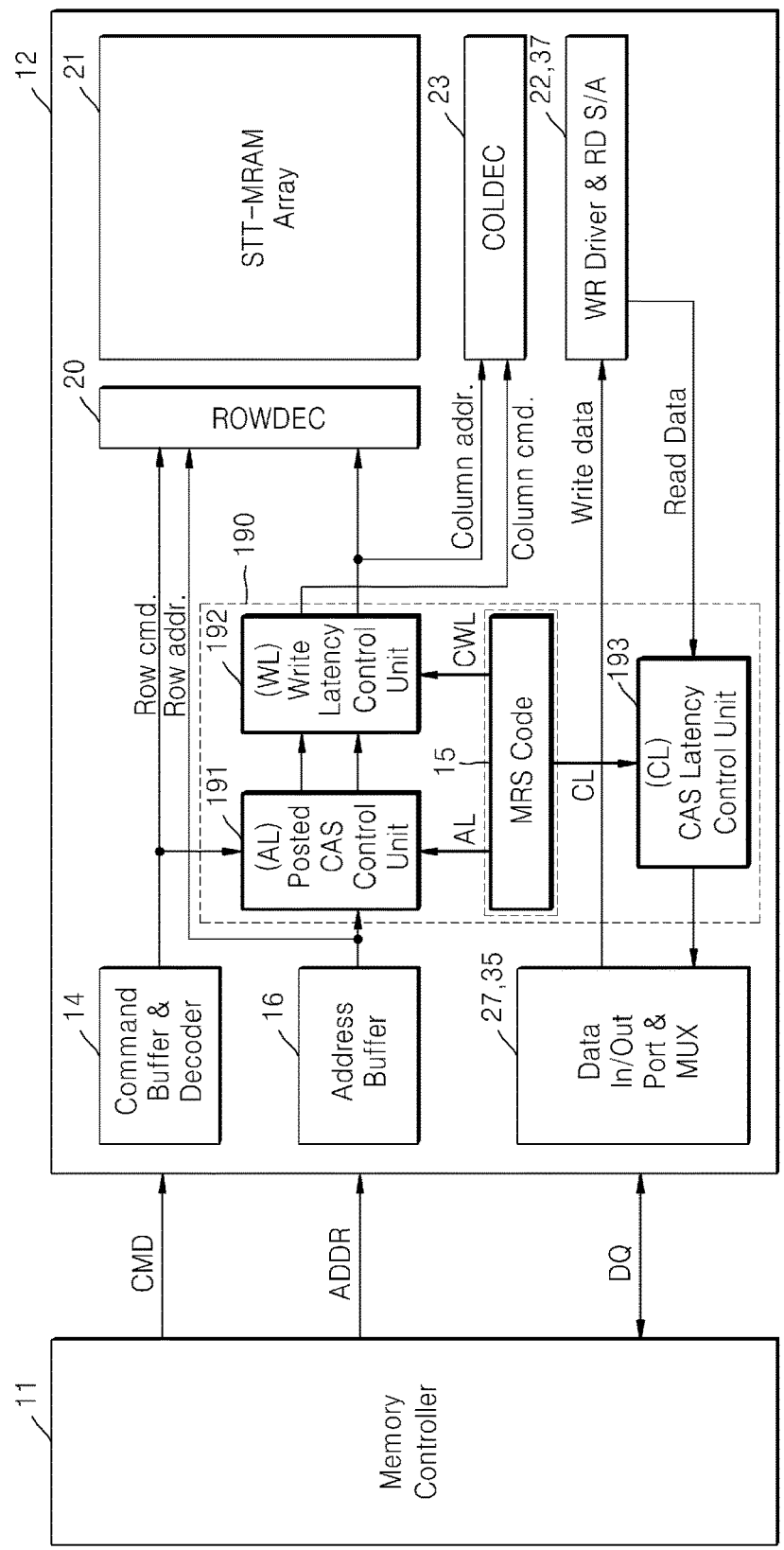
FIG. 19 is a diagram of an exemplary MRAM having a latency function, according to one embodiment.

FIG. 19 is a diagram of the MRAM 12 having a latency function, according to one exemplary embodiment.

Referring to FIG. 19, the MRAM 12 receives a command signal CMD and an address signal ADDR from the memory controller 11 as shown in FIG. 1, and provides a data signal DQ to the memory controller 11 or receives the data signal DQ from the memory controller 11. The MRAM 12 includes the elements described above with reference to FIG. 2, a command buffer and decoder 14, an address buffer 16, a mode register 15, a row decoder 20, a memory cell array 21, a column decoder 23, a data driver and sense amplifier 22 and 37, and a data input/output port and multiplexer 27 and 35. Descriptions of elements denoted by the same reference numerals as those in the MRAM 12 of FIG. 2 are not repeated herein.

The MRAM 12 further includes a latency control unit 190 controlling an input and output time of an effective first piece of data from a read or write command applied from the memory controller 11 of FIG. 1. The latency control unit 190 includes an AL control unit 191 for controlling (AL), a WL control unit 192 for CWL, and a CL control unit 193 for controlling CL. The AL control unit 191, the WL control unit 192, and the CL control unit 193 may be controlled, for example, by an MRS code stored in the mode register 15.

The AL control unit 191 may control AL by a code stored in the A4:A3 bits of the mode register 15 when in mode register state MR1 described above with reference to FIG. 13A. The AL is supported for efficient command and data bus with respect to a sustainable bandwidth. The AL control unit 191 disables AL by A4:A3 bit code "00". The AL control unit 191 controls AL to CL-1 by A4:A3 bit code "01", and controls AL to CL-2 by A4:A3 bit code "10".

The WL control unit 192 may control CWL by a code stored in the A5:A3 bits of the mode register 15 when in mode register state MR2 described with reference to FIG. 14A. CWL is defined by a clock cycle delay between an internal write command and a first bit of effective input data. The WL control unit 192 controls CWL to CWL-9 by A5:A3 bit code "000", to CWL-10 by A5:A3 bit code "001", to CWL-11 by A5:A3 bit code "010", to CWL-12 by A5:A3 bit code "011", to CWL-14 by A5:A3 bit code "100", to CWL-16 by A5:A3 bit code "101", and to CWL-18 by A5:A3 bit code "110".

Looking at a write operation of the MRAM 12, the MRAM 12 decodes a write command input to the command buffer 14, and delays the write command by a predetermined clock cycle according to AL and CWL codes preset in the mode register 15. The write data is input via a DQ pin after summing AL and CWL register settings. An actual write operation is performed such that data is written on the memory cell 21 after last write data is input. (WL) is controlled by the sum of the AL and CWL register settings.

The CL control unit 193 may control CL based on a code stored in the A6:A4 and A2 bits of the mode register 15 when in mode register state MR0 described above with reference to FIG. 12A. CL defines a clock cycle delay between a read command and a first bit of effective output data. The CL control unit 193 controls CL to CL-9 by a A6:A4 and A2 bit code "0000", to CL-10 by a A6:A4 and A2 bit code "0001", to CL-11 by a A6:A4 and A2 bit code "0010", to CL-12 by a A6:A4 and A2 bit code "0011", to CL-13 by a A6:A4 and A2 bit code "0100", to CL-14 by a A6:A4 and A2 bit code "0101", to CL-15 by a A6:A4 and A2 bit code "0110", to CL-16 by a A6:A4 and A2 bit code "0111", to CL-18 by a A6:A4 and A2 bit code "1000", to CL-20 by a A6:A4 and A2 bit code "1001", to CL-22 by a A6:A4 and A2 bit code "1010", and to CL-24 by a A6:A4 and A2 bit code "1011".

Referring to a read operation of the MRAM 12, the MRAM 12 delays a read command by AL set in the mode register 15, and enables a column select signal to read data of memory cells accessed in the memory cell array 21. The data read by the memory cells is delayed according to a CL code through the CL control unit 193, and then is output through a DQ pin. The (RL) is controlled by a sum of AL and CL register settings.

Figure 20:
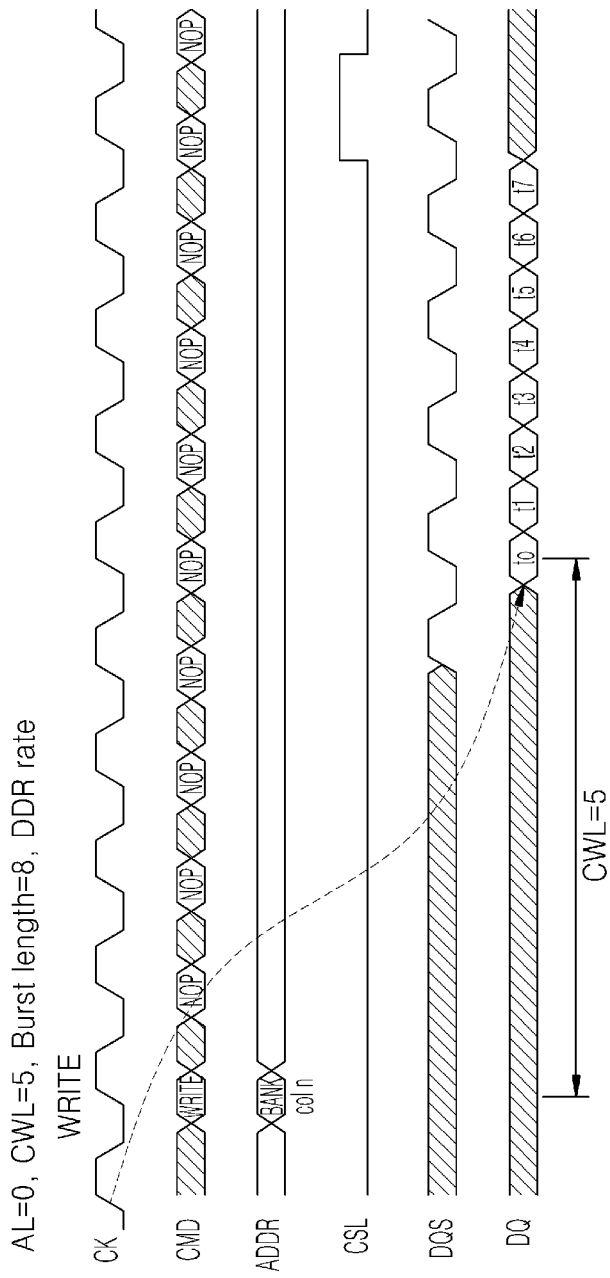
FIGS. 20 through 23 are exemplary timing diagrams according to latency, according to certain embodiments.
Figure 21:
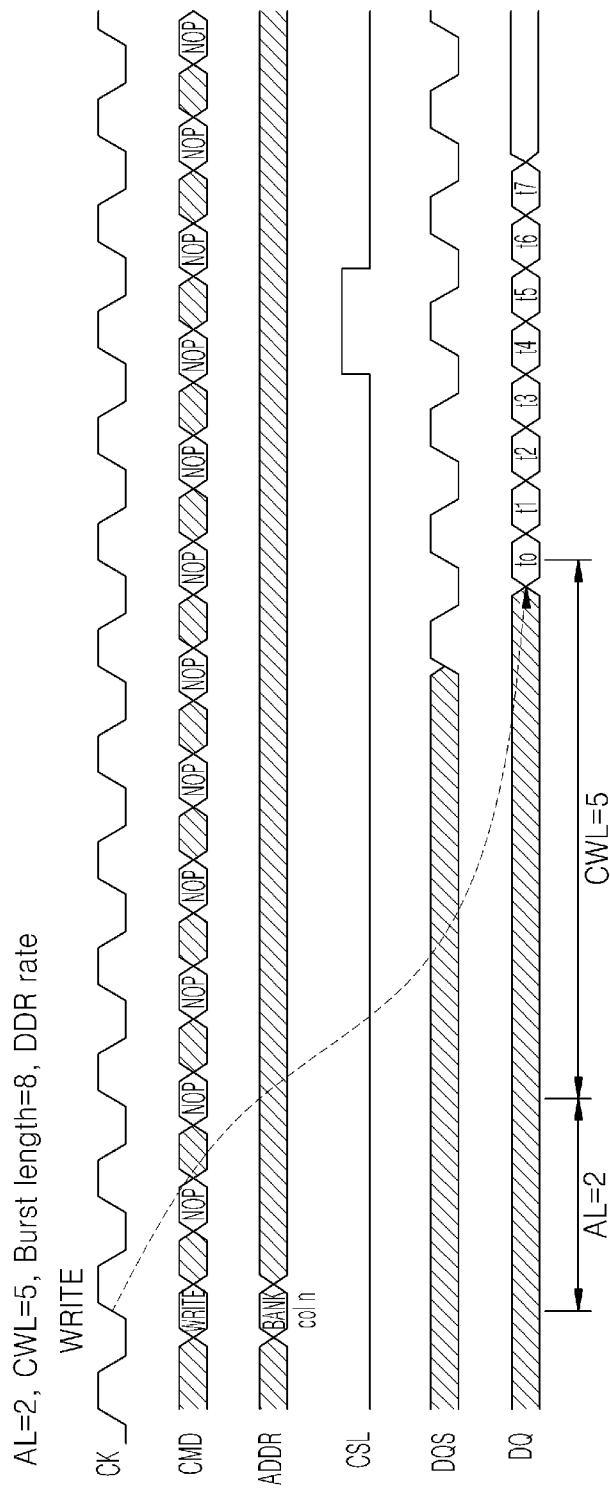
Figure 22:
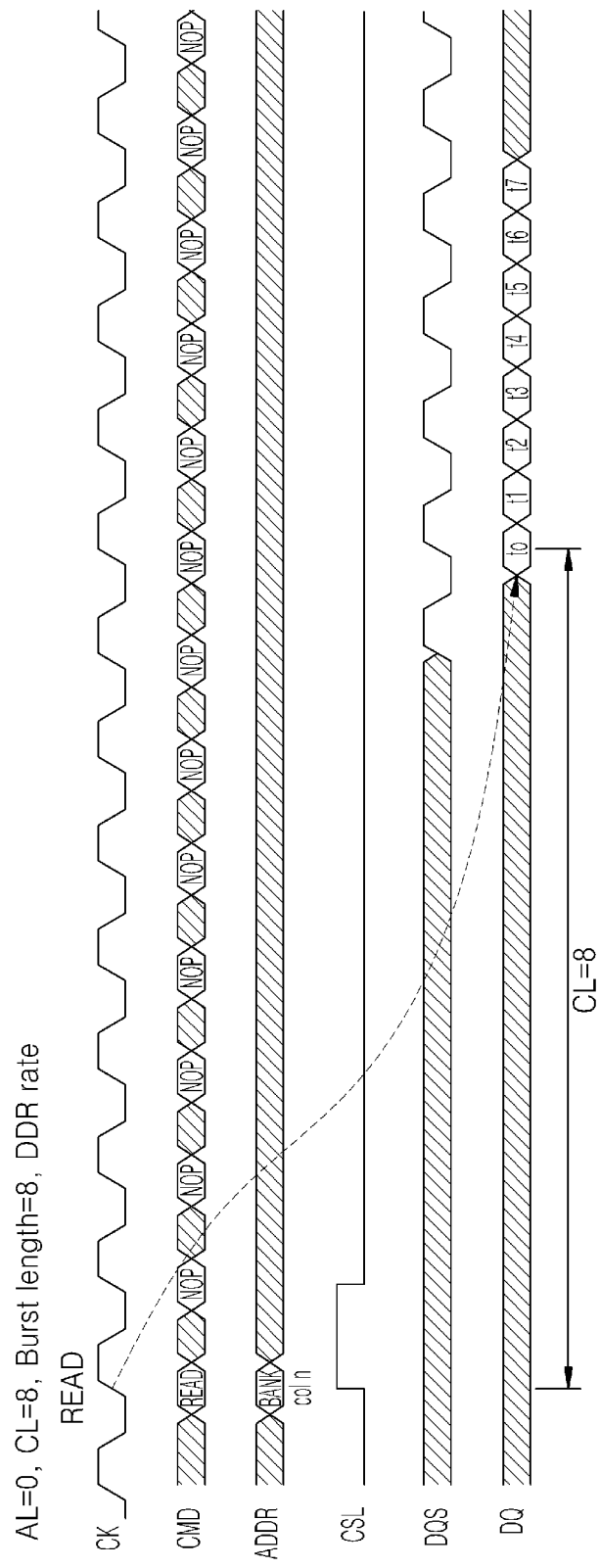
Figure 23:
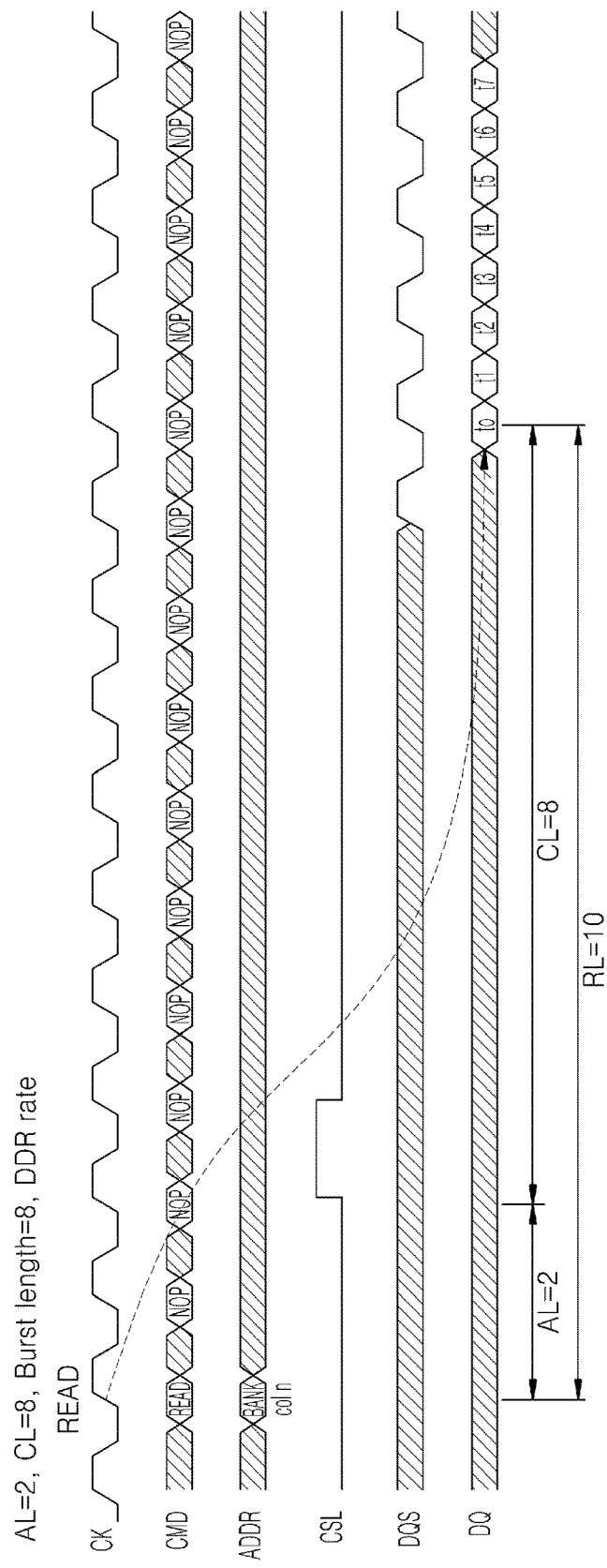

FIGS. 20 through 23 are timing diagrams according to latency, according to certain exemplary embodiments. FIGS. 20 and 21 are write operation timing diagrams of the MRAM 12, and FIGS. 22 and 23 are read operation timing diagrams.

Referring to FIG. 20, a write operation when AL=0, CWL=5, BL=5, and a mode is a DDR operation mode is described. After a write command is input from the memory controller 11, write data is input to a DQ pin after 5 clock cycles according to CWL=5. A write operation in the memory cell array 21 is performed as a column select signal CSL is enabled after last write data corresponding to BL=8 is input.

Referring to FIG. 21, a write operation when AL=2, CWL=5, BL=8, and a mode is a DDR operation mode is described. After a write command is input from the memory controller 11 of FIG. 19, the MRAM 12 internally delays the write command by 2 clock cycles according to AL=2, and then write data is input to a DQ pin after 5 clock cycles according to CWL=5. A write operation in the memory cell array 21 is performed as a column select signal CSL is enabled after last write data corresponding to BL=8 is input.

Referring to FIG. 22, a read operation when AL=0, CL=8, BL=5, and a mode is a DDR operation mode is described. After a read command is input from the memory controller 11, the MRAM 12 enables a column select signal CSL to read data from the memory cell array 21, and outputs read data to a DQ pin after 8 clock cycles according to CL=8.

Referring to FIG. 23, a read operation when AL=2, CL=8, BL=5, and a mode is a DDR operation mode is described. After a read command is input from the memory controller 11, the MRAM 12 enables a column select signal CSL after 2 clock cycles according to AL=2 to read data from the memory cell array 21. Then, read data is output to a DQ pin after 8 clock cycles according to CL=8.

Figure 24:
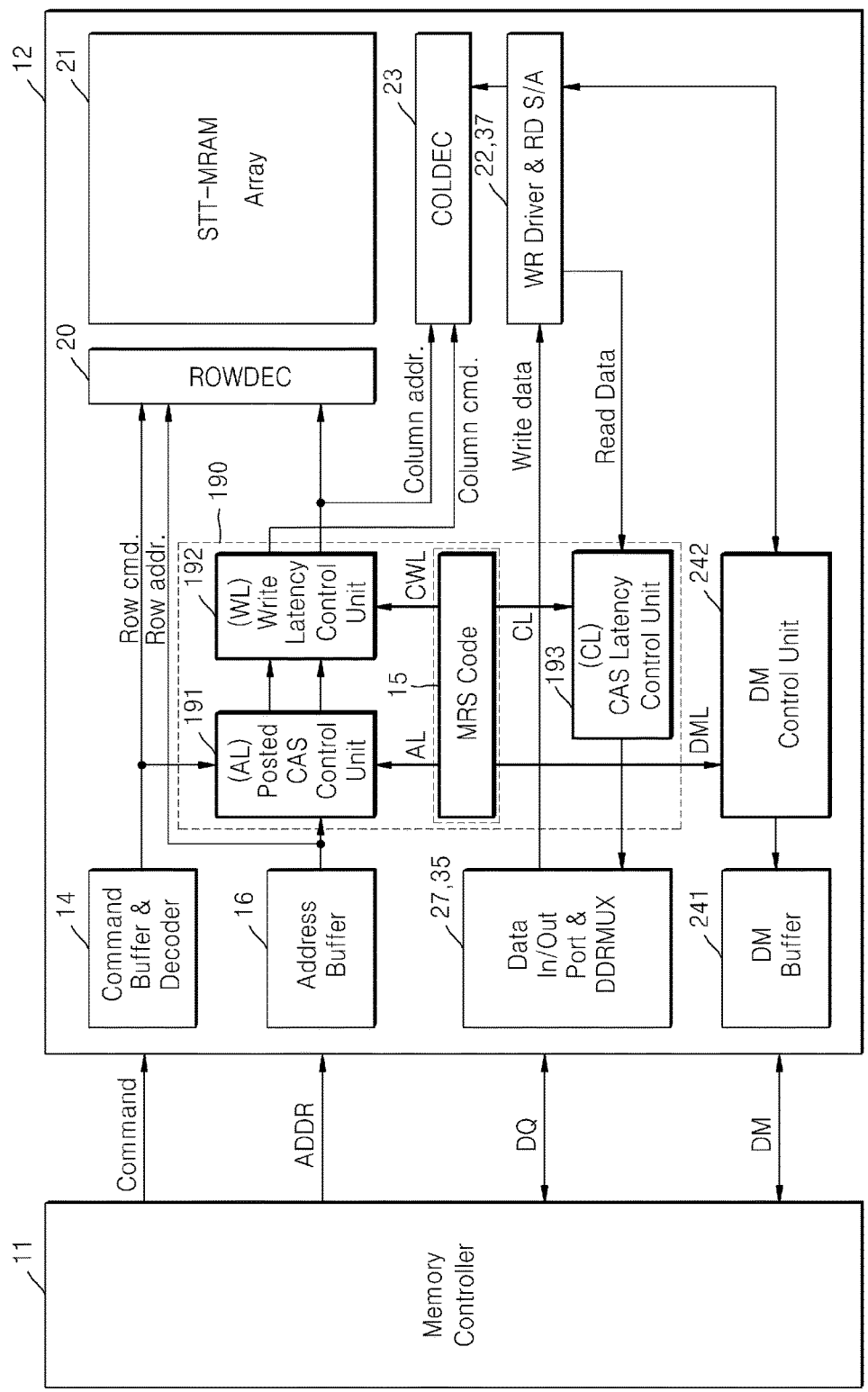
FIG. 24 is a diagram of an MRAM according to another exemplary embodiment.

FIG. 24 is a diagram of an MRAM 12 according to another exemplary embodiment.

Referring to FIG. 24, the MRAM 12 includes the same elements of the MRAM 12 described with reference to FIG. 19, and further includes a DM buffer 241 and a DM control unit 242. The DM control unit 242 receives a DM signal that selectively masks data input to a DQ pin. The DM control unit 242 may control a DM operation according to an A10 bit code of the mode register MRS. The DM control unit 242 disables a DM function according to "0" of the A10 bit, and enables the DM function according to "1" of the A10 bit. In a write operation of the MRAM 12, when the DM function is enabled, for example, data masking is performed in byte units on DQ inputs of 16 bits. As a result, 8 bits may be masked from among 16 bits of write data.

In the write operation, DQ inputs and a DM signal are generally input at the same timing after (WL). The MRAM 12 may control a DM signal at a latency different from a DQ input, according to DM latency (DML) provided by the mode register 15. Although DML is not set in the mode register 15 in mode register states MR0 through MR6 described above, the DML may be set by using bits constituting RFU from among the mode register states MR0 through MR6. The MRAM 12 may obtain an internal operation margin by separately controlling DML and a DQ input.

Figure 25:
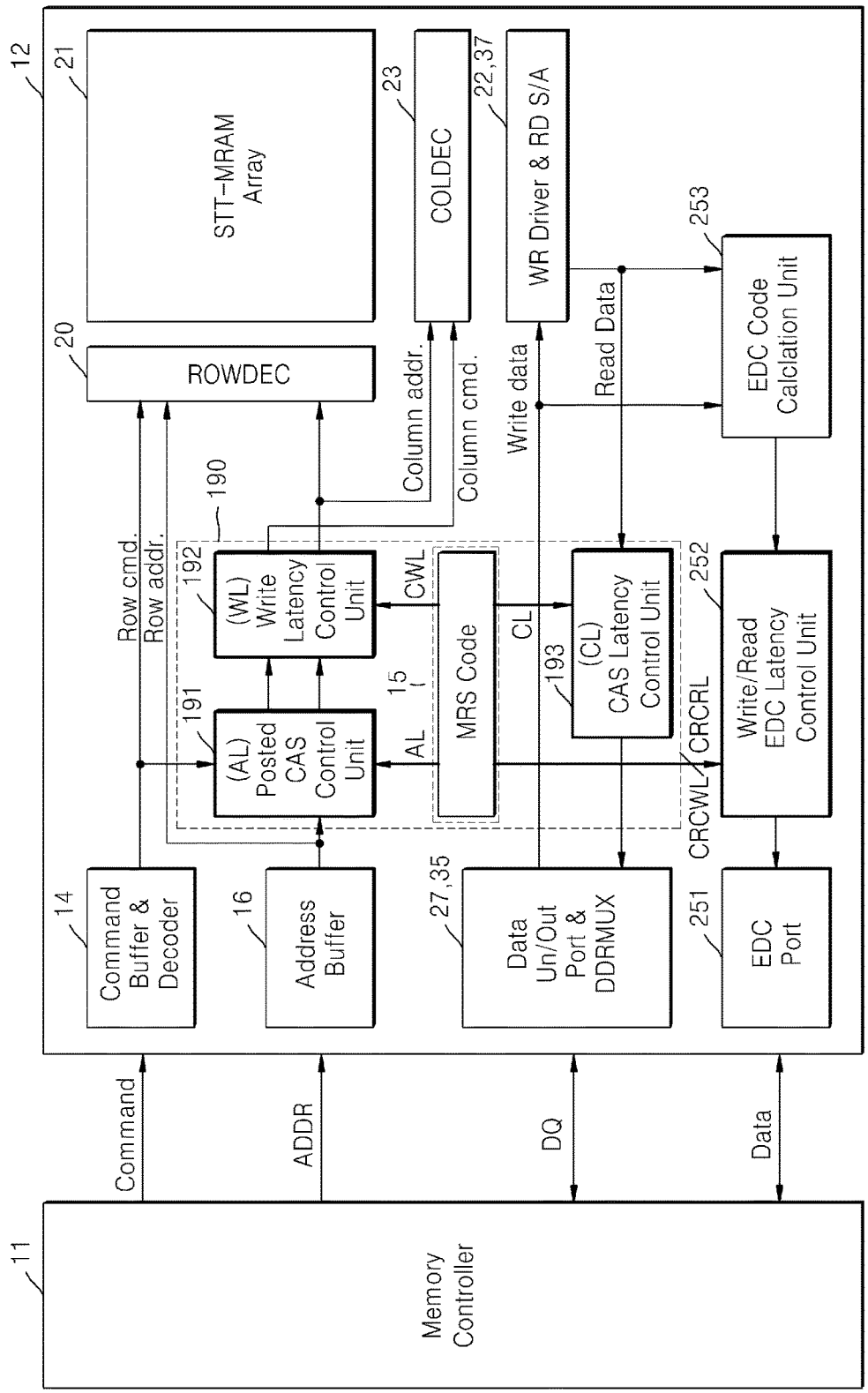
FIG. 25 is a diagram of an MRAM according to another exemplary embodiment.

FIG. 25 is a diagram of an MRAM 12 according to another exemplary embodiment.

Referring to FIG. 25, the MRAM 12 includes the same elements as the MRAM 12 of FIG. 19, and further includes an error detection code (EDC) port 251, an EDC latency control unit 252, and an EDC code calculation unit 253. Repeated descriptions of the same elements as those of the MRAM 12 of FIG. 19 are not provided.

The MRAM 12 may support an EDC function in a write or read operation. The EDC function is very similar to a CRC function. The EDC code calculation unit 253 may employ a CRC function in write or read data. When a calculated CRC value is transmitted to the memory controller 11, the MRAM 12 may transmit the CRC value at a predetermined latency determined by the EDC latency control unit 252. The CRC value delayed by the predetermined latency is transmitted to the memory controller 11 through the EDC port 251.

The EDC latency control unit 252 transmits a CRC value of write data after a clock cycle according to CRC write latency (CRCWL) provided by the mode register 15. Alternatively, the EDC latency control unit 252 transmits a CRC value of read data after a clock cycle according to CRC read latency (CRCRL) provided by the mode register 15. CRCWL or CRCRL may be provided, for example, by an EDC mode register of FIG. 26.

Referring to FIG. 26, bit assignment of each operation mode settable in the EDC mode register is described. When "0100" is programmed to 4-bit BA3:BA0, the EDC mode register is selected. The EDC mode register stores data for controlling an EDC hold pattern and CRCWL, CRCRL, RD CRC, WR CRC, and EDC13Inv functions.

4-bit A3:A0 is used to support the EDC hold pattern of the MRAM 12. The EDC hold pattern may be considered to be a background pattern to be transmitted to the EDC port 251. The A3:A0 bits are all set to "1" in the beginning. The EDC hold pattern shifts from right to left and is repeated every clock. An output timing of the EDC hold pattern is identical to a read burst. The EDC hold pattern may be replaced by CRC values calculated with respect to a burst that is CRC-enabled during a write or read operation.

3-bit A6:A4 is used to provide the CRCWL function of the MRAM 12. CRCWL is latency set when a CRC value of write data is transmitted. When "000" is programmed to the A6:A4 bit, CRCWL is set to 7 clock cycles. When "001" is programmed, CRCWL-8 is set, when "010" is programmed, CRCWL-9 is set, when "011" is programmed, CRCWL-10 is set, when "100" is programmed, CRCWL-11 is set, when "101" is programmed, CRCWL-12 is set, when "110" is programmed, CRCWL-13 is set, and when "111" is programmed, CRCWL-14 is set.

2-bit A8:A7 is used to provide a CRCRL function of the MRAM 12. CRCRL is latency set when a CRC value of read data is transmitted. When "00" is programmed to the A8:A7 bit, CRCRL is set to 0 clock cycle. When "01" is programmed, CRCRL-1 is set, when "10" is programmed, CRCRL-2 is set, and when "11" is programmed, CRCRL-3 is set.

1-bit A9 is used to support a read CRC (RD CRC) enable function of the MRAM 12. When "0" is programmed to the A9 bit, RD CRC is turned on, and when "1" is programmed, RD CRC is turned off.

1-bit A10 is used to support write CRC (WR CRC) enable function of the MRAM 12. When "0" is programmed to the A10 bit, WR CRC is turned on, and when "1" is programmed to the A10 bit, WR CRC is turned off.

1-bit A11 is used to transmit an EDC hold pattern wherein EDC1 and EDC3 are inverted (EDC13Inv). Accordingly, EDC13Inv may transmit a pseudo-differential pattern. When "0" is programmed to the A11 bit, the EDC hold pattern is not inverted, and when "1" is programmed, the EDC hold pattern is inverted.

Figure 27:
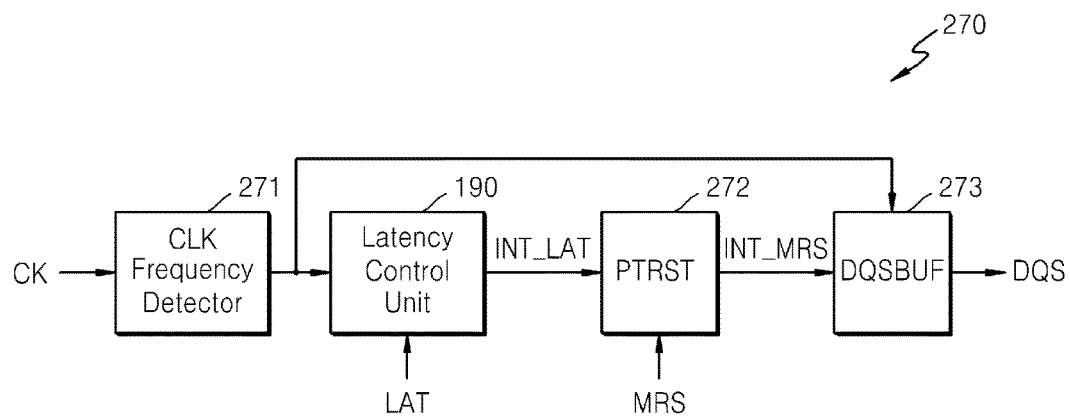
FIG. 27 is a block diagram of an MRAM having a DQS preamble function, according to an exemplary embodiment.

FIG. 27 is a block diagram of an MRAM having a DQS preamble function, according to an exemplary embodiment.

Referring to FIG. 27, a DQS preamble control block 270 is included in the MRAM 12 of FIG. 2. The DQS preamble control block 270 generates a DQS signal having a predetermined preamble time before DQ data input or output. The DQS preamble control block 270 includes a clock frequency detector 271, a latency control unit 190, a preamble control unit 272, and a DQS buffer 273.

The clock frequency detector 271 detects a frequency of a received clock signal CK. The latency control unit 190 delays the received clock signal CK by a predetermined clock cycle in response to a latency signal LAT. As shown in FIG. 19, the latency control unit 190 includes the AL control unit 191, the WL control unit 192, and the CL control unit 193. The latency signal LAT may be set based on a sum of (AL), CWL, and CL. The latency control unit 190 generates a first internal control signal INT_LAT delayed according to the latency signal LAT.

The preamble control unit 272 generates a second internal control signal INT_MRS by advancing from the first internal control signal INT_LAT by a predetermined preamble time in response to a mode register signal MRS. The mode register signal MRS is provided from a read preamble (RP) and write preamble (WP) functions stored in the mode register MR4 described above with reference to FIG. 16A. When "0" is programmed to the A11 bit, the RP is set to 1 clock cycle (tCK), and when "1" is programmed to the A11 bit, the RP is set to 2 clock cycles (tCK).

In the RP, DQS has a 1 tCK or 2 tCK preamble time before DQ data output according to a read command. When "0" is programmed to the A12 bit, a WP is set to 1 tCK, and when "1" is programmed, the write preamble is set to 2 tCK. In a read WP, DQS has a 1 tCK or 2 tCK preamble time before DQ data input according to a write command.

The DQS buffer 273 generates a DQS signal having a predetermined preamble time from the received clock signal CK in response to the second internal control signal INT_MRS.

Figure 28:
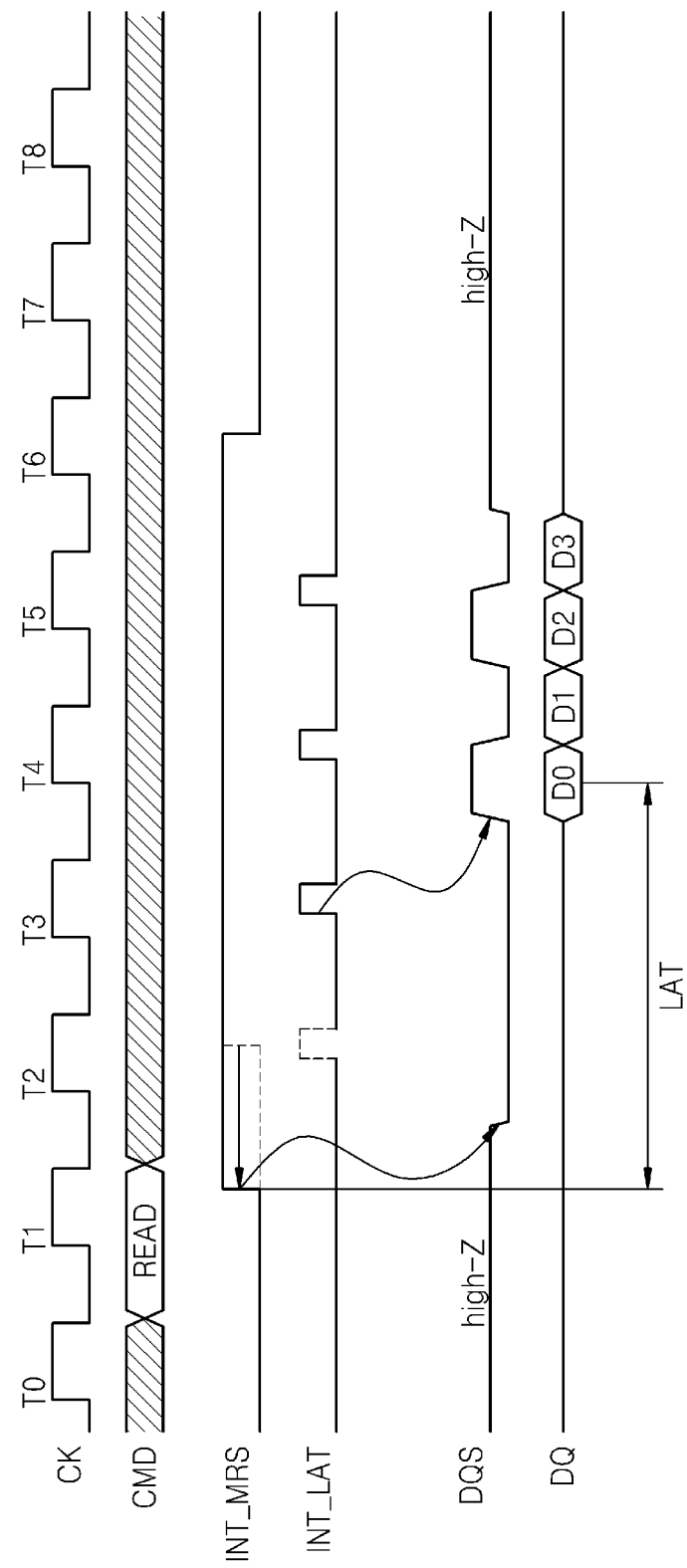
FIG. 28 is a diagram for describing an exemplary operation timing of a DQS preamble control block of FIG. 27, according to one embodiment.

FIG. 28 is a diagram for describing an exemplary operation timing of the DQS preamble control block 270 of FIG. 27, according to one embodiment.

Referring to FIG. 28, a DQS signal and DQ are in high-Z states, and when the memory controller 11 reads the MRAM 12, are synchronized to DQS to output DQ data. The DQS signal may be used by the memory controller 11 for synchronized reception of read data. After, for example, LAT=3, DQ data is read from a read command according to DQS toggling. Here, the DQS signal has a predetermined preamble time, for example, RP=1 tCK before DQ data output.

In the above-described embodiments, a novel mode register having a particular set of mode register states specifically configured for use with an MRAM device is described. During operation, each of the mode register states can be selected based on an MRS code, for example, selected by a controller. In one embodiment, a predetermined set of bits of the mode register code are used to determine which of a plurality of mode register states are to be used, and remaining bits of the mode register code are used determine how to set a group of operational characteristics controlled by mode register in the selected mode register state. As a result, resistive-based memory cells, such as MRAM, can be easily controlled by controller.

FIGS. 29 through 35 are diagrams for describing an MRAM package, an MRAM pin, and an MRAM module, according to various exemplary embodiments. The MRAM may include a pin structure and a package compatible to SDRAM. Also, a module including an MRAM chip may be arranged to be compatible with an SDRAM module. For example, a pin arrangement of the MRAM chip may be configured to be compatible with any one of DDR2 SRAM, DDR3 SDRAM, and DDR4 SDRAM.

Figure 29:
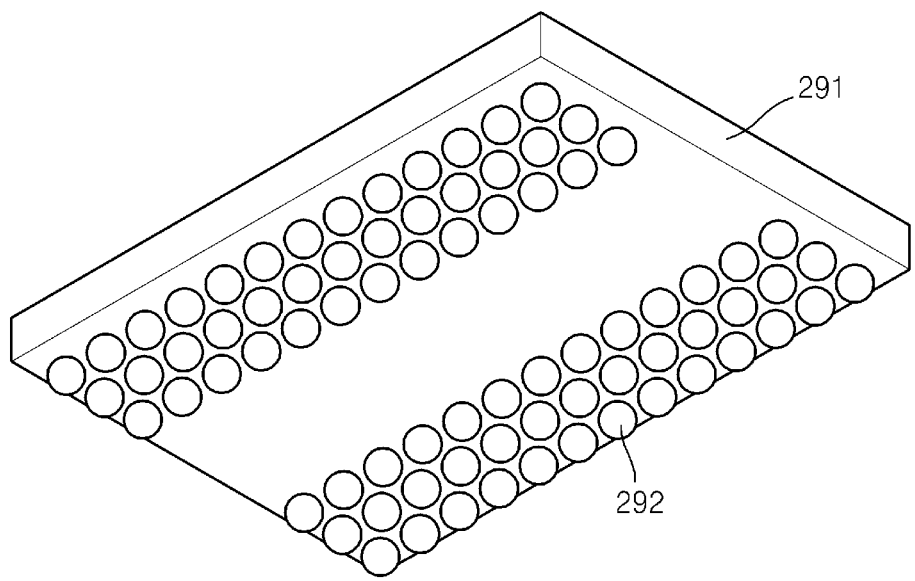

Referring to FIG. 29, the MRAM package 290 includes a semiconductor memory device body 291 and a ball grid array (BGA) 292. The BGA 292 includes a plurality of conductive connectors, such as solder bumps or solder balls, as described below. The plurality of solder balls may connect the semiconductor memory device body 291 and a printed circuit board (PCB) (not shown). The solder balls may be formed of a conductive material, such as a metal, for example.

Figure 30A:
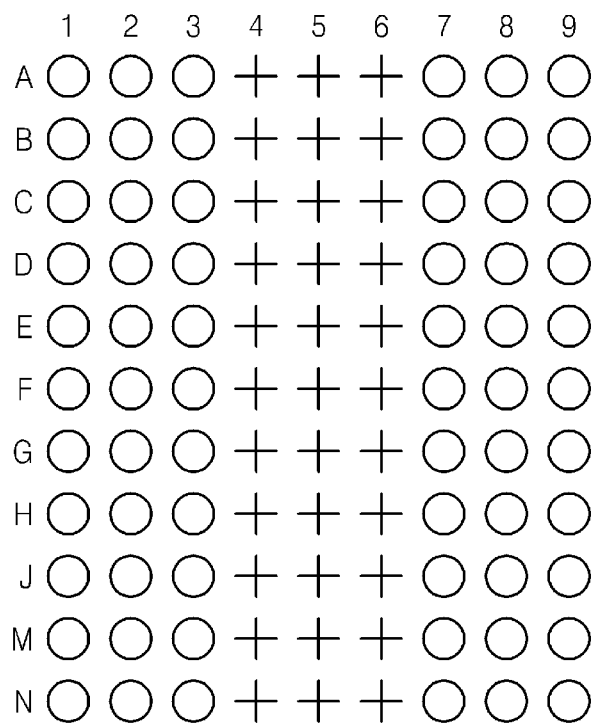

Referring to FIG. 30A, when an MRAM package is used for an X4 or X8 data input/output specification, a BGA may be arranged in 13 rows and 9 columns. The 13 rows are defined as A through N rows and the 9 columns are defined as 1 through 9 columns. The 1 through 3 columns and 7 through 9 columns of the BGA may be solder ball regions. Solder balls (O) may be provided in the solder ball regions. The 4 through 6 columns of the BGA may be a dummy ball region (+). A solder ball is not provided in the dummy ball region. As such, in one embodiment, in the BGA, 78 solder balls total may be provided.

Referring to FIG. 30B, when an MRAM package is used for an X16 data input/output specification, a BGA may be arranged in 16 rows and 9 columns. The 16 rows are defined as A through T rows and the 9 columns are defined as 1 through 9 columns. The 1 through 3 columns and 7 through 9 columns of the BGA may be solder ball regions, and the 4 through 6 columns of the BGA may be a dummy ball region (+). As such, in the BGA, 96 solder balls total may be provided.

Referring to FIG. 31, in one embodiment, pins of an MRAM package having an X4 or X8 data input/output specification may be arranged to be compatible with DDR3 SDRAM. A pin arrangement includes power supply voltages VDD and VDDQ, ground voltages VSS and VSSQ, data input/output signals DQ0 through DQ7, address signals A0 through A14, clock signals CK and CK#, a clock enable signal CKE, and command signals CAS#, RAS#, and WE#.

Referring to FIG. 32, in another embodiment, pins of an MRAM package having an X4 or X8 data input/output specification may be arranged to be compatible with DDR4 SDRAM. A pin arrangement includes power supply voltages VDD, VPP, and VDDQ, ground voltages VSS and VSSQ, data input/output signals DQ0 through DQ7, address signals A0 through A17, clock signals CK_t and CK_c, a clock enable signal CKE, and command signals CAS_n, RASn, and WE_n.

Figure 33:
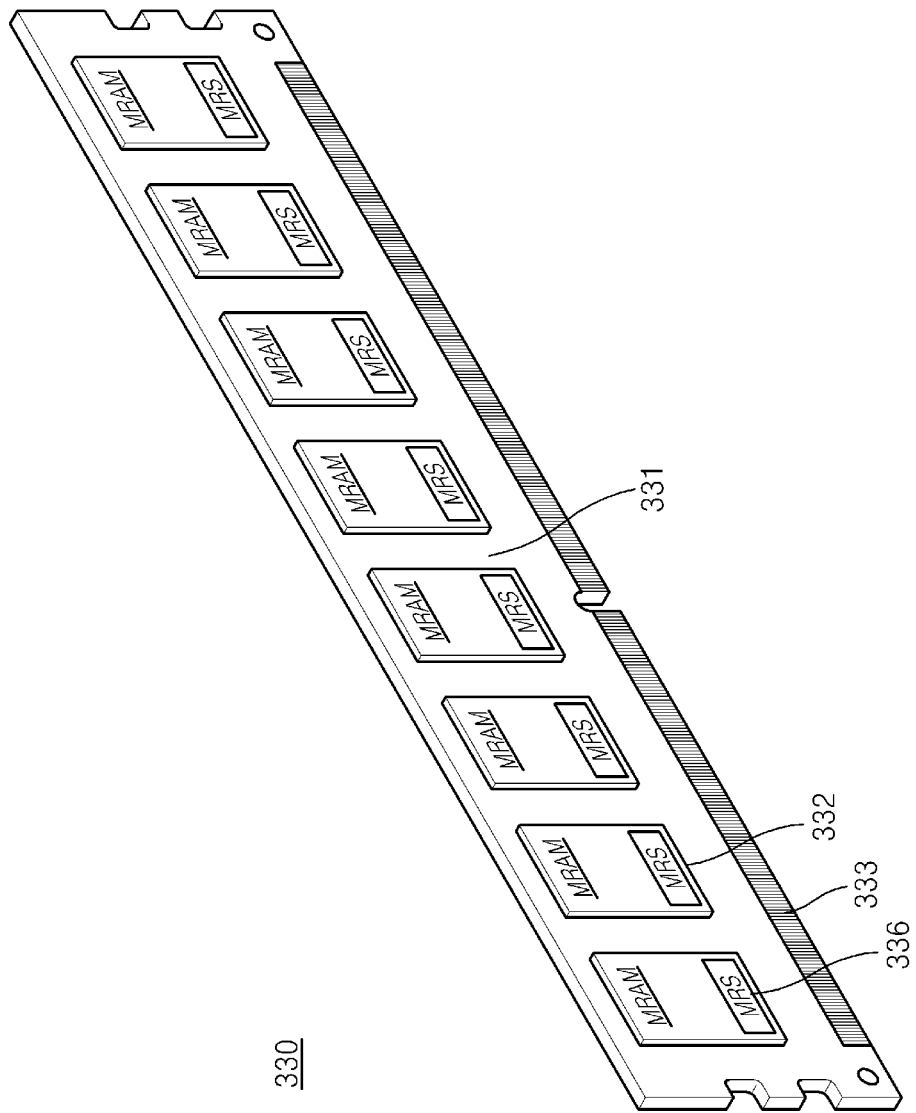

Referring to FIG. 33, an exemplary MRAM module 330 includes a PCB 331, a plurality of MRAM chips 332, and a connector 333. In on embodiment, the MRAM chips 332 may be included on top and bottom surfaces of the PCB 331. The connector 333 is electrically connected to the MRAM chips 332 through conductive lines (not shown). Also, the connector 333 may be connected to a slot of an external host.

In one embodiment, each MRAM chip 332 includes a mode register 336 capable of programming various functions, features, and modes of the corresponding MRAM chip 332. The mode register 336 may control a burst length, a read burst type, CL, a test mode, a DLL reset, write recovery and read command-to-precharge command features, and DLL use during precharge power down. The mode register 336 may store data for controlling DLL enable/disable, output drive strength, AL, write labeling enable/disable, TDQS enable/disable, and output buffer enable/disable.

The mode register 336 may store data for controlling CWL, dynamic termination, and write CRC. The mode register 336 may store data for controlling an MPRL function, an MPR operation function, a gear down mode, a per MRAM addressing mode, and an MPR read format. The mode register 336 may store data for controlling a power down mode, Vref monitoring, a CS-to-command/address latency mode, an RPT mode, a RP function, and a WP function.

The mode register 336 may store data for controlling a CA parity function, a CRC error state, a CA parity error state, an ODT input buffer power down function, a data mask function, a write DBI function, and a read DBI function. The mode register 336 may store data for controlling a VrefDQ training value, a VrefDQ training range, VrefDQ training enable, and a tCCD timing. The mode register 336 may store data for controlling an EDC hold pattern and CRCWL, CRCRL, RD CRC, WR CRC, and EDC13Inv functions.

Therefore, the mode register may be used to control the MRAM according to a plurality of MRAM-specific modes. In one embodiment, as described above, the mode register is integrated in an MRAM package that has pins compatible with an SDRAM or SRAM. As such, the MRAM can be used by existing SDRAM or SRAM systems without the need for a hardware redesign of those systems.

Figure 34:
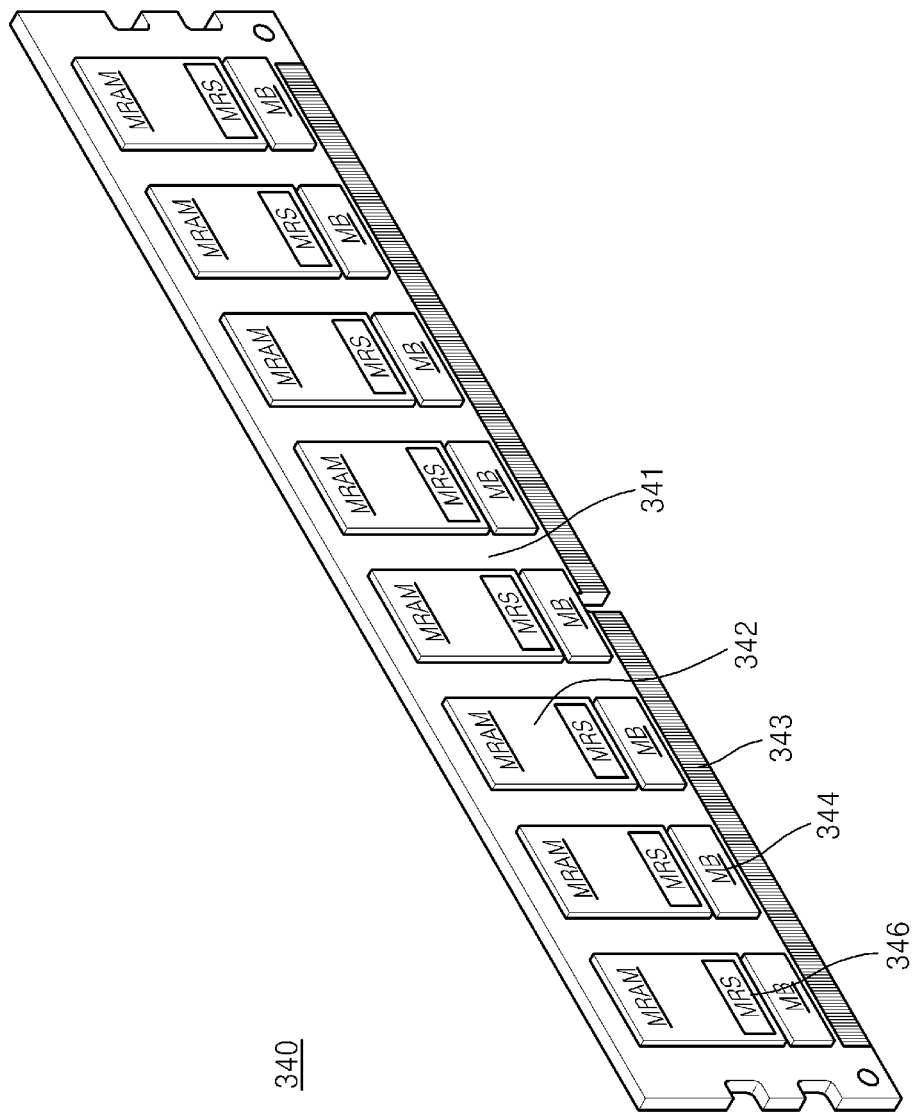

Referring to FIG. 34, an MRAM module 340 includes a PCB 341, a plurality of MRAM chips 342, a connector 343, and a plurality of buffer chips 344. Each buffer chip 344 may be disposed between an MRAM chip 342 and the connector 343. The MRAM chip 342 and the buffer chip 344 may be provided on top and bottom surfaces of the PCB 341. The MRAM chips 342 and buffer chips 344 disposed on the top and bottom surfaces of the PCB 341 may be connected to each other through a plurality of via holes.

Each MRAM chip 342 includes a mode register 346 capable of programming various functions, features, and modes of the corresponding MRAM chip 342. The mode register 346 may have the same functions the mode register 330 described above with reference to FIG. 33.

The buffer chip 344 may store results of resting features of the MRAM chip 342 connected to the buffer chip 344. The buffer chip 344 manages an operation of the corresponding MRAM chip 342 by using stored feature information, thereby reducing an effect of a weak cell or a weak page on the operation of the MRAM chip 342. For example, the buffer chip 344 may aid a weak cell or weak page of the MRAM chip 342 by including a storage unit therein.

Figure 35:
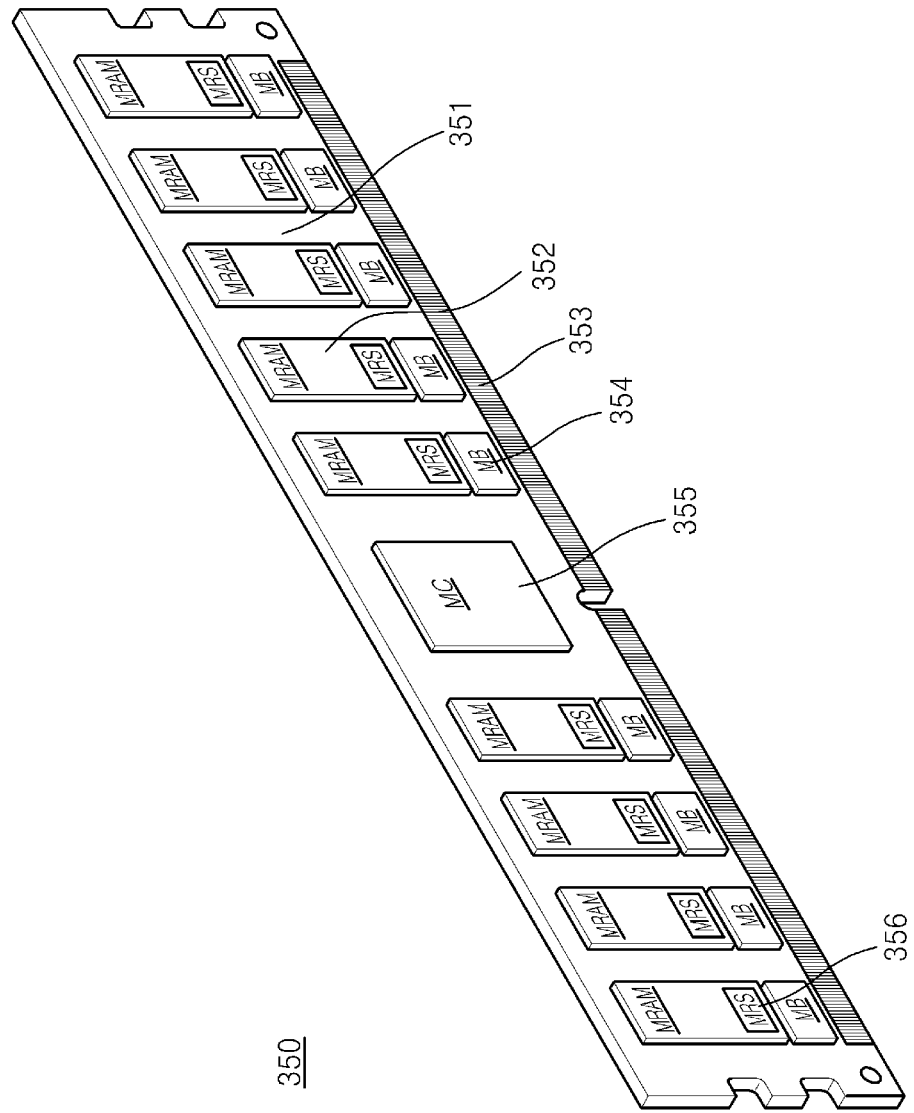

Referring to FIG. 35, an MRAM module 350 includes a PCB 351, a plurality of MRAM chips 352, a connector 353, a plurality of buffer chips 354, and a controller 355. The controller 355 communicates with the MRAM chips 352 and the buffer chips 354, and controls an operation mode of the MRAM chips 352. The controller 355 may control various functions, features, and modes by using a mode register 356 of the MRAM chip 352.

In one embodiment, the controller 355 controls read leveling, write leveling, and RPT such that, for example, a skew of the MRAM chips 352 is compensated for, and controls a write recovery (WR) time and a read-to-precharge (RTP) time such that a precharge operation is automatically started immediately after one operation is completed. Also, the controller 355 controls Vref monitoring and data masking operations of the MRAM chips 352.

Each MRAM chip 352 includes the mode register 356 capable of programming various functions, features, and modes of the MRAM chip 352. The mode register 356 may have the same functions as the mode register 330 of FIG. 33 described above with reference to FIG. 33.

The MRAM modules 330, 340, and 350 may be applied to a memory module, such as a single in-line memory module (SIMM), a dual in-line memory module (DIMM), a small-outline DIMM (SO-IDMM), an unbuffered DIMM (UDIMM), a fully-buffered DIMM (FEDIMM), a rank-buffered DIMM (RBDIMM), a load-reduced DIMM (LRDIMM), a mini-DIMM, or a micro-DIMM.

Figure 36:
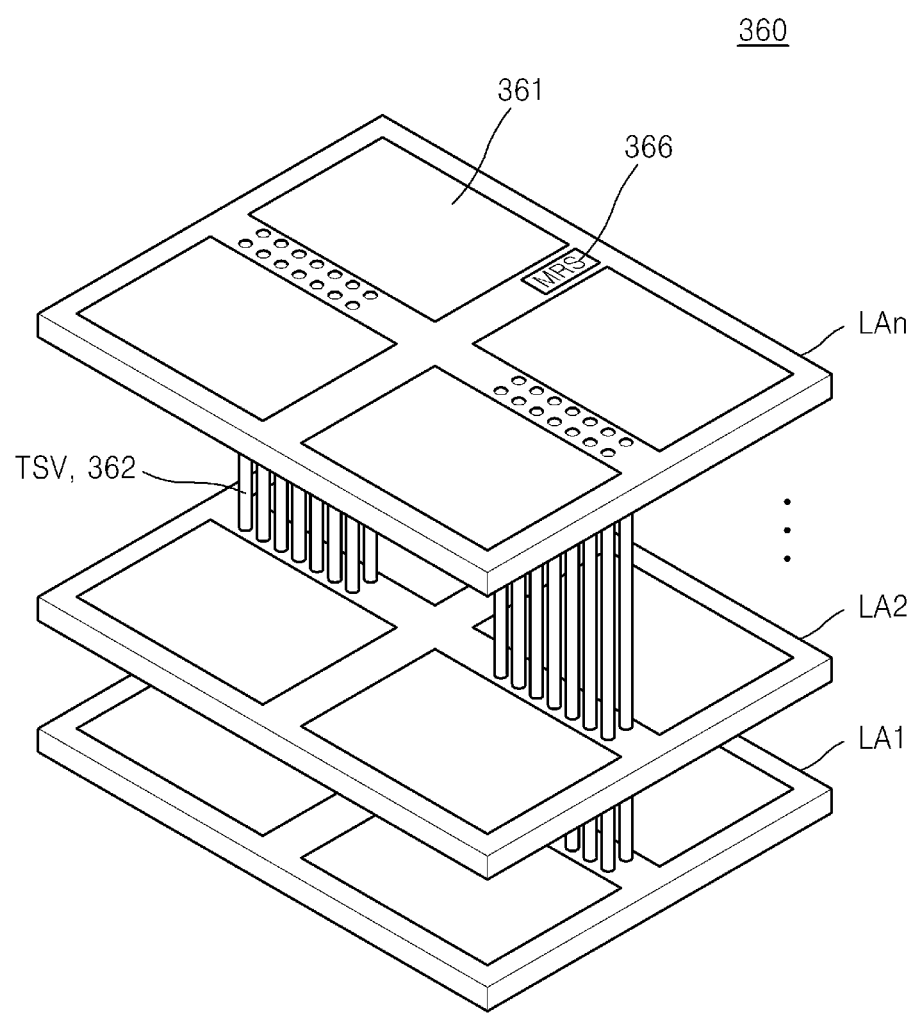
FIG. 36 is a diagram of a semiconductor device having a stacked structure including MRAM semiconductor layers, according to an exemplary embodiment.

FIG. 36 is a diagram of a semiconductor device 360 having a stacked structure including MRAM semiconductor layers LA1 through LAn, according to one exemplary embodiment.

Referring to FIG. 36, the semiconductor device 360 may include the MRAM semiconductor layers LA1 through LAn. Each of the MRAM semiconductor layers LA1 through LAn may be a memory chip including memory cell arrays 361 formed of MRAM cells, wherein some of the semiconductor layers LA1 through LAn are master chips performing an interface with an external controller, and remaining of the semiconductor layers LA1 through LAn are slave chips storing data. In FIG. 36, the MRAM semiconductor layer LA1 disposed at the bottom may be a master chip and remaining MRAM semiconductor layers LA2 through LAn may be slave chips.

The MRAM semiconductor layers LA1 through LAn transmit and receive a signal through a through substrate via, such as through silicon via (TSV) 362, and the MRAM semiconductor layer LA1 operating as the master chip may communicate with an external memory controller through a conductive connector (not shown) formed on an outer surface of the MRAM semiconductor layer LA1.

Also, a signal may be transferred between the MRAM semiconductor layers LA1 through LAn according to an optical IO connection. For example, the MRAM semiconductor layers LA1 through LAn may be connected to each other via a radiative method using radio frequency (RF) waves or ultrasonic waves, an inductive coupling method using magnetic induction, or a non-radiative method using magnetic field resonance.

The radiative method is a method wirelessly transmitting a signal by using an antenna, such as a monopole or planar inverted-F antenna (PIFA). Radiation is generated as electric fields or magnetic fields changing according to time affect each other, and a signal may be received according to polarization features of incident waves when there is an antenna in the same frequency.

The inductive coupling method is a method of generating a strong magnetic field in one direction by winding a coil a plurality of times, and generating coupling by approaching a coil resonating at a similar frequency.

The non-radiative method is a method of using evanescent wave coupling that moves electric waves between two media resonating at the same frequency through a short distance electromagnetic field.

In one embodiment, each of the MRAM semiconductor layers LA1 through LAn includes a mode register 366 capable of programming various functions, features, and modes of the corresponding MRAM semiconductor layers LA1 through LAn. The mode register 366 may have the same function as the mode register 330 of FIG. 33.

Each MRAM chip in the module structures of FIGS. 33 through 35 described above may include the plurality of MRAM semiconductor layers LA1 through LAn, such as described in FIG. 36.

Figure 37:
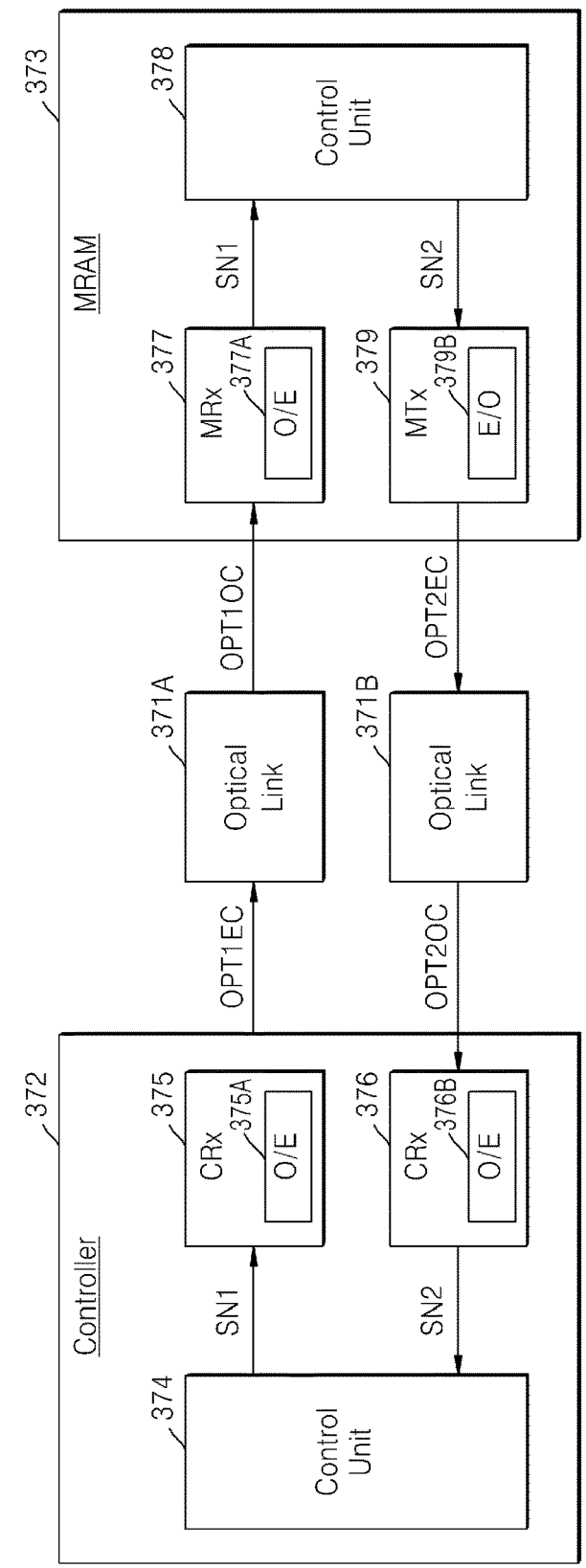
FIG. 37 is a diagram of an exemplary memory system including an MRAM, according to one embodiment.

FIG. 37 is a diagram of a memory system 370 including an MRAM 373, according to one exemplary embodiment.

Referring to FIG. 37, the memory system 370 includes optical links 371A and 371B, a controller 372, and the MRAM 373. The optical links 371A and 371B interconnect the controller 372 and the MRAM 373. The controller 372 includes a control unit 374, a first transmitter 375, and a first receiver 376. The control unit 374 transmits a first electric signal SN1 to the first transmitter 375. The first electric signal SN1 may include, for example, command signals, clock signals, address signals, or write data transmitted to the MRAM 373.

The first transmitter 375 includes a first optical modulator 375A that converts the first electric signal SN1 to a first optical transmission signal OPT1EC and transmits the first optical transmission signal OPT1EC to the optical link 371A. The first optical transmission signal OPT1EC may be transmitted, for example, in a serial communication through the optical link 371A. The first receiver 376 includes a first optical modulator 376B that converts a second optical reception signal OPT2OC received from the optical link 371B to a second electric signal SN2, and transmits the second electric signal SN2 to the control unit 374.

The MRAM 373 includes a second receiver 377, a memory region 378 including an STT_MRAM cell, and a second transmitter 379. Also, the MRAM 373 may include a mode register capable of programming various functions, features, and modes of the MRAM 373. The second receiver 377 includes a second optical modulator 377A that converts a first optical reception signal OPT1OC received from the optical link 371A to the first electric signal SN1, and transmits the first electric signal SN1 to the memory region 378.

In the memory region 378, write data is written in the STT-MRAM cell in response to the first electric signal SN1, or data read from the memory region 378 is transmitted to the second transmitter 379 as the second electric signal SN2. The second electric signal SN2 may include clock signals and read data transmitted to the controller 372. The second transmitter 379 includes a second optical modulator 379B that converts the second electric signal SN2 to a second optical data signal OPT2EC, and transmits the second optical data signal OPT2EC to the optical link 371B. The second optical data signal OPT2EC may be transmitted, for example, in a serial communication through the optical link 371B.

Figure 38:
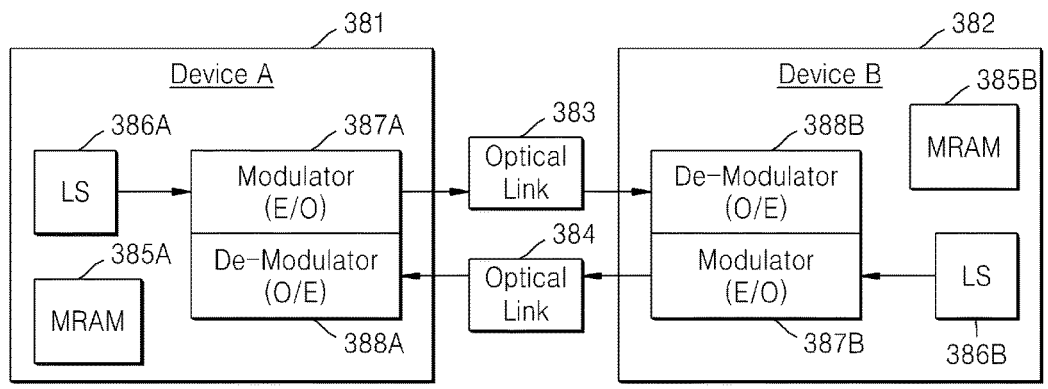
FIG. 38 is a diagram of an exemplary data processing system including an MRAM, according to one embodiment.

FIG. 38 is a diagram of a data processing system 380 including an MRAM, according to another exemplary embodiment.

Referring to FIG. 38, the data processing system 380 includes a first device 381, a second device 382, and a plurality of optical links 383 and 384. The first and second devices 381 and 382 may communicate an optical signal, for example, via a serial communication.

The first device 381 may include an MRAM 385A, a first light source 386A, a first optical modulator 387A capable of performing an electric to optical conversion operation, and a first optical de-modulator 388A capable of performing an optical to electric conversion operation. The second device 382 may include an MRAM 385B, a second light source 386B, a second modulator 387B, and a second optical de-modulator 388B. The MRAMs 385A and 385B may each include a mode register capable of programming various functions, features, and modes of the corresponding MRAMs 385A and 385B.

The first and second light sources 386A and 386B output an optical signal having continuous waves. The first and second light sources 386A and 386B may use, for example, a distributed feed-back laser diode (DFB-LD) or a Fabry Perot laser diode (FP-LD) as a light source.

The first optical modulator 387A converts transmission data to an optical transmission signal, and transmits the optical transmission signal to the optical link 383. The first optical modulator 387A may modulate a wavelength of the optical signal received from the first light source 386A according to transmission data. The first optical de-modulator 388A receives and modulates an optical signal output from the second optical modulator 387B of the second device 382 through the optical link 384, and outputs a modulated electric signal.

The second optical modulator 387B converts transmission data of the second device 382 to an optical transmission signal, and transmits the optical transmission signal to the optical link 384. The second optical modulator 387B may modulate a wavelength of an optical signal received from the second light source 386B according to the transmission data. The second optical de-modulator 388B may receive and modulate an optical signal output from the first optical modulator 387A of the first device 381 through the optical link 383, and output a modulated electric signal.

Figure 39:
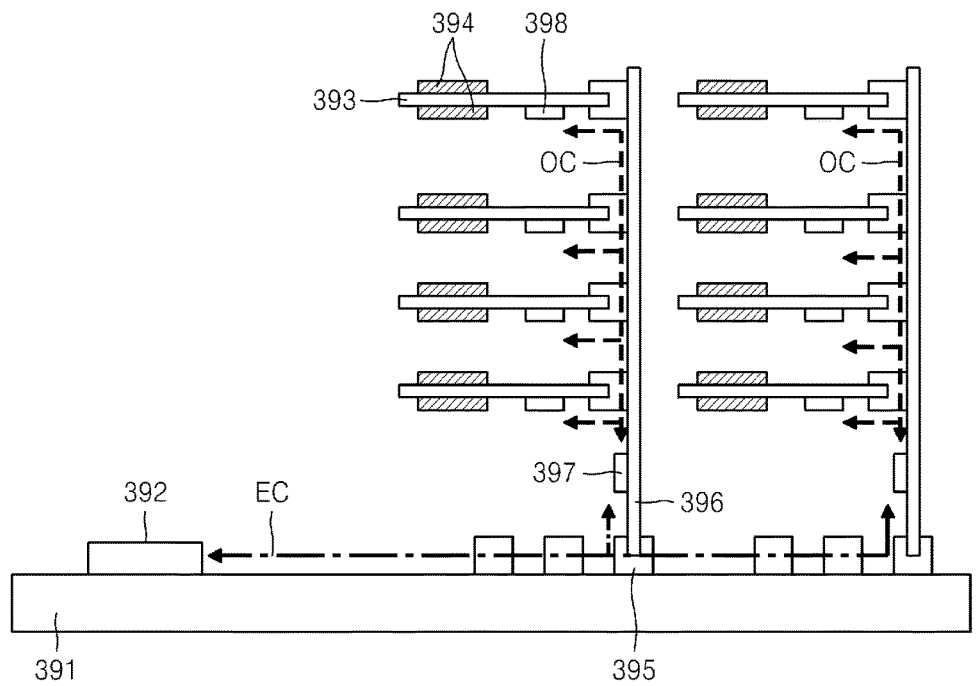
FIG. 39 is a diagram of an exemplary server system including an MRAM, according to one embodiment.

FIG. 39 is a diagram of an exemplary server system 390 including an MRAM, according to one embodiment.

Referring to FIG. 39, the server system 390 includes a memory controller 392 and a plurality of memory modules 393. Each of the memory modules 393 may include a plurality of MRAM chips 394. The MRAM chip 394 may include a memory region including an STT_MRAM cell, and a mode register capable of programming various functions, features, and modes of an MRAM.

The server system 390 may have a structure wherein a second circuit board 396 is connected to sockets 395 of a first circuit board 391. The server system 390 may be designed to have a channel structure wherein one second circuit board 396 is connected to the first circuit board 391 according to signal channels, but alternatively, the server system 390 may have any one of various structures.

In one embodiment, a signal of the memory module 393 may be transferred via an optical IO connection. For the optical IO connection, the server system 390 may further include an electric to optical conversion unit 397, and each of the memory modules 393 may further include an optical to electric conversion unit 398.

In one embodiment, the memory controller 392 is connected to the electric to optical conversion unit 397 through an electric channel EC. The electric to optical conversion unit 397 converts an electric signal received from the memory controller 392 through the electric channel EC to an optical signal, and transmits the optical signal to an optical channel OC. Also, the electric to optical conversion unit 397 performs a signal process that converts an optical signal received through the optical channel OC to an electric signal, and transmits the electric signal to the electric channel EC.

The memory module 393 is connected to the electric to optical conversion unit 397 through the optical channel OC. An optical signal applied to the memory module 393 may be transmitted to the MRAM chips 394 after being converted into an electric signal through the optical to electric conversion unit 398. The server system 390 including such memory modules may support a high storage capacity and a quick processing speed.

Figure 40:
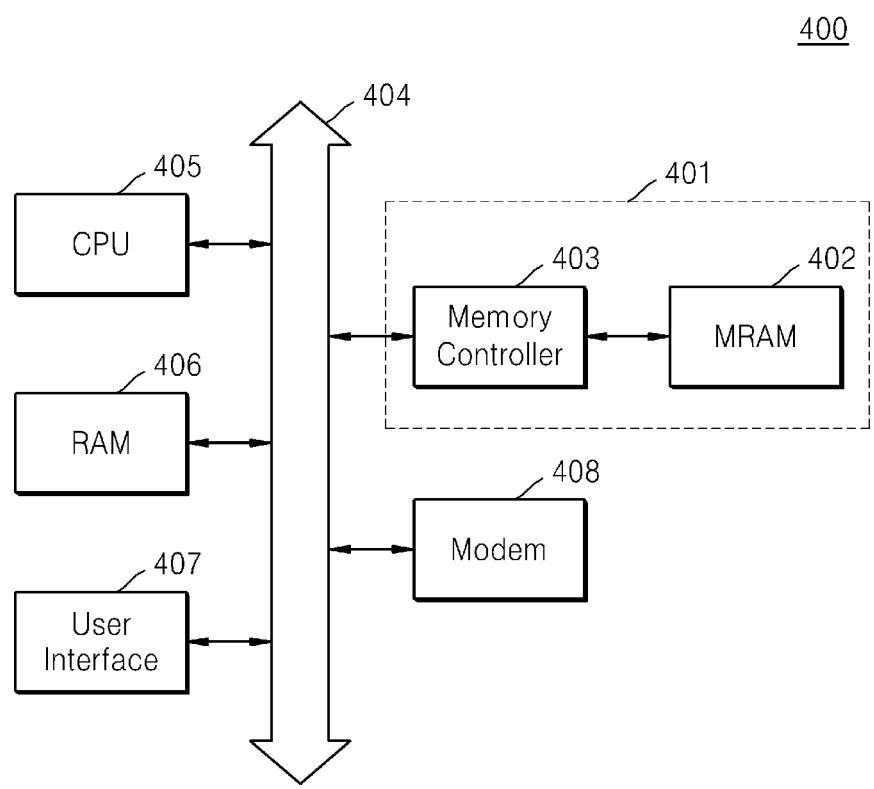
FIG. 40 is a diagram of an exemplary computer system including an MRAM, according to one embodiment.

FIG. 40 is a diagram of a computer system 400 including an MRAM, according to one exemplary embodiment.

Referring to FIG. 40, the computer system 400 may be included, for example, in a mobile device or a desktop computer. The computer system 400 may include an MRAM memory system 401, a central processing unit (CPU) 405, a RAM 406, and a user interface 407, and may also include a modem 408 or other communication interface, such as a baseband chipset, all of which may be electrically connected to a system bus 404. The computer system 400 may further include, for example, an application chipset, a camera image processor (CIS), and an input/output device.

The user interface 407 may be an interface for transmitting data to a communication network or receiving data from the communication network. The user interface 407 may have a wired or wireless form, and may include an antenna or wired/wireless transceiver. Data provided through the user interface 407 or the modem 408, or processed by the CPU 405 may be stored in the MRAM memory system 401.

The MRAM memory system 401 may include an MRAM 402 and a memory controller 403. The MRAM 402 stores data processed by the CPU 405 or data externally input. The MRAM 402 may include a memory region including an STT_MRAM cell, and a mode register capable of programming various functions, features, and modes of the MRAM 402.

When the computer system 400 is an apparatus performing wireless communication, the computer system 400 may be used in a communication system, such as a code division multiple access (CDMA), a global system for mobile communication (GSM), a North American multiple access (NADC), or CDMA 2000. The computer system 400 may also be included in an information processing apparatus, such as a personal digital assistant (PDA), a portable computer, a web tablet, a digital camera, a portable media player (PMP), a mobile phone, a wireless phone, or a laptop.

Typical systems separately include a cache memory having a quick processing speed, a RAM, and a storage unit for storing high capacity data. However, these memories can be replaced by one MRAM system according to one or more embodiments described herein. As such, by using a mode register in an MRAM, a structure of a system may be simplified since a memory device including such an MRAM can quickly store high capacity data.

While the present disclosure has been particularly shown and described with reference to exemplary embodiments thereof, it will be understood that various changes in form and details may be made therein without departing from the spirit and scope of the following claims.

What is claimed is:

1. A memory system comprising:
  a memory controller; and
  a magnetic random access memory (MRAM) communicatively coupled to the memory controller, the MRAM including a mode register and magnetic memory cells, the mode register configured to support a plurality of operational modes of the MRAM, each of the magnetic memory cells including a magnetic tunnel junction (MTJ) including a free layer, a pinned layer, and a tunnel layer between the free layer and the pinned layer, each of the magnetic memory cells configured to change between at least two states according to a magnetization direction of the MTJ, and a magnetization direction of the free layer being either parallel or antiparallel to a magnetization direction of the pinned layer,
  wherein the memory controller is configured to select a mode register set code and to output a plurality of command signals, a clock signal, a data strobe (DQS) signal and data input/output (DQ data) to the MRAM, a part of the plurality of command signals including the mode register set code,
  wherein the MRAM is configured to set the mode register according to the mode register set code, and
  wherein the mode register is configured to be used for one or more of the following:
    to provide a write leveling function to compensate for a skew between the clock signal and the DQS signal received from the memory controller; and
    to provide a write Cyclic Redundancy Check (CRC) function to enable CRC calculation of data transmitted between the MRAM and the memory controller.

2. The memory system of claim 1, wherein the memory controller is an external device of the MRAM.

3. The memory system of claim 1, wherein the mode register is configured to be used to provide a termination data strobe function such that a termination resistance is applied to the DQS signal.

4. The memory system of claim 1, wherein the mode register is configured to be used to provide a write preamble function such that the DQS signal of the MRAM has a predetermined preamble time before input of the DQ data of the memory controller.

5. The memory system of claim 1, wherein the mode register is configured to be used to provide a read preamble function such that the DQS signal of the MRAM has a predetermined preamble time before output of the DQ data of the MRAM.

6. The memory system of claim 1, wherein the mode register is configured to be used to provide a read preamble training function of the DQS signal for read leveling such that the memory controller compensates for a skew.

7. The memory system of claim 1, wherein the mode register is configured to be used to notify a write CRC error state of the MRAM to determine whether an error generated by the MRAM is a CRC error or not.

8. The memory system of claim 1, wherein the mode register is configured to be used to provide a data mask (DM) function of the DQ data of the MRAM.

9. The memory system of claim 1, wherein the mode register is configured to be used to provide a write data bus inversion (DBI) function for inverting write data of the MRAM.

10. The memory system of claim 1, wherein the mode register is configured to be used to provide a read data bus inversion (DBI) function for inverting read data of the MRAM.

11. The memory system of claim 1, further comprising an optical link connected between the MRAM and the memory controller,
wherein an electrical-to-optical conversion signal or an optical-to-electrical conversion signal is communicated through the optical link.

12. A method of operating a magnetic random access memory (MRAM) that includes magnetic memory cells configured to change between at least two states according to a magnetization direction, the method comprising:
receiving a plurality of command signals, a clock signal, a data strobe (DQS) signal and data input/output (DQ data) from an outside of the MRAM, a part of the plurality of command signals including a mode register set code;
setting a mode register according to the mode register set code;
providing a write leveling function, using the mode register, to compensate for a skew between the clock signal and the DQS signal received from the outside of the MRAM; and
providing a write Cyclic Redundancy Check (CRC) function, using the mode register, to enable CRC calculation of data received to the MRAM,
wherein each of the magnetic memory cells including a magnetic tunnel junction (MTJ) including a free layer, a pinned layer, and a tunnel layer between the free layer and the pinned layer, each of the magnetic memory cells configured to change between at least two states according to a magnetization direction of the MTJ, and a magnetization direction of the free layer being either parallel or antiparallel to a magnetization direction of the pinned layer.

13. The method of claim 12, further comprising:
providing a termination data strobe function, using the mode register, to apply a termination resistance to the DQS signal.

14. The method of claim 12, further comprising:
providing a write preamble function, using the mode register, to allow the DQS signal to have a predetermined preamble time before input of the DQ data.

15. The method of claim 12, further comprising:
providing a read preamble function, using the mode register, to allow the DQS signal to have a predetermined preamble time before output of the DQ data.

16. The method of claim 12, further comprising:
notifying a write CRC error state of the MRAM, using the mode register, to determine whether an error generated by the MRAM is a CRC error or not.

17. The method of claim 12, further comprising:
providing a data mask (DM) function of the DQ data using the mode register.

18. The method of claim 12, further comprising:
providing a write data bus inversion (DBI) function, using the mode register, to invert write data of the MRAM.

19. The method of claim 12, further comprising:
providing a read data bus inversion (DBI) function, using the mode register, to invert read data of the MRAM.

* * * * *